(12) United States Patent
Teng et al.

(10) Patent No.: US 12,230,532 B2
(45) Date of Patent: Feb. 18, 2025

(54) SEMICONDUCTOR DEVICE, METHOD OF MANUFACTURE BY MONITORING RELATIVE HUMIDITY, AND SYSTEM OF MANUFACTURE THEREOF

(71) Applicant: Taiwan Semiconductor Manufacturing Co., Ltd., Hsinchu (TW)

(72) Inventors: Yun Chen Teng, New Taipei (TW); Chen-Fong Tsai, Hsinchu (TW); Han-De Chen, Hsinchu (TW); Jyh-Cherng Sheu, Hsinchu (TW); Huicheng Chang, Tainan (TW); Yee-Chia Yeo, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 792 days.

(21) Appl. No.: 17/459,509

(22) Filed: Aug. 27, 2021

(65) Prior Publication Data

US 2023/0063975 A1 Mar. 2, 2023

(51) Int. Cl.
| | |
|---|---|
| *H01L 21/762* | (2006.01) |
| *H01L 21/67* | (2006.01) |
| *H01L 27/12* | (2006.01) |
| *H01L 29/06* | (2006.01) |
| *H01L 29/40* | (2006.01) |
| *H01L 29/417* | (2006.01) |

(Continued)

(52) U.S. Cl.
CPC .. *H01L 21/76251* (2013.01); *H01L 21/67253* (2013.01); *H01L 29/0665* (2013.01); *H01L 29/401* (2013.01); *H01L 29/41733* (2013.01); *H01L 29/42392* (2013.01); *H01L 29/66742* (2013.01); *H01L 29/78645* (2013.01); *H01L 27/1203* (2013.01)

(58) Field of Classification Search
CPC ........ H01L 21/67253; H01L 21/76251; H01L 29/0665; H01L 29/401; H01L 29/41733; H01L 29/42392; H01L 29/66742; H01L 29/78645; H01L 27/1203; H01L 29/78696; H01L 21/823475; H01L 29/1079; H01L 29/165; H01L 29/41725; H01L 29/7848; H01L 29/0847; H01L 29/66439; H01L 21/67092; H01L 29/0673; H01L 29/66545; H01L 29/775; H01L 21/67173; H01L 21/67121; H01L 21/67706; B82Y 10/00
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |

(Continued)

FOREIGN PATENT DOCUMENTS

CN 105632902 A * 6/2016

*Primary Examiner* — John P. Dulka
(74) *Attorney, Agent, or Firm* — Slater Matsil, LLP

(57) ABSTRACT

A method of forming a semiconductor device includes loading a first wafer and a second wafer into a wafer bonding system. A relative humidity within the wafer bonding system is measured a first time. After measuring the relative humidity, the relative humidity within the wafer bonding system may be adjusted to be within a desired range. When the relative humidity is within the desired range, the first wafer is bonded to the second wafer.

20 Claims, 68 Drawing Sheets

(51) Int. Cl.
   *H01L 29/423*   (2006.01)
   *H01L 29/66*    (2006.01)
   *H01L 29/786*   (2006.01)

(56) References Cited

U.S. PATENT DOCUMENTS

| | | |
|---|---|---|
| 9,412,817 B2 | 8/2016 | Yang et al. |
| 9,412,828 B2 | 8/2016 | Ching et al. |
| 9,472,618 B2 | 10/2016 | Oxland |
| 9,502,265 B1 | 11/2016 | Jiang et al. |
| 9,520,482 B1 | 12/2016 | Chang et al. |
| 9,536,738 B2 | 1/2017 | Huang et al. |
| 9,576,814 B2 | 2/2017 | Wu et al. |
| 9,608,116 B2 | 3/2017 | Ching et al. |
| 2019/0214258 A1* | 7/2019 | Fournel ................. H01L 21/187 |
| 2023/0052396 A1* | 2/2023 | Maeda ............... H01L 21/67092 |
| 2023/0288916 A1* | 9/2023 | Wang ................ H01L 21/68771 |

* cited by examiner

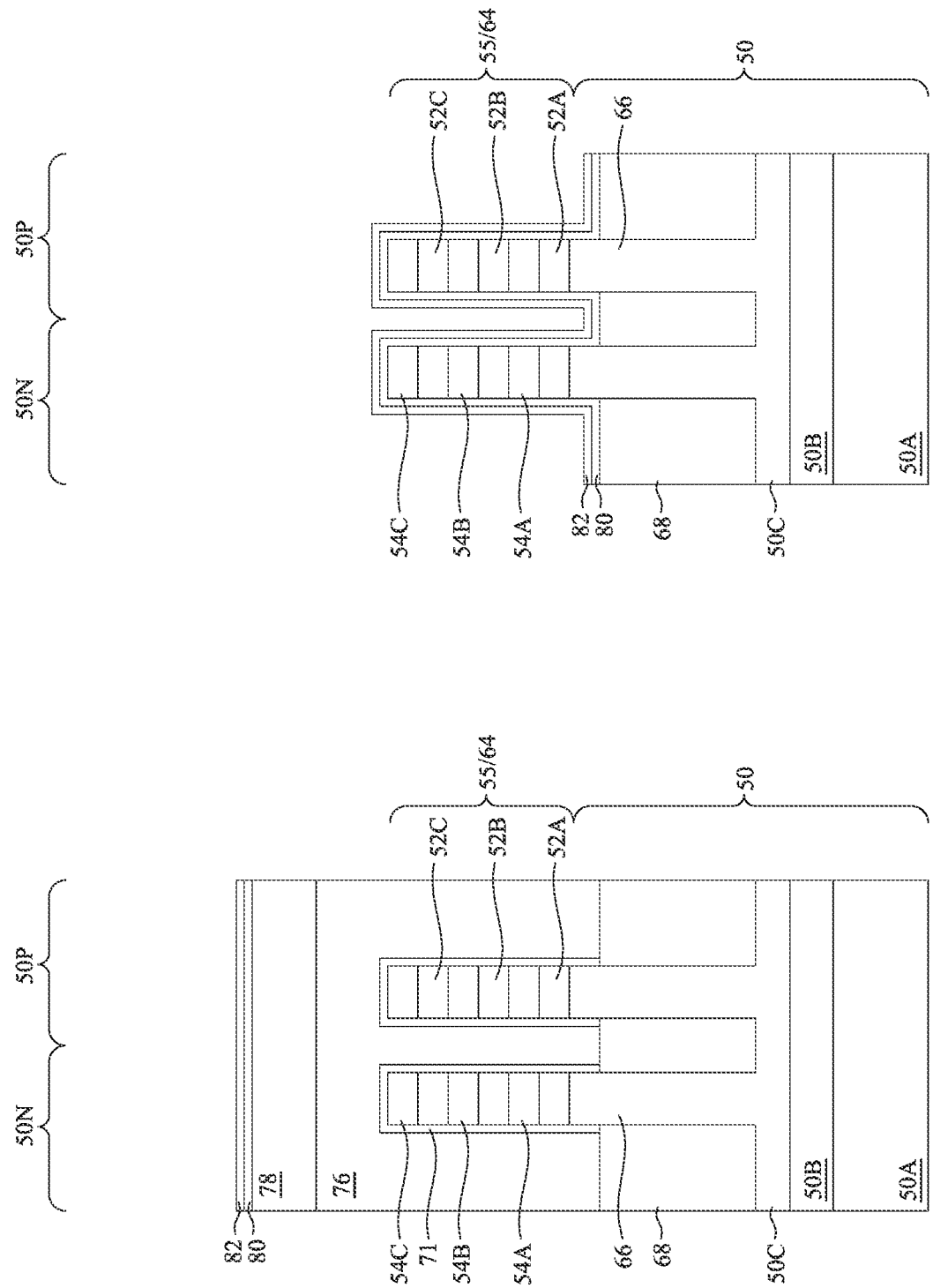

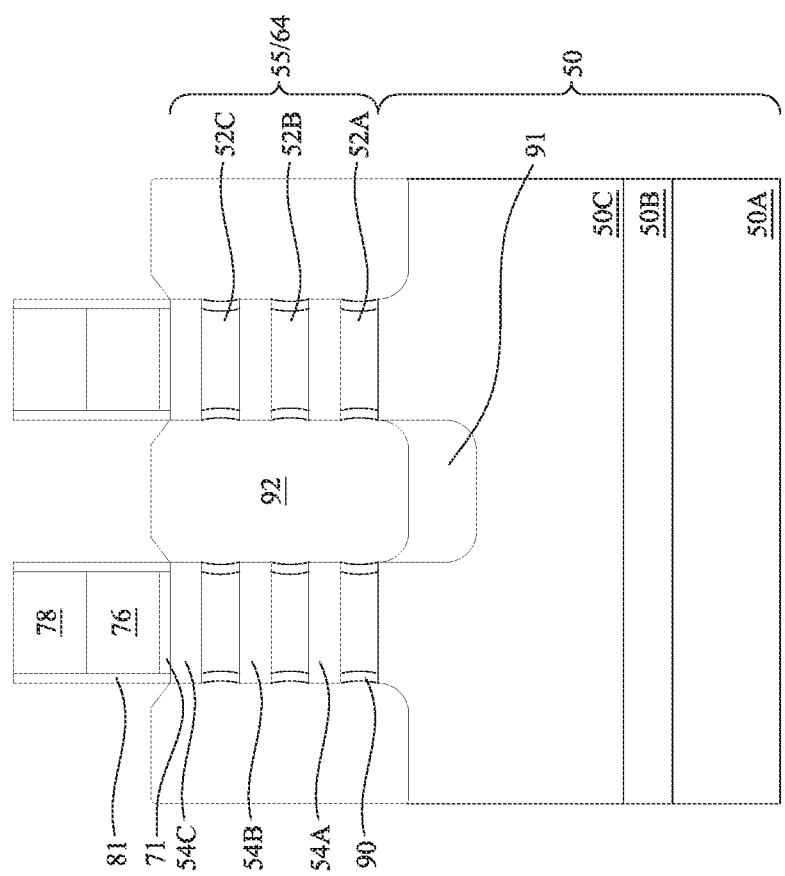

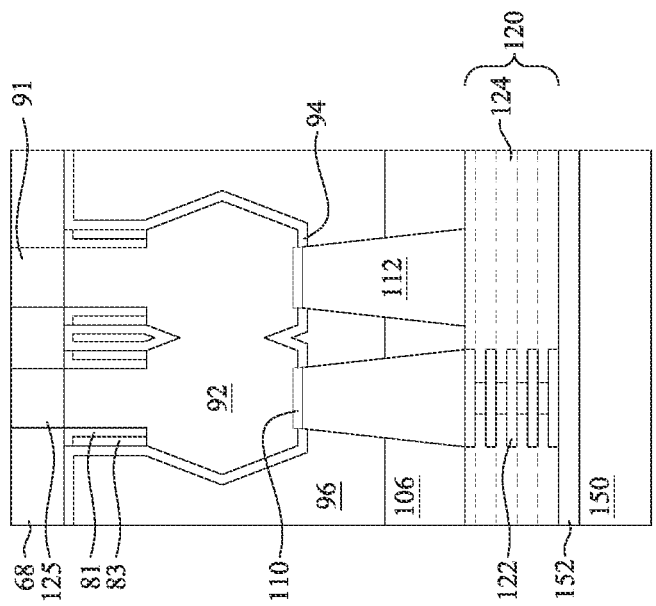
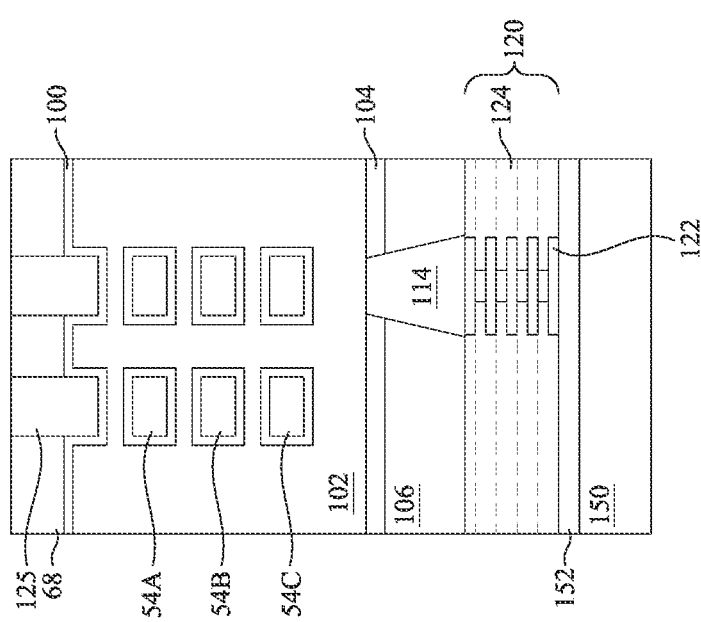
Fig. 33A
Fig. 33B

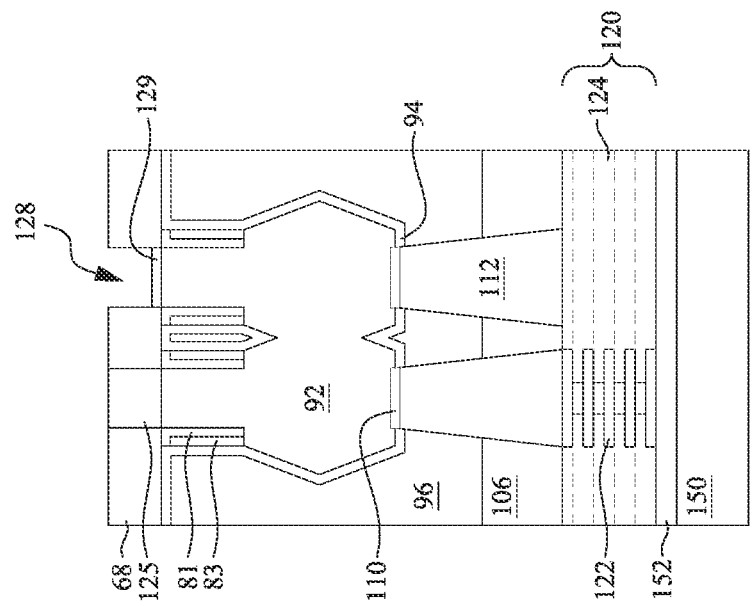
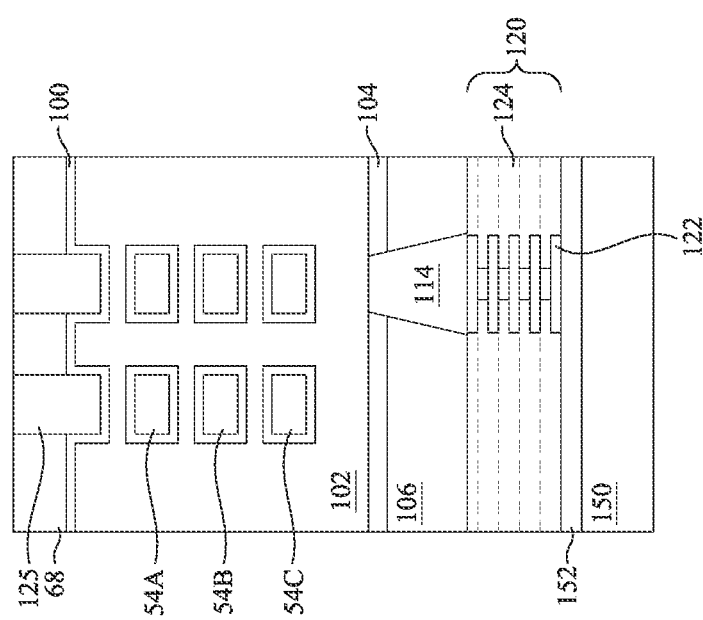
Fig. 34B
Fig. 34A

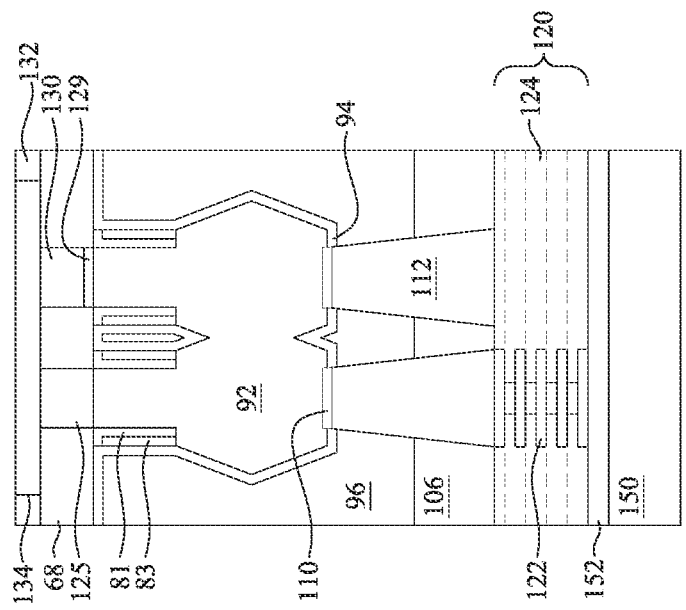
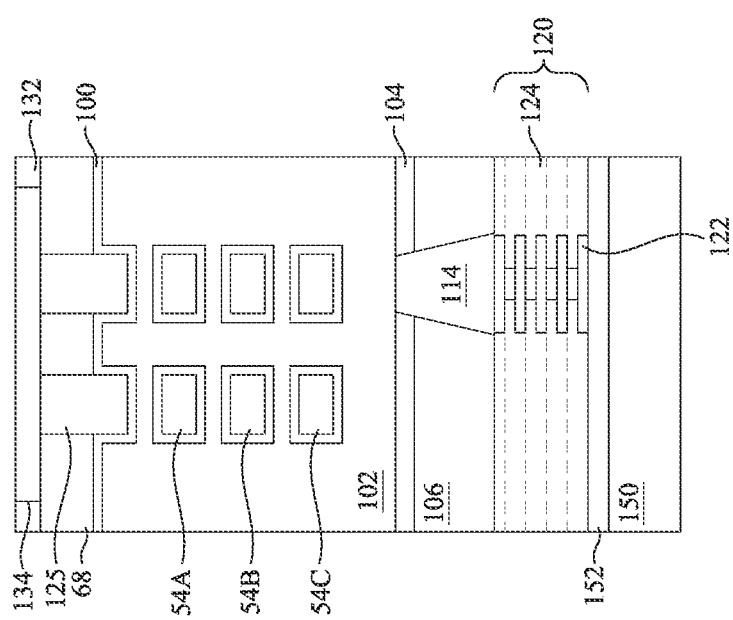

SEMICONDUCTOR DEVICE, METHOD OF MANUFACTURE BY MONITORING RELATIVE HUMIDITY, AND SYSTEM OF MANUFACTURE THEREOF

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 11, 12, 13, 14, 15A, 15B, 15C, 16A, 16B, 16C, 17A, 17B, 17C, 18A, 18B, 18C, 18D, 18E, 19A, 19B, 19C, 20A, 20B, 20C, 20D, 21A, 21B, 21C, 21D, 21E, 21F, 21G, 22A, 22B, 22C, 23A, 23B, 23C, 24A, 24B, 24C, 25A, 25B, 25C, 26A, 26B, 26C, 27A, 27B, 27C, 28A, 28B, 28C, 29A, 29B, 29C, 30A, 30B, 30C, 31A, 31B, 31C, 31D, 31E, 32A, 32B, 32C, 33A, 33B, 33C, 34A, 34B, 34C, 35A, 35B, 35C, 36A, 36B, 36C, 37A, 37B, 37C, 38A, 38B, 38C, and 39 are cross-sectional views of intermediate stages in the manufacturing of nano-FETs, in accordance with some embodiments.

DETAILED DESCRIPTION

Figure 1:
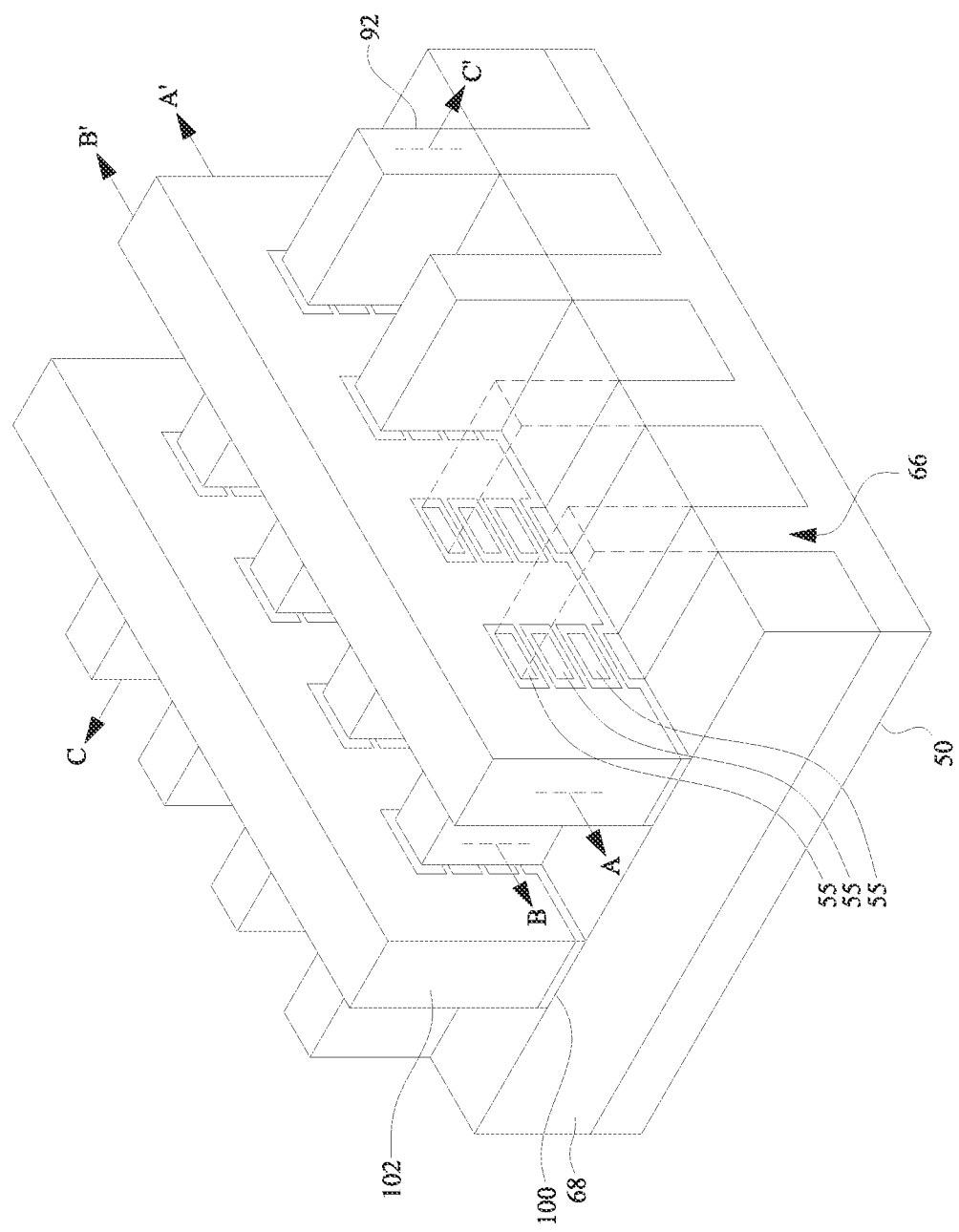
FIG. 1 illustrates an example of a nanostructure field-effect transistor (nano-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A wafer bonding system is provided in accordance with various exemplary embodiments. The wafer bonding system may allow for the bonding of a first semiconductor wafer to a second semiconductor wafer in a bonding environment that has a controlled humidity to form a semiconductor substrate. The semiconductor substrate may be used to form semiconductor devices such as e.g. nano-FETs.

FIG. 1 illustrates an example of nano-FETs (e.g., nanowire FETs, nanosheet FETs, or the like) in a three-dimensional view, in accordance with some embodiments. The nano-FETs comprise nanostructures 55 (e.g., nanosheets, nanowire, or the like) over fins 66 on a substrate 50 (e.g., a semiconductor substrate), wherein the nanostructures 55 act as channel regions for the nano-FETs. The nanostructure 55 may include p-type nanostructures, n-type nanostructures, or a combination thereof. Shallow trench isolation (STI) regions 68 are disposed between adjacent fins 66, which may protrude above and from between neighboring STI regions 68. Although the STI regions 68 are described/illustrated as being separate from the substrate 50, as used herein, the term "substrate" may refer to the semiconductor substrate alone or a combination of the semiconductor substrate and the STI regions. Additionally, although bottom portions of the fins 66 are illustrated as being single, continuous materials with the substrate 50, the bottom portions of the fins 66 and/or the substrate 50 may comprise a single material or a plurality of materials. In this context, the fins 66 refer to the portion extending between the neighboring STI regions 68.

Additionally, some of the embodiments discussed herein are described in the context of a die including nano-FETs. However, various embodiments may be applied to dies including other types of transistors (e.g., fin field effect transistors (FinFETs), planar transistors, or the like) in lieu of or in combination with the nano-FETs.

Gate dielectric layers 100 are over top surfaces of the fins 66 and along top surfaces, sidewalls, and bottom surfaces of the nanostructures 55. Gate electrodes 102 are over the gate dielectric layers 100. Epitaxial source/drain regions 92 are disposed on the fins 66 on opposing sides of the gate dielectric layers 100 and the gate electrodes 102.

FIG. 1 further illustrates reference cross-sections that are used in later figures. Cross-section A-A' is along a longitudinal axis of a gate electrode 102 and in a direction, for example, perpendicular to the direction of current flow between the epitaxial source/drain regions 92 of a nano-FET. Cross-section B-B' is parallel to cross-section A-A' and extends through epitaxial source/drain regions 92 of multiple nano-FETs. Cross-section C-C' is perpendicular to cross-section A-A' and is parallel to a longitudinal axis of a fin 66 of the nano-FET and in a direction of, for example, a current flow between the epitaxial source/drain regions 92 of the nano-FET. Subsequent figures refer to these reference cross-sections for clarity.

Some embodiments discussed herein are discussed in the context of nano-FETs formed using a gate-last process. In other embodiments, a gate-first process may be used. Also, some embodiments contemplate aspects used in planar devices, such as planar FETs or in fin field-effect transistors (FinFETs).

Figure 2:
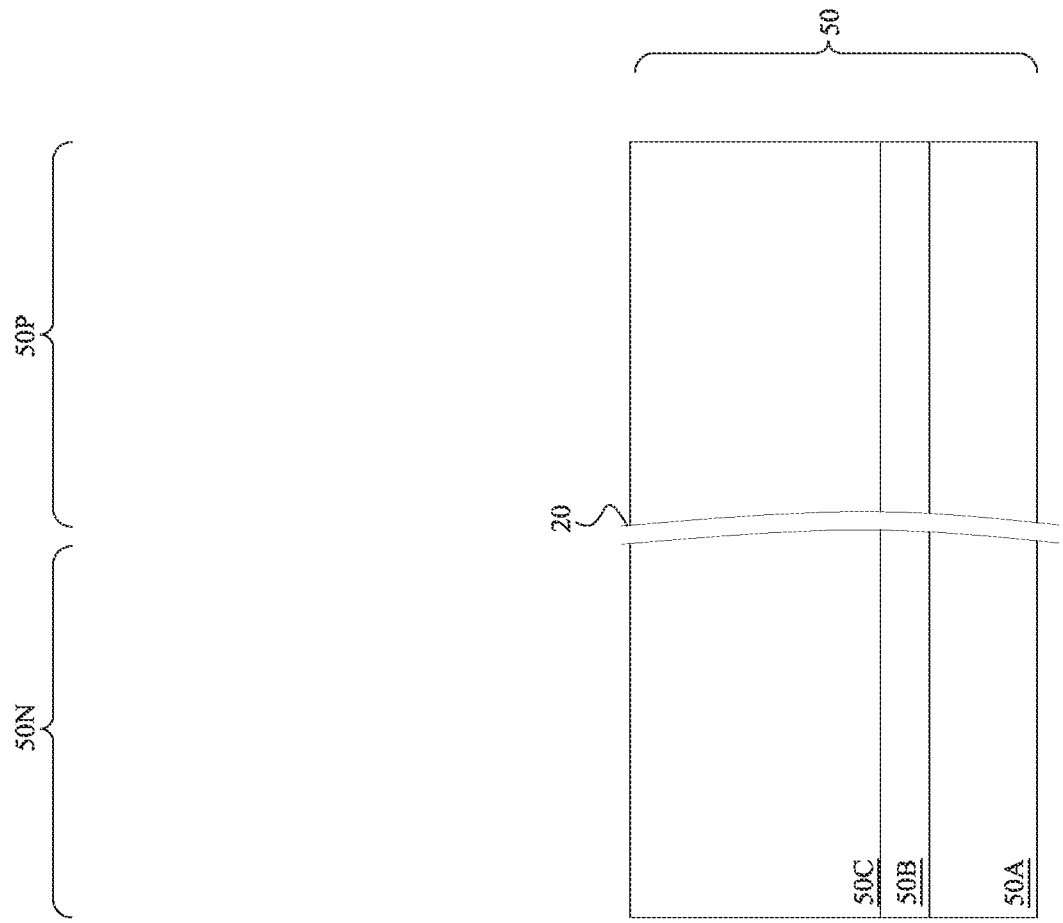
FIG. 2 illustrates a cross-sectional view of a semiconductor substrate, in accordance with some embodiments.

FIG. 2 illustrates the substrate 50 that may be used to manufacture the nano-FETs, wherein the substrate 50 is formed by the bonding of wafers 50A and 50C, such as by a wafer bonding process as illustrated below in FIGS. 3 through 10. The wafers 50A and 50C may be bonded by a film 50B. The substrate 50 formed by the bonding of the wafers 50A and 50C with the film 50B may be a semiconductor-on-insulator (SOI) substrate. In some embodiments, the wafers 50A and 50C may comprise silicon, silicon germanium, combinations of these, or the like, and outer surfaces of the wafers 50A and 50C to be bonded may have a Si—O—Si crystalline structure. Additionally, the film 50B is a silicon oxide film formed as a native oxide, a thermal oxide, or a high density plasma (HDP) oxide, depending on the bonding process utilized to bond the wafers 50A and 50C. However, any suitable materials and thicknesses may be utilized.

The substrate 50 has an n-type region 50N and a p-type region 50P. The n-type region 50N can be for forming n-type devices, such as NMOS transistors, e.g., n-type nano-FETs, and the p-type region 50P can be for forming p-type devices, such as PMOS transistors, e.g., p-type nano-FETs. The n-type region 50N may be physically separated from the p-type region 50P (as illustrated by divider 20), and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

Figure 3:
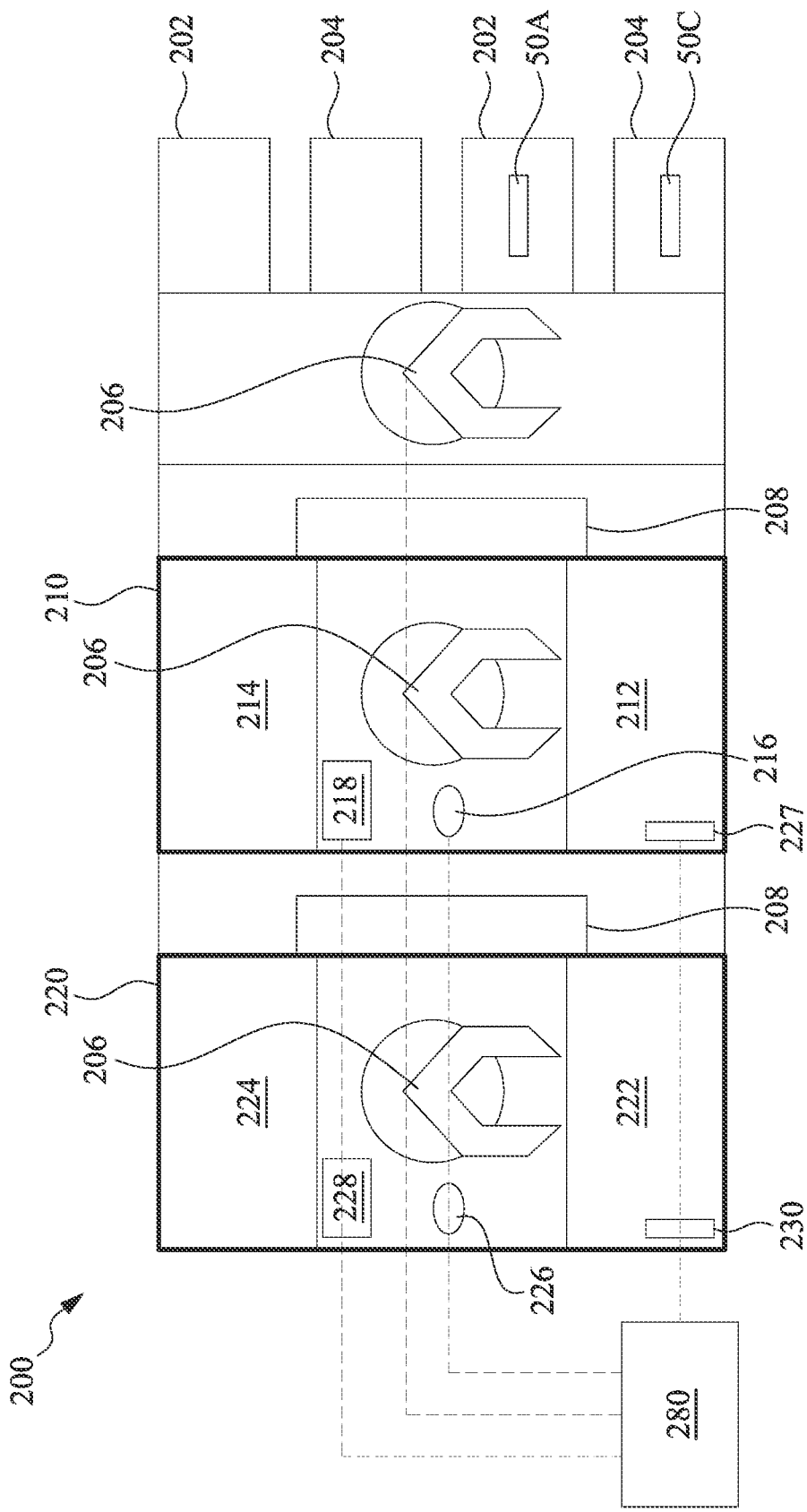
FIG. 3 illustrates a top-view of the bonding system in accordance with some embodiments.

FIG. 3 shows a top view of a wafer bonding system 200 that may be used to bond the wafers 50A and 50C and form the substrate 50 illustrated in FIG. 2. The process flow in accordance with the embodiments is briefly described below, and the details of the process flow and the wafer bonding system 200 are discussed, referencing FIGS. 3 through 10. In some embodiments, the wafer bonding system 200 can be used to bond the wafers 50A and 50C through semiconductor-on-insulator (SOI) bonding, fusion bonding (e.g., hydrophilic bonding or hydrophobic bonding), hybrid bonding, or the like. However, any suitable method of bonding may be utilized.

In an embodiment the wafer bonding system 200 comprises loading stations 202 and 204, transfer robots 206 to move wafers between areas of the wafer bonding system 200, a treatment area 210 containing a pre-alignment module 212 and a surface treatment station 214, and a bonding area 220 containing a cleaning station 222 and a bonding station 224. However, more or fewer stations may be utilized within the wafer bonding system 200.

Looking first at the treatment area 210, the treatment area 210 additionally comprises a first dehydrating apparatus 216, a first water source 218, and a first temperature and humidity sensor 227 in order to help monitor and control the temperature and humidity of the treatment area 210. Additionally, looking next at the bonding area 220, the bonding area 220 comprises a second dehydrating apparatus 226, a second water source 228, and a second temperature and humidity sensor 230.

Each of the first dehydrating apparatus 216, the first water source 218, the first temperature and humidity sensor 227, the second dehydrating apparatus 226, the second water source 228, and the second temperature and humidity sensor 230 are connected to a controller 280. In some embodiments, the controller 280 comprises a programmable computer. The controller 280 is illustrated as a single element for illustrative purposes. In some embodiments, the controller 280 comprises multiple elements. The controller 280 may also be connected to the transfer robots 206 and may be configured to move the wafers 50A and 50C through the bonding process.

To start the bonding process, the wafers that are to be bonded (for example, wafers 50A and 50C) are loaded into the wafer bonding system 200 through one or more of the loading stations 202 and 204. For example, in some embodiments loading stations 202 are front opening unified pods (FOUPs) used to load wafers 50A (e.g., bottom wafers) and loading stations 204 are FOUPs used to load wafers 50C (e.g., top wafers). However, any suitable methods and loading stations may be utilized.

A transfer robot 206 adjacent to both the loading stations 202 and the treatment area 210 receives the wafers 50A and 50C from the loading stations 202 and 204 and places them into a load-lock 208 for the treatment area 210. The treatment area 210 may be a vacuum environment (a vacuum chamber), and may be any desired shape for contacting the treatment chemicals (discussed further below) with the wafers 50A and 50C. Furthermore, the treatment area 210 may be surrounded by a chamber housing 215 (see below, FIG. 4) made of material that is inert to the various process materials. As such, while the treatment area 210 may be any suitable material that can withstand the chemistries and pressures involved in the treatment process, in an embodiment the treatment area 210 may be steel, stainless steel, nickel, aluminum, alloys of these, combinations of these, and the like.

The treatment area 210 may also be connected to one or more vacuum pumps 225 (see below, FIG. 4) for exhaust from the treatment area 210. In an embodiment the vacuum pump 225 is under the control of the controller 280, and may be utilized to control the pressure within the treatment area 210 to a desired pressure. Additionally, once the treatment process is completed, the vacuum pump 225 may be utilized to evacuate the treatment area 210 in preparation for removal of the wafers 50A and 50C.

In the treatment area 210, the wafers 50A and 50C are transferred by a transfer robot 206 to a pre-alignment module 212. In an embodiment the pre-alignment module 212 may comprise one or more rotating arms which can rotate the wafers 50A and 50C to any desired rotational position using, e.g., a notch located within the wafers 50A and 50C (not separately illustrated for clarity). However, any suitable angular position may be utilized.

Figure 4:
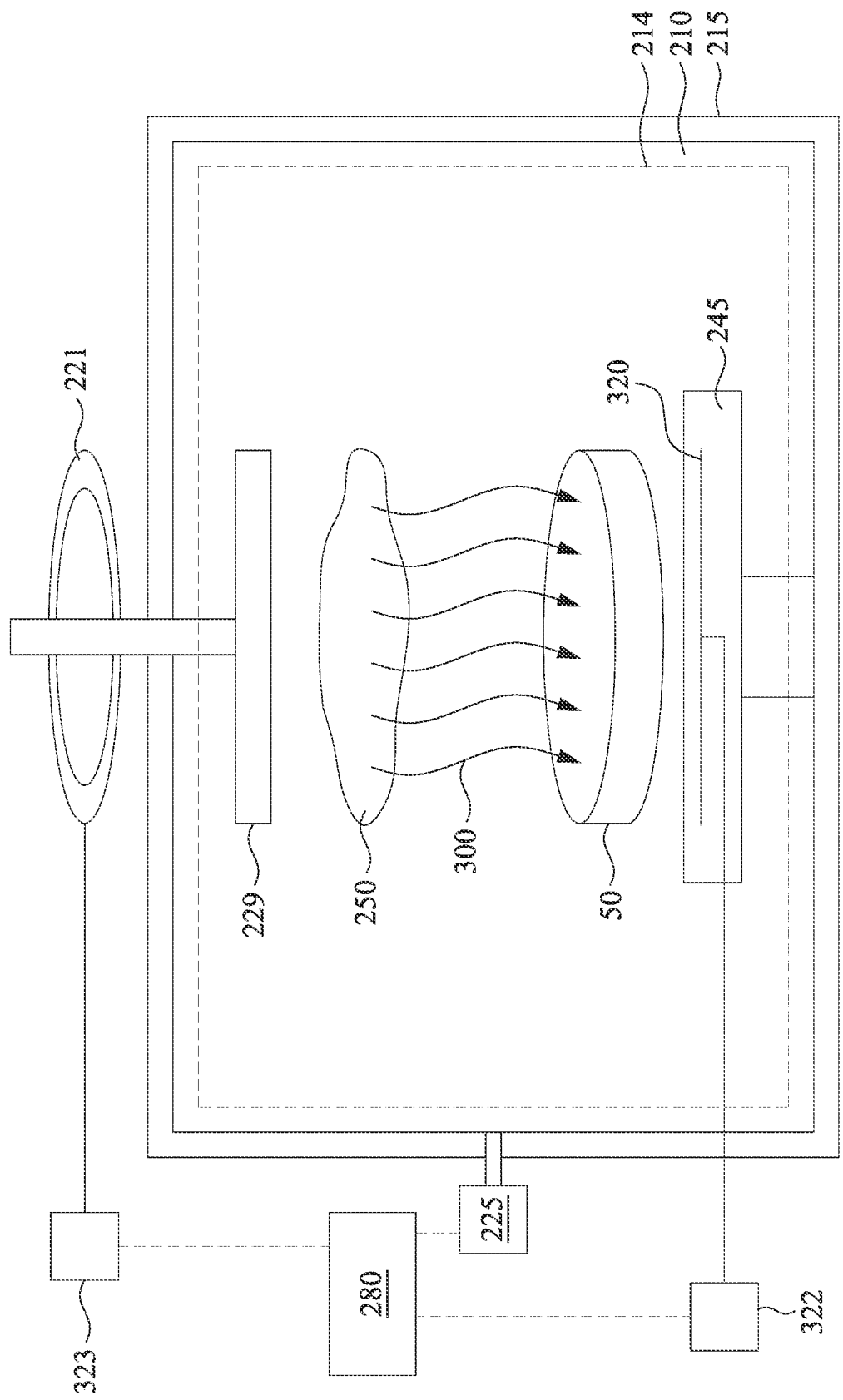
FIGS. 4, 5, 6, and 7 illustrate cross-sectional views of intermediate steps in a bonding process, in accordance with some embodiments.

Next, referring to FIG. 4, the transfer robot 206 within the treatment area 210 transfers the wafers 50A and 50C from the pre-alignment module 212 to the surface treatment station 214. In an embodiment the surface treatment station 214 is utilized to perform a surface treatment/activation (represented in FIG. 4 by the wavy lines labeled 300) is performed on the surfaces of the wafers 50A and 50C. In some embodiments, the surface treatment 300 includes a plasma activation step, a liquid activation step, combinations of these, or the like. However, any suitable surface treatment may be utilized.

Within the surface treatment station 214 is located a mounting platform 245 in order to position and control the wafers 50A and 50C during the surface treatment. The mounting platform 245 may hold one or more of the wafers 50A and 50C using a combination of clamps, vacuum pressure, and/or electrostatic forces, and may also include heating and cooling mechanisms in order to control the temperature of the wafers 50A and 50C during the processes.

Additionally, in embodiments in which the surface treatment 300 is a plasma activation treatment, the mounting platform 245 may additionally comprise a first electrode 320 coupled to a first RF generator 322. The first electrode 320 may be electrically biased by the first RF generator 322 (which may be connected to and under control of the controller 280) at a RF voltage during the surface treatment 300. By being electrically biased, the first electrode 320 is used to provide a bias to the incoming treatment gases and assist to ignite them into a plasma. Additionally, the first electrode 320 is also utilized to maintain the plasma during the surface treatment 300.

Furthermore, while a single mounting platform 245 is illustrated in FIG. 4, this is merely intended for clarity and is not intended to be limiting. Rather, any number of mounting platforms 245 may additionally be included within the surface treatment station 214. As such, multiple semiconductor substrates may be treated simultaneously.

Additionally, the surface treatment station 214 comprises a showerhead 229. In an embodiment the showerhead 229 receives the various treatment gases and helps to disperse the various treatment gases into the surface treatment station 214. The showerhead 229 may be designed to evenly disperse the treatment gases in order to minimize undesired process conditions that may arise from uneven dispersal. In an embodiment the showerhead 229 may have a circular design with openings dispersed evenly around the showerhead 229 to allow for the dispersal of the desired treatment gases into the surface treatment station 214.

The surface treatment station 214 also comprises an upper electrode 221, for use as a plasma generator. In an embodiment the plasma generator may be a transformer coupled plasma generator and may be, e.g., a coil. The coil may be attached to a second RF generator 323 that is utilized to provide power to the upper electrode 221 (which may be connected to and under control of the controller 280) in order to ignite the plasma during introduction of the treatment gases.

However, while the upper electrode 221 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be utilized. All such methods are fully intended to be included within the scope of the embodiments.

In the surface treatment 300, the exposed surfaces of the wafers 50A and 50C are activated in order to produce hydrophilic Si—OH surfaces. For example, in an embodiment, the treatment area 210 may initially be purged with an inert gas ambient such as e.g. Ar, $N_2$, the like, or a combination thereof. Once purged a process gas used for generating the plasma 250 may be oxygen ($O_2$), nitrogen ($N_2$), or an $N_2/O_2$ mixture and may be introduced into the surface treatment station 214 through the showerhead 229. However, any suitable process gas may be used to generate the plasma 250. The plasma 250 used in the treatment may be low-power plasma, with the power (measured at the power supply) for generating the plasma 250 being in a range of 10 W to 200 W. During the surface treatment, the pressure in the treatment area 210 may be in a range of 0.01 mbar to 10 mbar. However, any suitable power and pressure may be utilized.

Additionally, before, during and after the surface treatment 300, the temperature and humidity within the treatment area 210 is monitored and controlled in order to ensure that the treatment meets all of the desired criteria. In some embodiments the first dehydrating apparatus 216, the first water source 218, and the first temperature and humidity sensor 227 work together and under the control of the controller 280 in order ensure that the temperature and humidity remain within desired parameters.

In a particular embodiment, the relative humidity in the treatment area 210 may be regulated and set to a desired range, such as e.g. 20% to 60%, by increasing or decreasing the density of water vapor in the treatment area 210. A relative humidity in a range of 20% to 60% may be advantageous for decreasing the non-bonded area of the wafers and improving the bond strength. A relative humidity less than 20% may be disadvantageous because it may lead to worse non-bonded area and weaker bond strength. A relative humidity greater than 60% may be disadvantageous because tiny bubbles may occur at the edges of the wafers.

For example, when the first temperature and humidity sensor 227 senses that the relative humidity is below the desired range, the controller 280 may send a signal and activate the first water source 218 to increase the amount of water in the atmosphere. In a particular embodiment the first water source 218 may be a device such as a water sprayer, which can spray or otherwise disperse water into the ambient atmosphere within the treatment area 210. However, any suitable device may be utilized.

Additionally, when the first temperature and humidity sensor 227 senses that the relative humidity is above the desired range, the controller 280 may send a signal and activate the first dehydrating apparatus 216 in order to decrease the amount of water in the ambient atmosphere. In a particular embodiment the first dehydrating apparatus 216 can be a source of clean dry air (CDA) that can be introduced into the treatment area 210 (through, e.g., a vent or other input port) in order to dilute the amount of water in the ambient atmosphere. In some embodiments the source of CDA may be a tank of compressed air, or else the CDA may be otherwise manufactured by receiving, purifying, and drying ambient air. However, any suitable method of reducing the relative humidity may be utilized.

Additionally, while the pre-alignment module 212 and the surface treatment station 214 are described above as having a singular ambient environment for both units, in some other embodiments, the pre-alignment module 212 and the surface treatment station 214 are each independent vacuum environments with respective dehydrating apparatuses, water sources, and temperature and humidity sensors, and the relative humidity in each station is separately monitored and controlled. In such embodiments another load-lock (not separately illustrated) may be utilized to move the wafers 50A and 50C from the pre-alignment module 212 and the surface treatment station 214.

Figure 5:
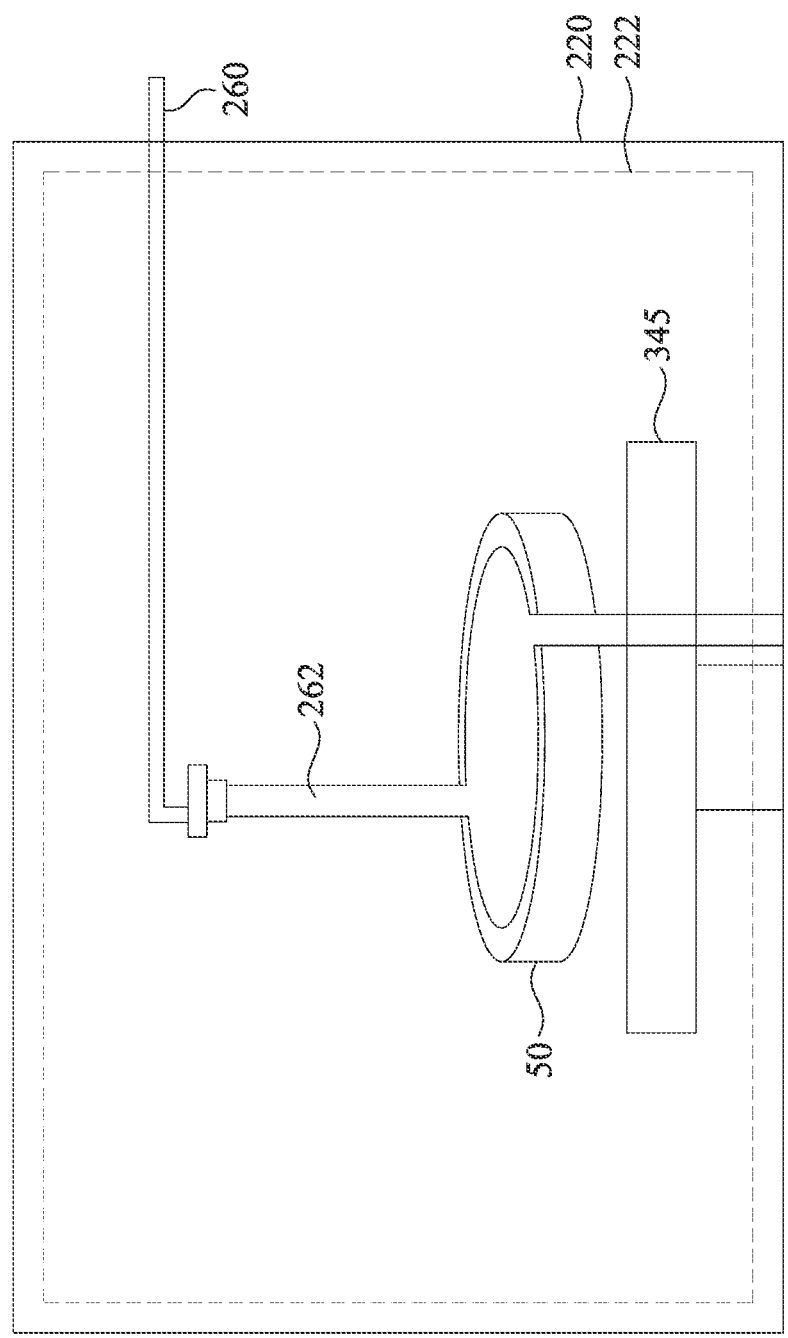

Referring to FIG. 3 and FIG. 5 (with FIG. 5 illustrating a view of the cleaning station 222 in FIG. 3), once the surface treatment 300 has been performed, the transfer robot 206 within the treatment area 210 transfers the wafers 50A and 50C to a load-lock 208 between the treatment area 210 and the bonding area 220, and the transfer robot 206 within the bonding area 220 moves the wafers 50A and 50C to the cleaning station 222 within the bonding area 220. In an embodiment the bonding area 220 may be a vacuum environment (a vacuum chamber) similar to the treatment area 210 and may also include the second temperature and humidity sensor 230, the second water source 228, and the second dehydrating apparatus 226, each of which are connected to the controller 280.

In an embodiment, once the wafers 50A and 50C are within the bonding area 220, the transfer robot 206 within the bonding area 220 transfers the wafers 50A and 50C to the cleaning station 222 (seen in greater detail in FIG. 5). The cleaning station 222 may be used to perform a cleaning step on the wafers 50A and 50C to remove metal oxides, chemicals, particles, and other undesirable substances from the surfaces of the wafers 50A and 50C prior to bonding.

In an embodiment the cleaning station 222 comprises a mounting station 345 and a faucet 260. The mounting station 345 may be similar to the mounting platform 245 described above with respect to FIG. 4. For example, the mounting station 345 may hold one or more of the wafers 50A and 50C using a combination of clamps, vacuum pressure, and/or electrostatic forces, and may also include heating and cooling mechanisms. However, any suitable devices for holding the wafers 50A and 50C may be utilized.

The faucet 260 is positioned over the mounting station 345 in order to dispense one or more cleaning agents over wafers 50A and 50C when the wafers 50A and 50C are mounted in the mounting station 345. During the cleaning step, the wafers 50A and 50C are mounted in the mounting station 345 and a cleaning agent 262 is then dispensed from the faucet 260 over the wafers 50A and 50C. In some embodiments, the cleaning agent 262 is deionized (DI) water. In other embodiments the cleaning agent 262 comprises, in addition to DI water, a chemical such as $NH_3$, $H_2O_2$, citric acid, or the like at a volume concentration in the cleaning agent 262 in a range of 0.01% to 10%. However, any suitable cleaning agent 262 may be utilized.

Figure 6:
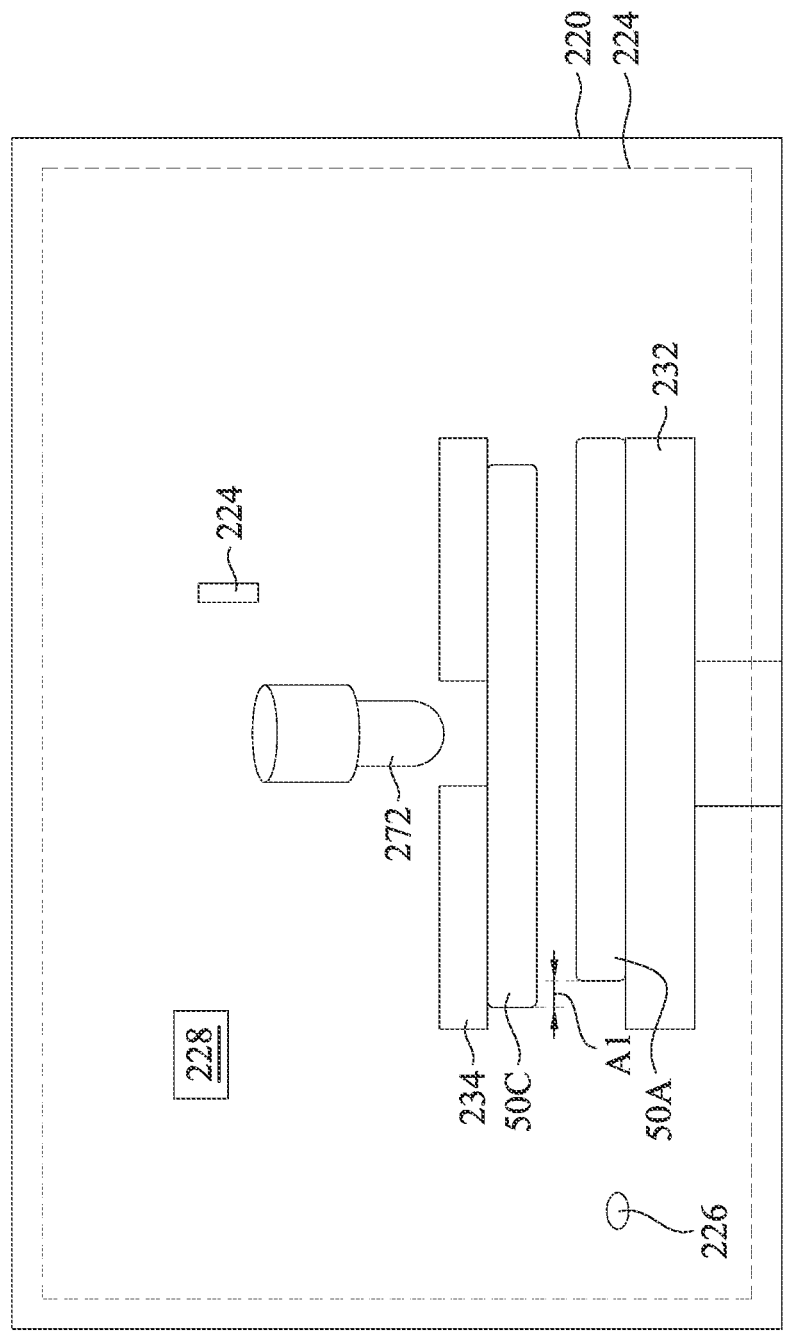

Next, referring to FIG. 3 and FIG. 6 (with FIG. 6 illustrating a close-up view of the bonding station 224 in FIG. 3), the transfer robot 206 within the bonding area 220 transfers the wafers 50A and 50C from the cleaning station 222 to the bonding station 224. In an embodiment the bonding area 220 may comprise a first wafer chuck 232 and a second wafer chuck 234. In an embodiment the first wafer chuck 232 and the second wafer chuck 234 are used in order to hold and control the orientation and movement of the wafers 50A and 50C during the bonding process. In an embodiment the first wafer chuck 232 and the second wafer chuck 234 comprise any suitable material that may be used to hold one of the wafers 50A and 50C. In an embodiment, for example, silicon based materials, such as glass, silicon oxide, silicon nitride, or other materials, such as aluminum oxide, combinations of any of these materials, or the like may be used. Additionally, the first wafer chuck 232 and the second wafer chuck 234 may have a diameter that is suitable to hold one of the wafers 50A and 50C. As such, while the size of the first wafer chuck 232 and the second wafer chuck 234 will be in some ways dependent upon the size of the wafers 50A and 50C, the first wafer chuck 232 and the second wafer chuck 234 can have a first diameter of about 250 mm and about 300 mm. However, any suitable dimensions may be utilized.

Additionally, in some embodiments the bonding station 224 comprises one or more push pins 272. In an embodiment the one or more push pins 272 are positioned to extend through either the first wafer chuck 232 or the second wafer chuck 234 and to warp or bend one or more of the wafers 50A and 50C. By warping the wafers 50A and 50C, physical contact is initially made at a center of the wafers 50A and 50C before allowing the wafers 50A and 50C to bond at the edges.

At the bonding station 224, the wafers 50A and 50C are mounted on the first wafer chuck 232 and the second wafer chuck 234. Once in place the first wafer chuck 232 and the second wafer chuck 234 may align the wafers 50A and 50C for bonding. In a particular embodiment the mounting station 445 may align the wafers 50A and 50C to an alignment accuracy A1 in a range of 100 μm to 10 nm. However, any suitable alignment may be performed.

Figure 7:
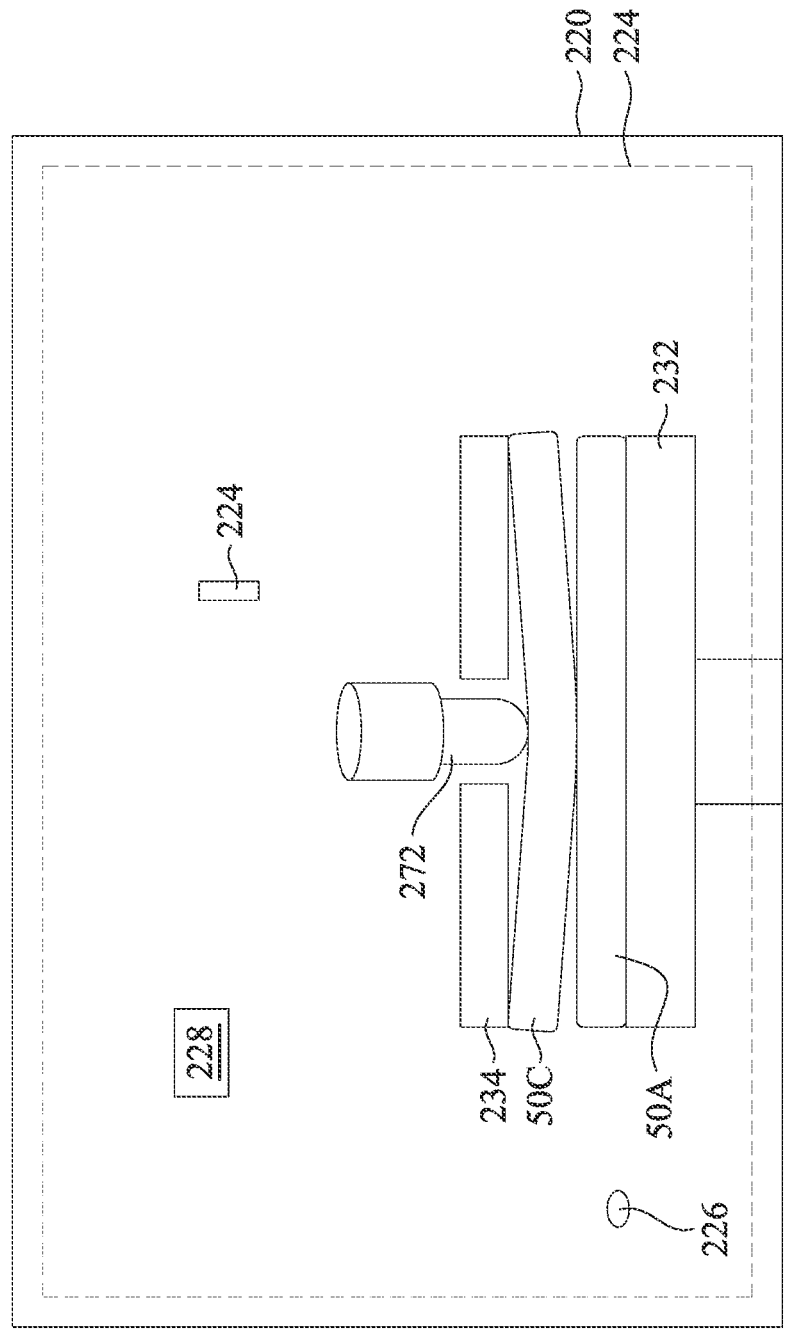

In FIG. 7, the wafers 50A and 50C are pressed together for bonding. The first wafer chuck 232 and the second wafer chuck 234 are initiated to begin moving the wafers 50A and 50C together for bonding. Once in position, one or more of the push pins 272 are utilized to warp or deform one or more of the wafers 50A and/or 50C to initiate the bonding process. Once one or more of the wafers 50A and/or 50C are warped, the first wafer chuck 232 and the second wafer chuck 234 are initiated to begin moving the wafers 50A and 50C for bonding.

In order to provide a sufficient $H_2O$ layer between 2 wafers to improve the subsequent bonding between the wafers 50A and 50C, the relative humidity in the bonding area 220 is controlled to be in a range of 20% to 70%, such as in a range of 35% to 60% or in a range of 39% to 45%. A relative humidity in a range of 39% to 45% may be advantageous for providing a sufficient amount of water to form hydrogen bonds and create linkage between the wafers 50A and 50C. A relative humidity less than 39% may be disadvantageous by leading to insufficient water coverage which may cause non-bonded edges on the wafers. A relative humidity greater than 45% may be disadvantageous by leading to excessive water coverage that may cause bubble defects to form by moisture condensation in the bonding between the wafers.

The temperature in the bonding area 220 is controlled to be in a range of 15° C. to 45° C., which may be useful for improving the bonding between the wafers 50A and 50CA temperature less than 15° C. may be disadvantageous by leading to higher relative humidity and may cause bubble defects to form by the Joule-Thomson effect of moisture condensation in the bonding between the wafers. A temperature greater than 45° C. may be disadvantageous by leading to insufficient water coverage which may cause non-bonded edges on the wafers.

Figure 8:
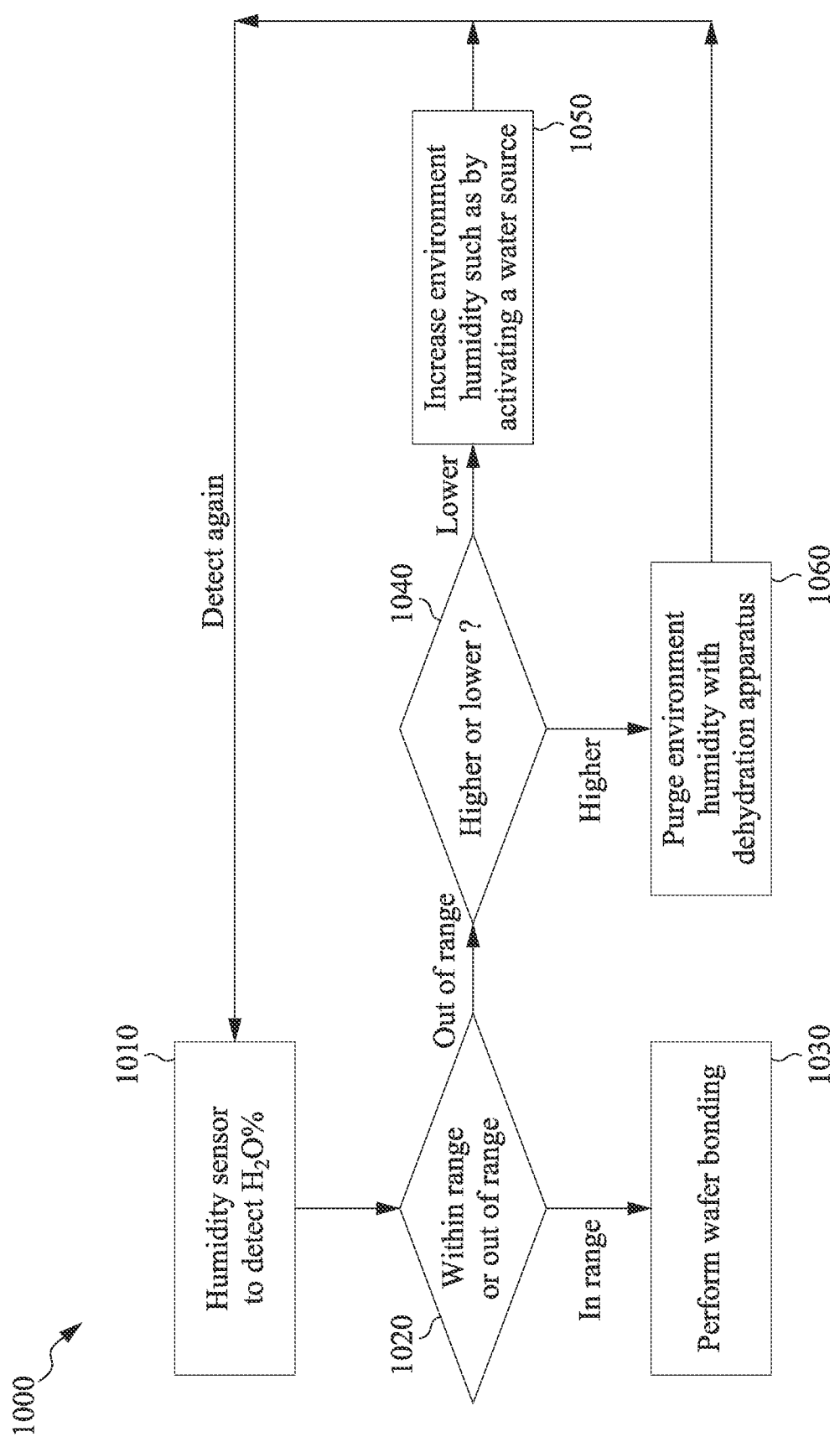
FIG. 8 illustrates a flow chart of a method of a bonding process, in accordance with some embodiments.

FIG. 8 illustrates a flow chart showing a process 1000 for controlling the relative humidity in the bonding area 220 to be within a desired range, such as e.g. a relative humidity of 42%±3%. Controlling the relative humidity may be useful for improving bond quality and run-to-run stability. At step 1010, the wafers 50A and 50C have been aligned in the bonding station 224 (see above, FIG. 7) and the temperature and humidity sensor 227 measures the relative humidity ($H_2O$ percentage) in the bonding area 220. At step 1020, the controller 280 determines if the relative humidity in the bonding area 220 is within the desired range, such as e.g. a range of 39% to 45%. If the controller 280 determines that the relative humidity in the bonding area 220 is within the desired range, then the process 1000 continues to step 1030 and wafer bonding is performed (see below, FIG. 9). If the controller 280 determines that the relative humidity in the bonding area 220 is outside the desired range, the process continues to step 1040 in which the controller determines if the relative humidity is lower or higher than the desired range.

If the relative humidity is determined to be lower than the desired range in step 1040, the process 1000 continues to step 1050 in which the bonding area 220 environment humidity is increased by activating the second water source 228 such as e.g. a water sprayer. The process 1000 then returns to step 1010 in which the relative humidity in the bonding area 220 is measured again. The process 1000 may be continued until step 1030 is reached.

If the relative humidity is determined to be higher than the desired range in step 1040, the process 1000 continues to step 1060 in which the bonding area 220 environment humidity is purged by activating the second dehydration apparatus 226 such as e.g. a vent connected to clean dry air (CDA). The process 1000 then returns to step 1010 in which the relative humidity in the bonding area 220 is measured again. The process 1000 may be continued until step 1030 is reached.

Figure 9:
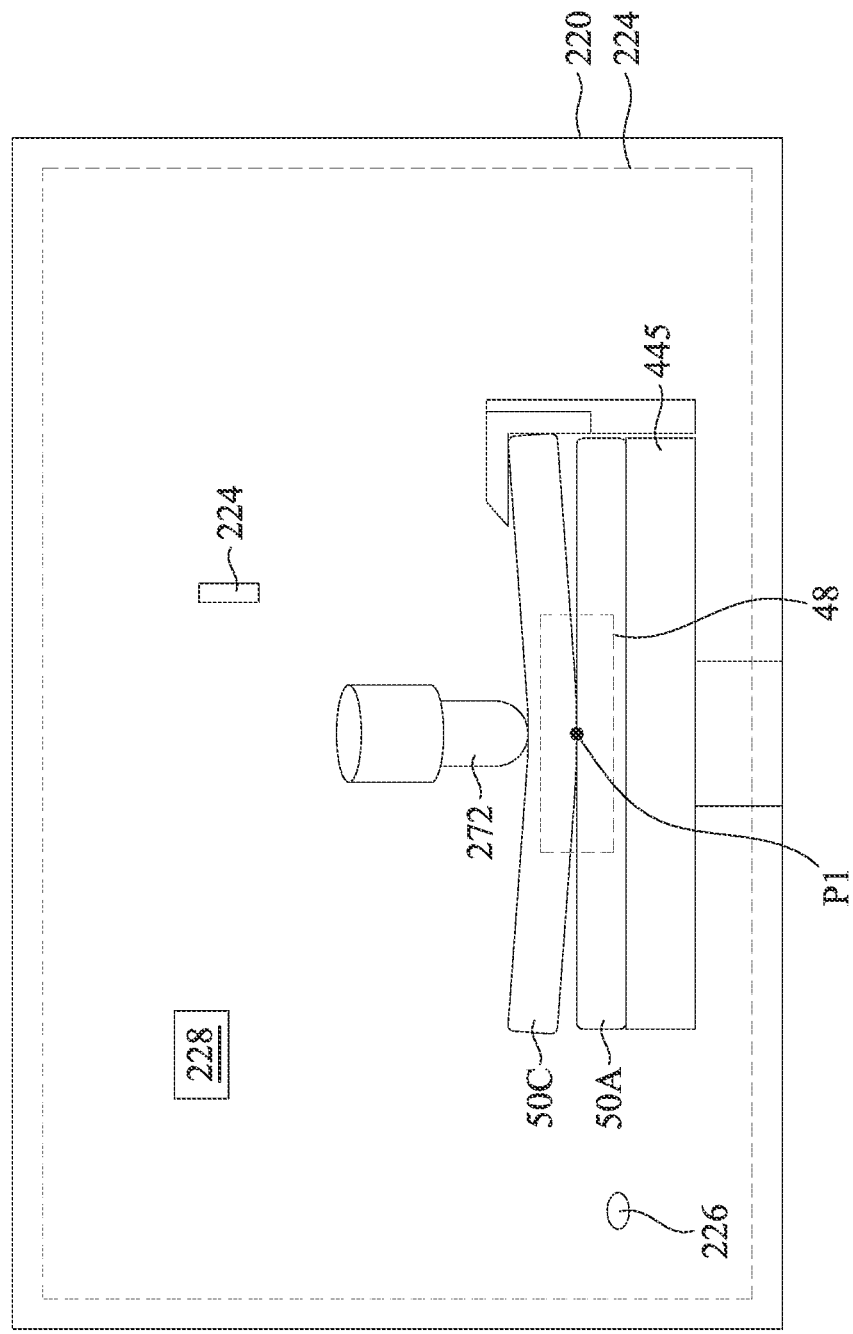
FIGS. 9 and 10 illustrate cross-sectional views of intermediate steps in a bonding process, in accordance with some embodiments.

FIG. 9 illustrates a bonding process of the wafers 50A and 50C. In some embodiments, the bonding process is performed by bringing the wafers 50A and 50C into contact by utilizing a combination of the first wafer chuck 232, the second wafer chuck 234, and the push pin 272 to apply pressure against the wafers 50A and 50C at a first point P1. The bonding then proceeds in a wave (also referred to as a bonding wave) from the first point P1 and moving outwards towards the edges of the wafers 50A and 50C. However, any suitable bonding method may be used.

Additionally, as the wafers 50A and 50C move through the surface treatment 300, the cleaning station 222, and the bonding station, the various exposures will also work to introduce oxygen (or moisture) onto the surfaces of the wafers 50A and 50C. This oxygen is incorporated into the wafers 50A and 50C to form the film 50B, which is an oxidized version of the material of the wafers 50A and 50C, such as silicon oxide. However, any suitable material may be utilized.

In another embodiment, rather than utilizing the various process steps described herein to form the film 50B, the film 50B is separately formed prior to the bonding process, with a first portion being formed on the wafer 50A and a second portion being formed on the wafer 50C. In these embodiments the film 50B is a silicon oxide film formed as a native oxide, a thermal oxide, or a high density plasma (HDP) oxide, depending on the bonding process utilized to bond the wafers 50A and 50C. As such, the film 50B may have a thickness in a range of 0.5 nm to 2000 nm, a roughness with an RMS measured from the center of the film 50B to an edge of the film 50B in a range of 0.05 nm to 5 nm, and a warpage of the substrate 50 may have a bow value in a range of 1 μm to 200 μm. However, any suitable methods and dimensions may be utilized.

Figure 10:
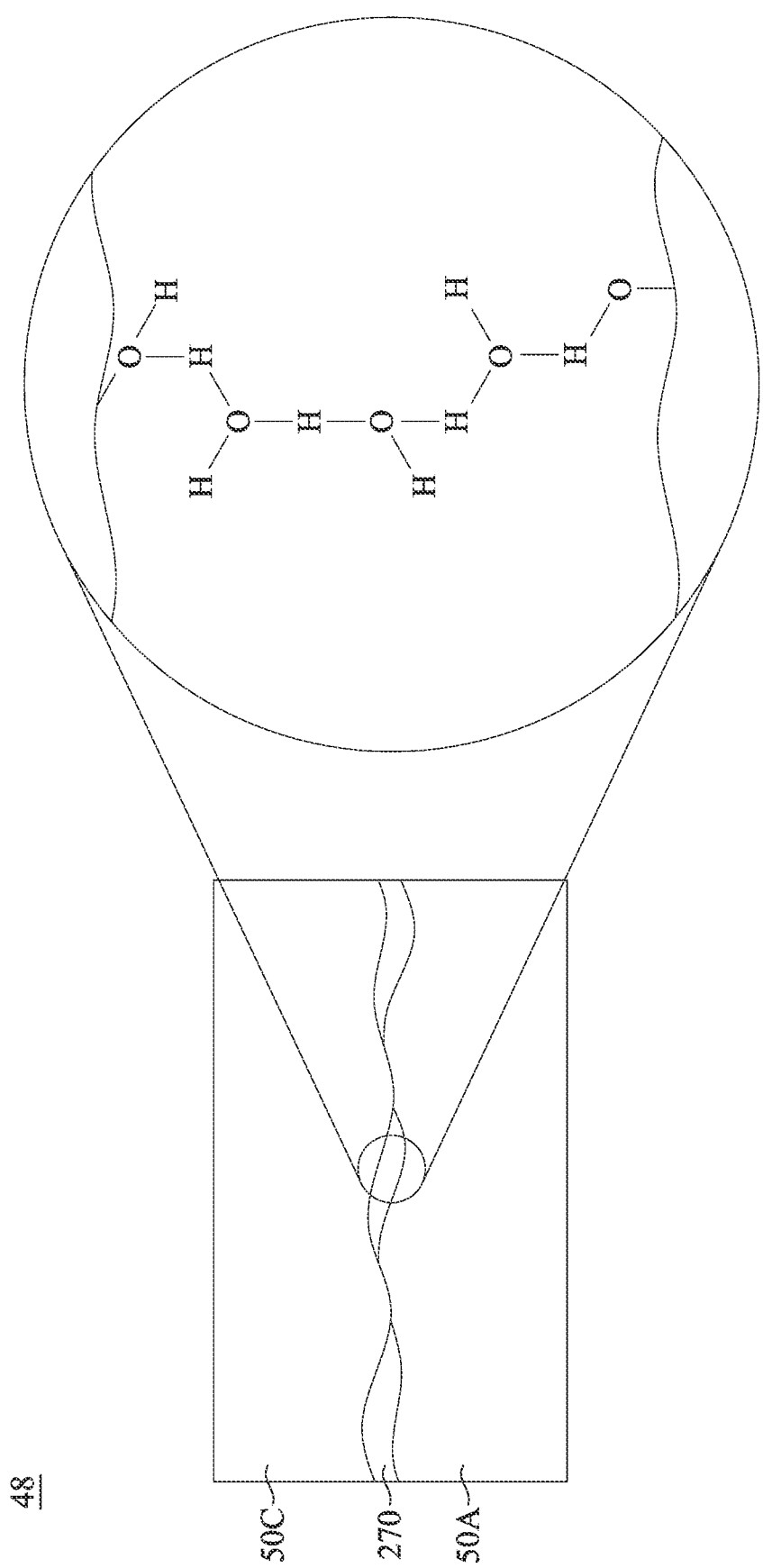

FIG. 10 illustrates a detailed view of region 48 shown in FIG. 9 showing the formation of hydrogen bonds in a $H_2O$ layer 270 between the wafers 50A and 50C. Forming hydrogen bonds in the $H_2O$ layer 270 between the wafers 50A and 50C may create linkage between the two wafers during the bonding process, which may lead to an improved bonding between the wafers 50A and 50C. The improved bonding between the wafers may reduce defects in the bonding such as non-bonded edges of the wafers and bubble defects.

After the bonding process to bond the wafers 50A and 50C, the bonded wafers 50A and 50C may then be transferred back to the loading stations 202 and 204 by the transfer robot 206 where the substrate 50 is unloaded from the wafer bonding system 200.

FIGS. 11 through 38C illustrate cross-sectional views of intermediate stages in the manufacturing of nano-FETs using the now bonded wafers 50A and 50C as the substrate 50, in accordance with some embodiments. FIGS. 11 through 14, 15A, 16A, 17A, 18A, 19A, 20A, 21A, 22A, 23A, 24A, 25A, 26A, 27A, 28A, 29A, 30A, 31A, 32A, 33A, 34A, 35A, 36A, 37A, and 38A illustrate reference cross-section A-A' illustrated in FIG. 1. FIGS. 15B, 16B, 17B, 18B, 18D, 19B, 20B, 21B, 21D, 21F, 22B, 23B, 24B, 25B, 26B, 27B, 28B, 29B, 30B, 31B, 31D, 32B, 33B, 34B, 35B, 36B, 37B, and 38B illustrate reference cross-section B-B' illustrated in FIG. 1. FIGS. 15C, 16C, 17C, 18C, 18E, 19C, 20C, 20D, 21C, 21E, 21G, 22C, 23C, 24C, 25C, 26C, 27C, 28C, 29C, 30C, 31C, 31E, 32C, 33C, 34C, 35C, 36C, 37C, and 38C illustrate reference cross-section C-C' illustrated in FIG. 1. FIG. 39 illustrates a cross-section C-C' illustrated in FIG. 1 of an intermediate stage in the manufacturing of a structure having nano-FETs on a bonded wafer 350, in accordance with some embodiments.

Figure 11:
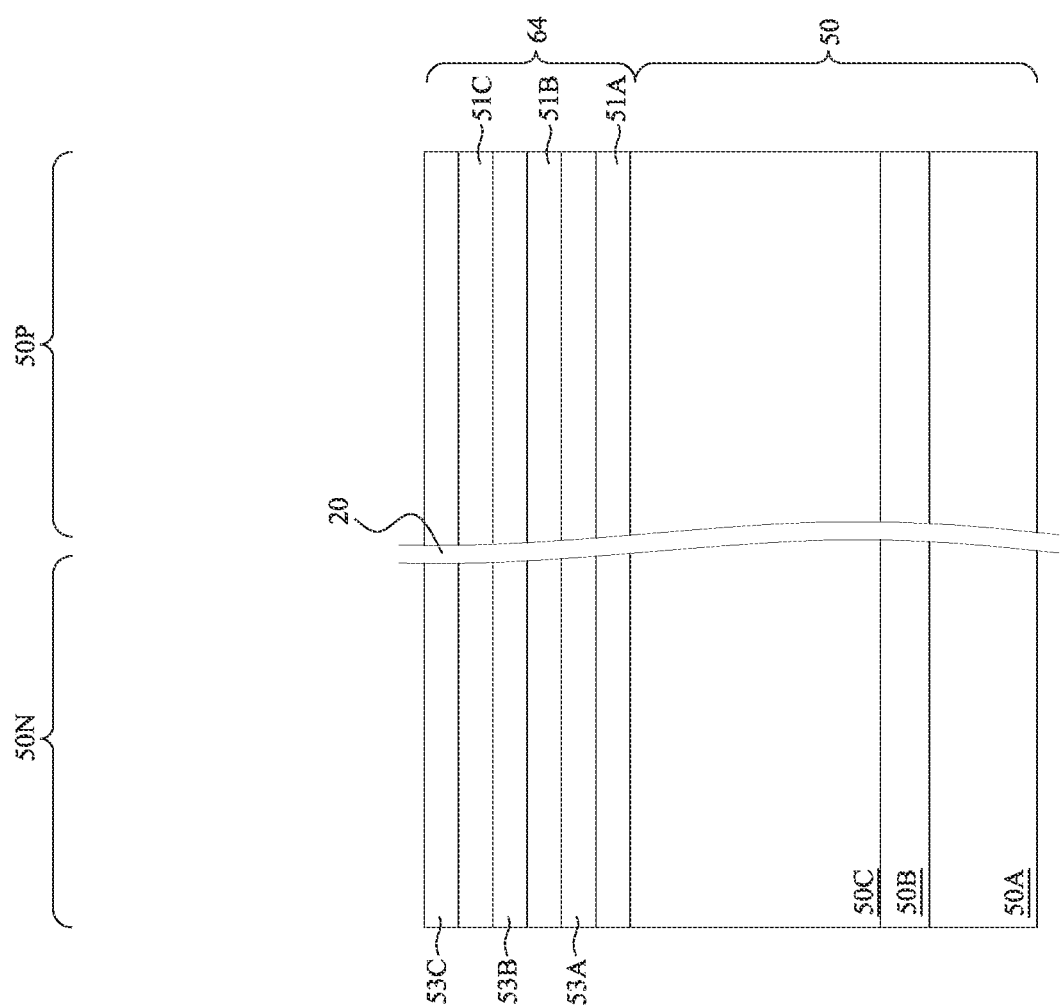

In FIG. 11, a multi-layer stack 64 is formed over the substrate 50 as illustrated in FIG. 2, which may be formed by the process illustrated above in FIGS. 3 through 10. The multi-layer stack 64 includes alternating layers of first semiconductor layers 51A-51C (collectively referred to as first semiconductor layers 51) and second semiconductor layers 53A-53C (collectively referred to as second semiconductor layers 53). For purposes of illustration and as discussed in greater detail below, the first semiconductor layers 51 will be removed and the second semiconductor layers 53 will be patterned to form channel regions of nano-FETs in the n-type region 50N and the p-type region 50P. However, in some embodiments the first semiconductor layers 51 may be removed and the second semiconductor layers 53 may be patterned to form channel regions of nano-FETs in the n-type region 50N, and the second semiconductor layers 53 may be removed and the first semiconductor layers 51 may be patterned to form channel regions of nano-FETs in the p-type region 50P. In some embodiments the second semiconductor layers 53 may be removed and the first semiconductor layers 51 may be patterned to form channel regions of nano-FETs in the n-type region 50N, and the first semiconductor layers 51 may be removed and the second semiconductor layers 53 may be patterned to form channel regions of nano-FETs in the p-type region 50P. In some embodiments, the second semiconductor layers 53 may be removed and the first semiconductor layers 51 may be patterned to form channel regions of nano-FETs in both the n-type region 50N and the p-type region 50P.

The multi-layer stack 64 is illustrated as including three layers of each of the first semiconductor layers 51 and the second semiconductor layers 53 for illustrative purposes. In some embodiments, the multi-layer stack 64 may include any number of the first semiconductor layers 51 and the second semiconductor layers 53. Each of the layers of the multi-layer stack 64 may be epitaxially grown using a process such as chemical vapor deposition (CVD), atomic layer deposition (ALD), vapor phase epitaxy (VPE), molecular beam epitaxy (MBE), or the like. In various embodiments, the first semiconductor layers 51 may be formed of a first semiconductor material suitable for p-type nano-FETs, such as silicon germanium or the like, and the second semiconductor layers 53 may be formed of a second semiconductor material suitable for n-type nano-FETs, such as silicon, silicon carbon, or the like. The multi-layer stack 64 is illustrated as having a bottommost semiconductor layer suitable for p-type nano-FETs for illustrative purposes. In some embodiments, multi-layer stack 64 may be formed such that the bottommost layer is a semiconductor layer suitable for n-type nano-FETs.

The first semiconductor materials and the second semiconductor materials may be materials having a high etch selectivity to one another. As such, the first semiconductor layers 51 of the first semiconductor material may be removed without significantly removing the second semiconductor layers 53 of the second semiconductor material thereby allowing the second semiconductor layers 53 to be patterned to form channel regions of nano-FETs. Similarly, in embodiments in which the second semiconductor layers 53 are removed and the first semiconductor layers 51 are patterned to form channel regions, the second semiconductor layers 53 of the second semiconductor material may be removed without significantly removing the first semiconductor layers 51 of the first semiconductor material, thereby allowing the first semiconductor layers 51 to be patterned to form channel regions of nano-FETs.

Figure 12:
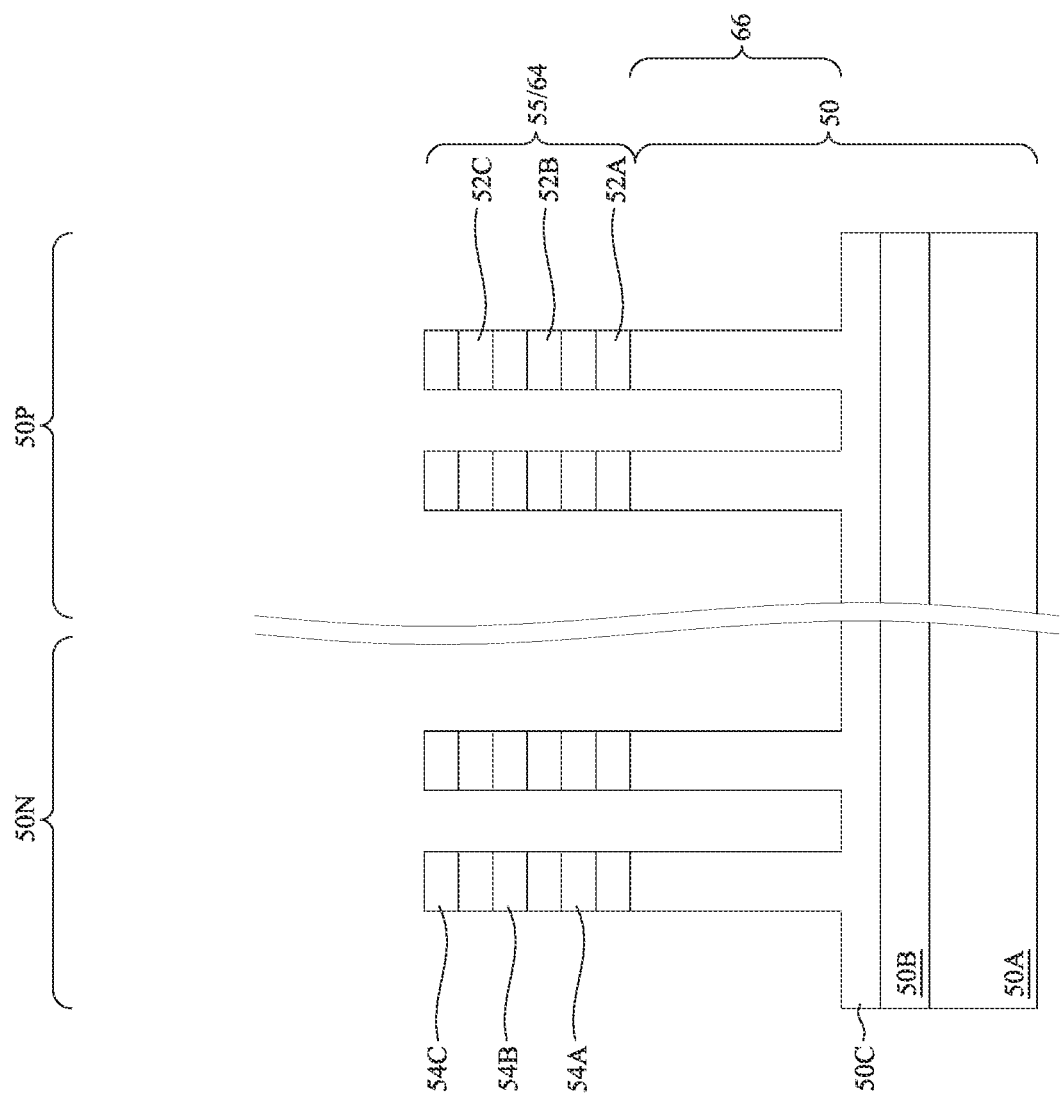

Referring now to FIG. 12, fins 66 are formed in the wafer 50C and nanostructures 55 are formed in the multi-layer stack 64, in accordance with some embodiments. In some embodiments, the nanostructures 55 and the fins 66 may be formed in the multi-layer stack 64 and the wafer 50C, respectively, by etching trenches in the multi-layer stack 64 and the wafer 50C. The etching may be any acceptable etch process, such as a reactive ion etch (RIE), neutral beam etch (NBE), the like, or a combination thereof. The etching may be anisotropic. Forming the nanostructures 55 by etching the multi-layer stack 64 may further define first nanostructures 52A-52C (collectively referred to as the first nanostructures 52) from the first semiconductor layers 51 and define second nanostructures 54A-54C (collectively referred to as the second nanostructures 54) from the second semiconductor layers 53. The first nanostructures 52 and the second nanostructures 54 may be collectively referred to as nanostructures 55.

The fins 66 and the nanostructures 55 may be patterned by any suitable method. For example, the fins 66 and the nanostructures 55 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 66.

FIG. 12 illustrates the fins 66 in the n-type region 50N and the p-type region 50P as having substantially equal widths for illustrative purposes. In some embodiments, widths of the fins 66 in the n-type region 50N may be greater or thinner than the fins 66 in the p-type region 50P. Further, while each of the fins 66 and the nanostructures 55 are illustrated as having a consistent width throughout, in other embodiments, the fins 66 and/or the nanostructures 55 may have tapered sidewalls such that a width of each of the fins 66 and/or the nanostructures 55 continuously increases in a direction towards the substrate 50. In such embodiments, each of the nanostructures 55 may have a different width and be trapezoidal in shape.

Figure 13:
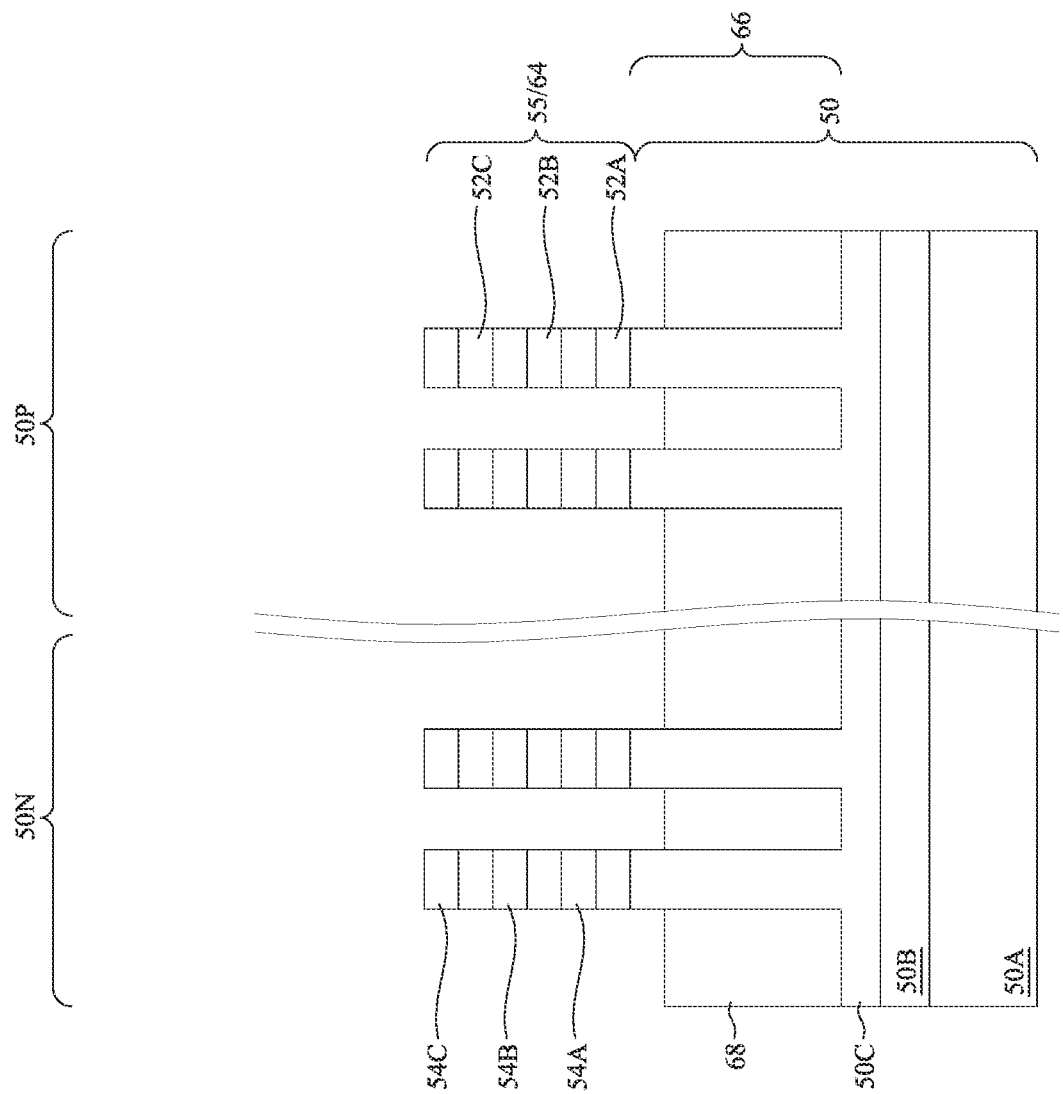

In FIG. 13, shallow trench isolation (STI) regions 68 are formed adjacent the fins 66. The STI regions 68 may be formed by depositing an insulation material over the wafer 50C, the fins 66, and nanostructures 55, and between adjacent fins 66. The insulation material may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In the illustrated embodiment, the insulation material is silicon oxide formed by an FCVD process. An anneal process may be performed once the insulation material is formed. In an embodiment, the insulation material is formed such that excess insulation material covers the nanostructures 55. Although the insulation material is illustrated as a single layer, some embodiments may utilize multiple layers. For example, in some embodiments a liner (not separately illustrated) may first be formed along a surface of the wafer 50C, the fins 66, and the nanostructures 55. Thereafter, a fill material, such as those discussed above may be formed over the liner.

A removal process is then applied to the insulation material to remove excess insulation material over the nanostructures 55. In some embodiments, a planarization process such as a chemical mechanical polish (CMP), an etch-back process, combinations thereof, or the like may be utilized. The planarization process exposes the nanostructures 55 such that top surfaces of the nanostructures 55 and the insulation material are level after the planarization process is complete.

The insulation material is then recessed to form the STI regions 68. The insulation material is recessed such that upper portions of fins 66 in the n-type region 50N and the p-type region 50P protrude from between neighboring STI regions 68. Further, the top surfaces of the STI regions 68 may have a flat surface as illustrated, a convex surface, a concave surface (such as dishing), or a combination thereof. The top surfaces of the STI regions 68 may be formed flat, convex, and/or concave by an appropriate etch. The STI regions 68 may be recessed using an acceptable etching process, such as one that is selective to the material of the insulation material (e.g., etches the material of the insulation material at a faster rate than the material of the fins 66 and the nanostructures 55). For example, an oxide removal using, for example, dilute hydrofluoric (dHF) acid may be used.

The process described above with respect to FIGS. 11 through 13 is just one example of how the fins 66 and the nanostructures 55 may be formed. In some embodiments, the fins 66 and/or the nanostructures 55 may be formed using a mask and an epitaxial growth process. For example, a dielectric layer can be formed over a top surface of the wafer 50C, and trenches can be etched through the dielectric layer to expose the underlying wafer 50C. Epitaxial structures can be epitaxially grown in the trenches, and the dielectric layer can be recessed such that the epitaxial structures protrude from the dielectric layer to form the fins 66 and/or the nanostructures 55. The epitaxial structures may comprise the alternating semiconductor materials discussed above, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Additionally, the first semiconductor layers 51 (and resulting first nanostructures 52) and the second semiconductor layers 53 (and resulting second nanostructures 54) are illustrated and discussed herein as comprising the same materials in the p-type region 50P and the n-type region 50N for illustrative purposes only. As such, in some embodiments one or both of the first semiconductor layers 51 and the second semiconductor layers 53 may be different materials or formed in a different order in the p-type region 50P and the n-type region 50N.

Further in FIG. 13, appropriate wells (not separately illustrated) may be formed in the fins 66, the nanostructures 55, and/or the STI regions 68. In embodiments with different well types, different implant steps for the n-type region 50N and the p-type region 50P may be achieved using a photoresist or other masks (not separately illustrated). For example, a photoresist may be formed over the fins 66 and the STI regions 68 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from about $10^{13}$ atoms/cm$^3$ to about $10^{14}$ atoms/cm$^3$. After the implant, the photoresist is removed, such as by an acceptable ashing process.

Following or prior to the implanting of the p-type region 50P, a photoresist or other masks (not separately illustrated) is formed over the fins 66, the nanostructures 55, and the STI regions 68 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from about $10^{13}$ atoms/cm$^3$ to about $10^{14}$ atoms/cm$^3$. After the implant, the photoresist may be removed, such as by an acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 14:
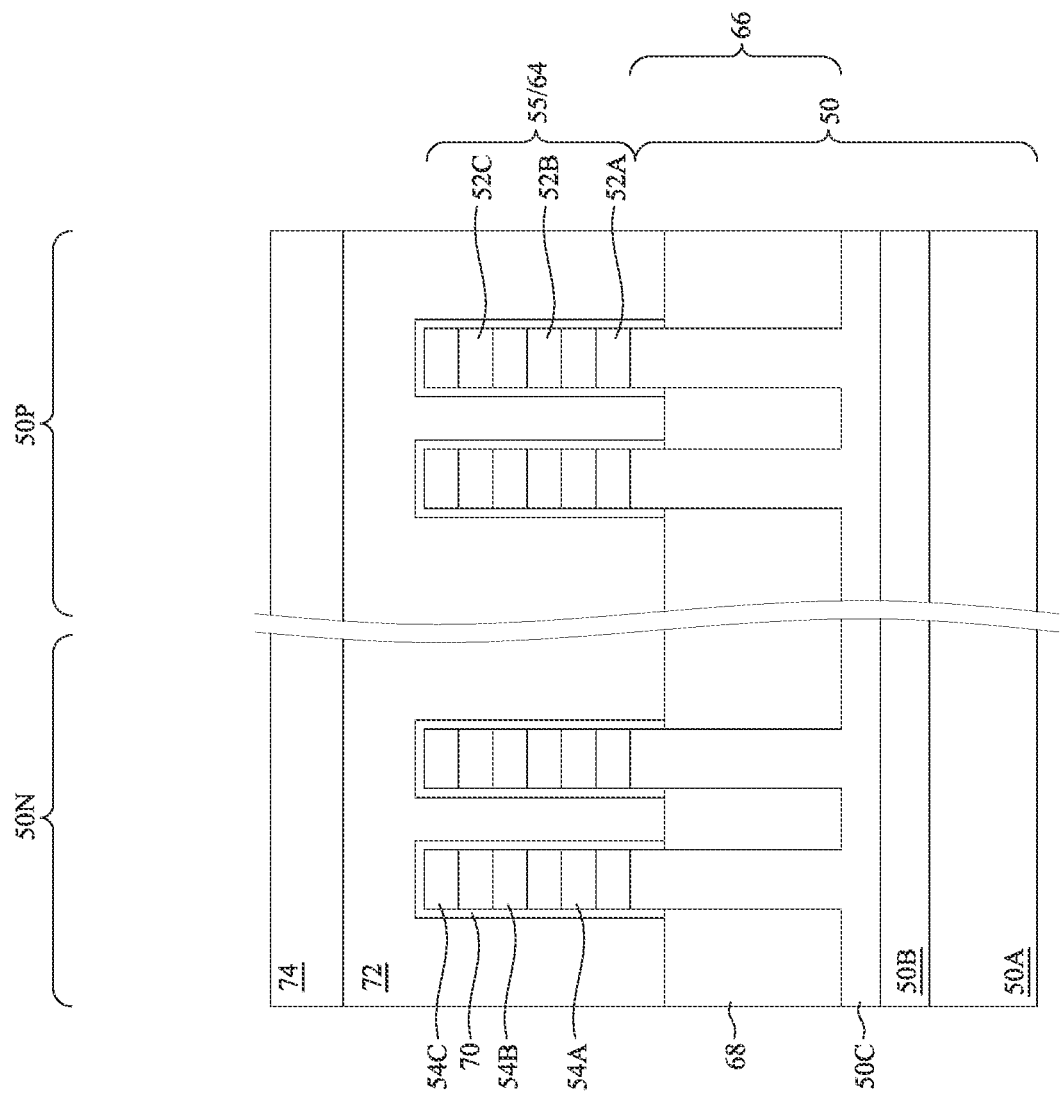

In FIG. 14, a dummy dielectric layer 70 is formed on the fins 66 and/or the nanostructures 55. The dummy dielectric layer 70 may be, for example, silicon oxide, silicon nitride, a combination thereof, or the like, and may be deposited or thermally grown according to acceptable techniques. A dummy gate layer 72 is formed over the dummy dielectric layer 70, and a mask layer 74 is formed over the dummy gate layer 72. The dummy gate layer 72 may be deposited over the dummy dielectric layer 70 and then planarized, such as by a CMP. The mask layer 74 may be deposited over the dummy gate layer 72. The dummy gate layer 72 may be a conductive or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 72 may be deposited by physical vapor deposition (PVD), CVD, sputter deposition, or other techniques for depositing the selected material. The dummy gate layer 72 may be made of other materials that have a high etching selectivity from the etching of isolation regions. The mask layer 74 may include, for example, silicon nitride, silicon oxynitride, or the like. In this example, a single dummy gate layer 72 and a single mask layer 74 are formed across the n-type region 50N and the p-type region 50P. It is noted that the dummy dielectric layer 70 is shown covering only the fins 66 and the nanostructures 55 for illustrative purposes only. In some embodiments, the dummy dielectric layer 70 may be deposited such that the dummy dielectric layer 70 covers the STI regions 68, such that the dummy dielectric layer 70 extends between the dummy gate layer 72 and the STI regions 68.

Figure 15B:
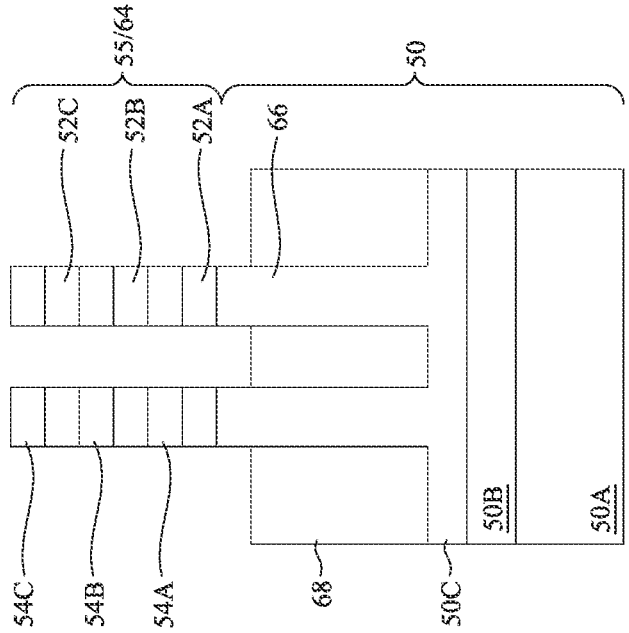
Figure 15A:
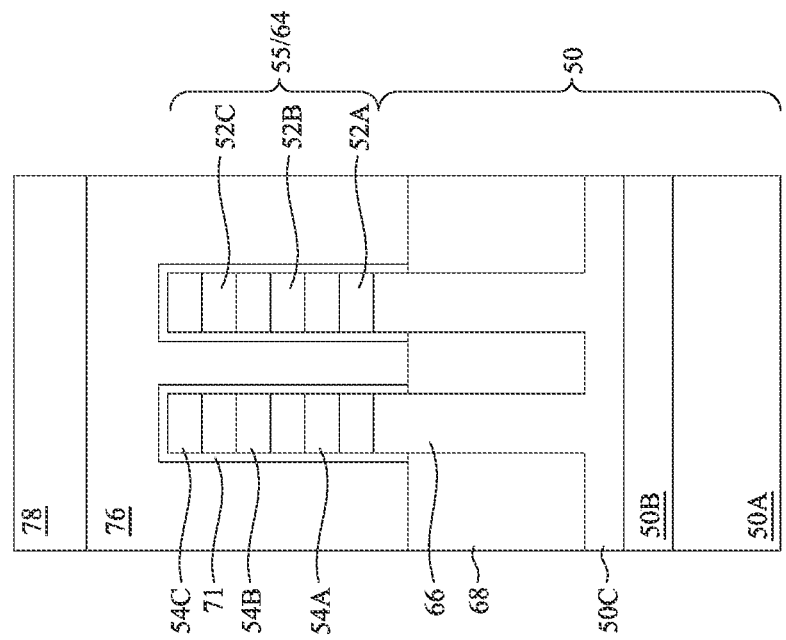
Figure 15C:
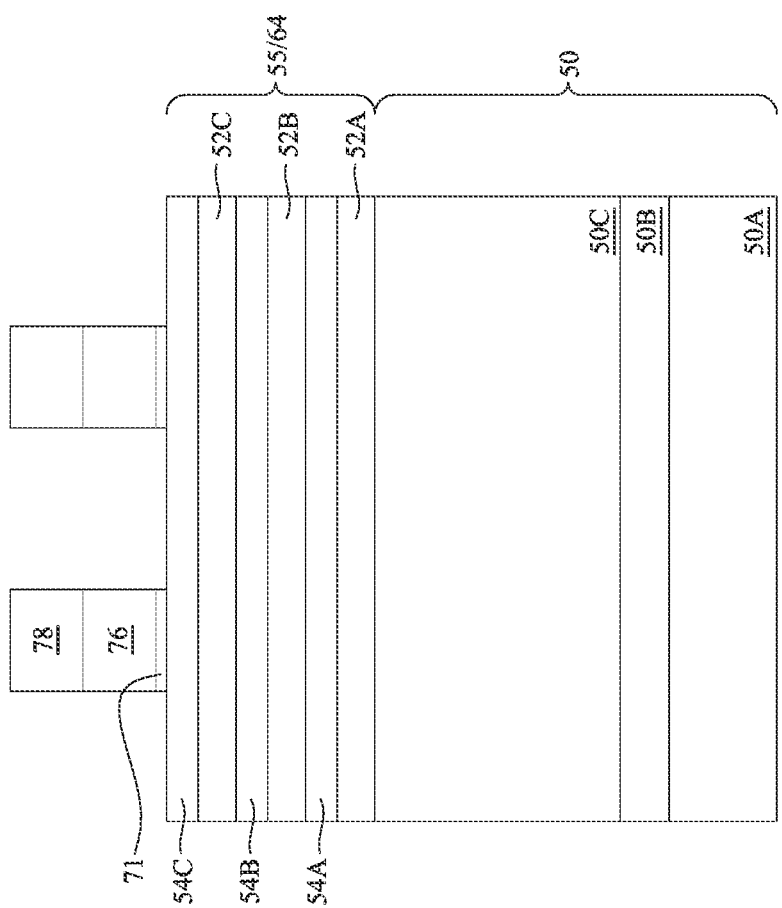

FIGS. 15A through 27C illustrate various additional steps in the manufacturing of embodiment devices. FIGS. 15A through 27C illustrate features in either the n-type region 50N or the p-type region 50P. In FIGS. 15A through 15C, the mask layer 74 (see FIG. 5) may be patterned using acceptable photolithography and etching techniques to form masks 78. The pattern of the masks 78 then may be transferred to the dummy gate layer 72 and to the dummy dielectric layer 70 to form dummy gates 76 and dummy gate dielectrics 71, respectively. The dummy gates 76 cover respective channel regions of the fins 66. The pattern of the masks 78 may be used to physically separate each of the dummy gates 76 from adjacent dummy gates 76. The dummy gates 76 may also have a lengthwise direction substantially perpendicular to the lengthwise direction of respective fins 66.

Figure 16C:
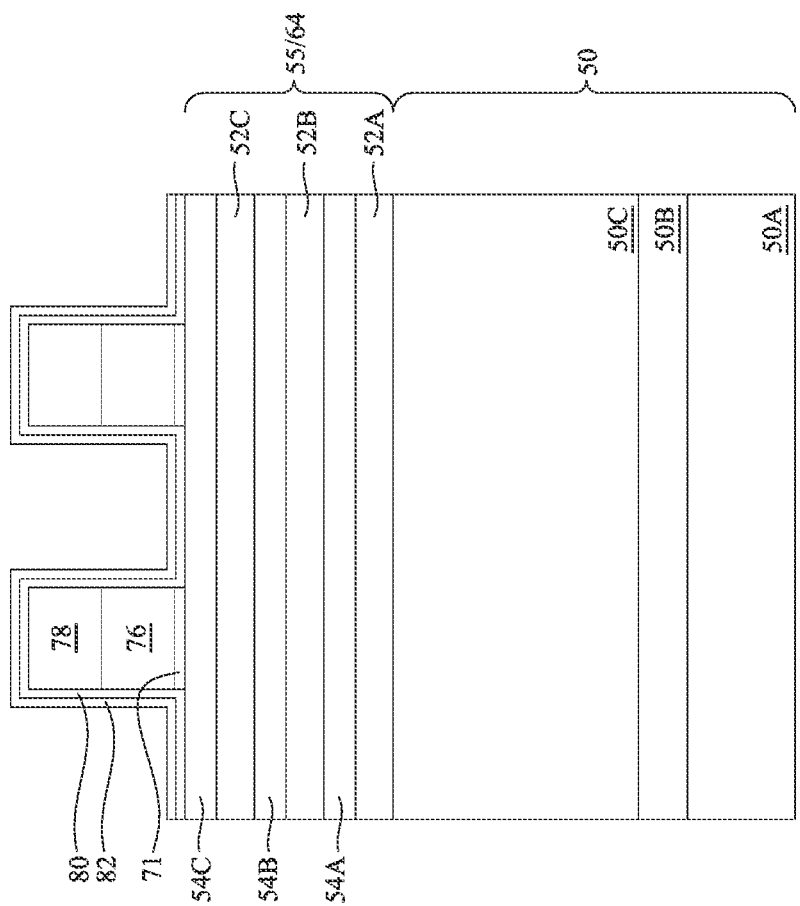

In FIGS. 16A through 16C, a first spacer layer 80 and a second spacer layer 82 are formed over the structures illustrated in FIGS. 15A through 15C. The first spacer layer 80 and the second spacer layer 82 will be subsequently patterned to act as spacers for forming self-aligned source/drain regions. In FIGS. 16A through 16C, the first spacer layer 80 is formed on top surfaces of the STI regions 68; top surfaces and sidewalls of the fins 66, the nanostructures 55, and the masks 78; and sidewalls of the dummy gates 76 and the dummy gate dielectric 71. The second spacer layer 82 is deposited over the first spacer layer 80. The first spacer layer 80 may be formed of silicon oxide, silicon nitride, silicon oxynitride, or the like, using techniques such as thermal oxidation or deposited by CVD, ALD, or the like. The second spacer layer 82 may be formed of a material having a different etch rate than the material of the first spacer layer 80, such as silicon oxide, silicon nitride, silicon oxynitride, or the like, and may be deposited by CVD, ALD, or the like.

After the first spacer layer 80 is formed and prior to forming the second spacer layer 82, implants for lightly doped source/drain (LDD) regions (not separately illustrated) may be performed. In embodiments with different device types, similar to the implants discussed above in FIG. 13, a mask, such as a photoresist, may be formed over the n-type region 50N, while exposing the p-type region 50P, and appropriate type (e.g., p-type) impurities may be implanted into the exposed fins 66 and nanostructures 55 in the p-type region 50P. The mask may then be removed. Subsequently, a mask, such as a photoresist, may be formed over the p-type region 50P while exposing the n-type region 50N, and appropriate type impurities (e.g., n-type) may be implanted into the exposed fins 66 and nanostructures 55 in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from about $1\times10^{15}$ atoms/cm$^3$ to about $1\times10^{19}$ atoms/cm$^3$. An anneal may be used to repair implant damage and to activate the implanted impurities.

Figure 17A:
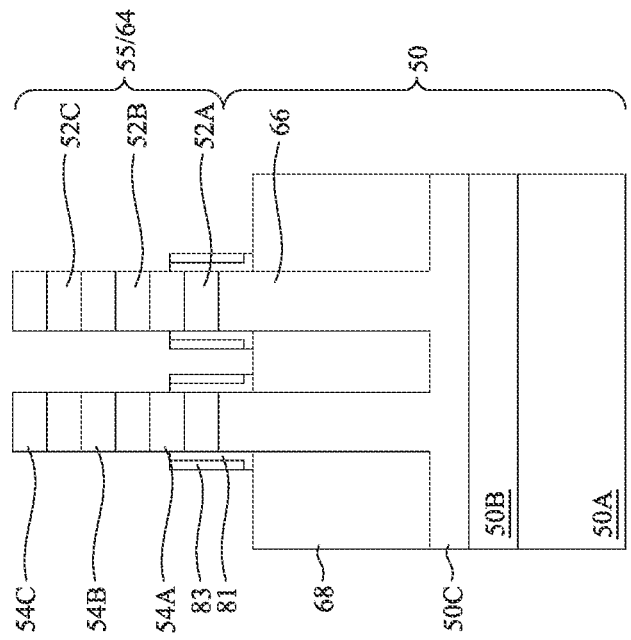
Figure 17B:
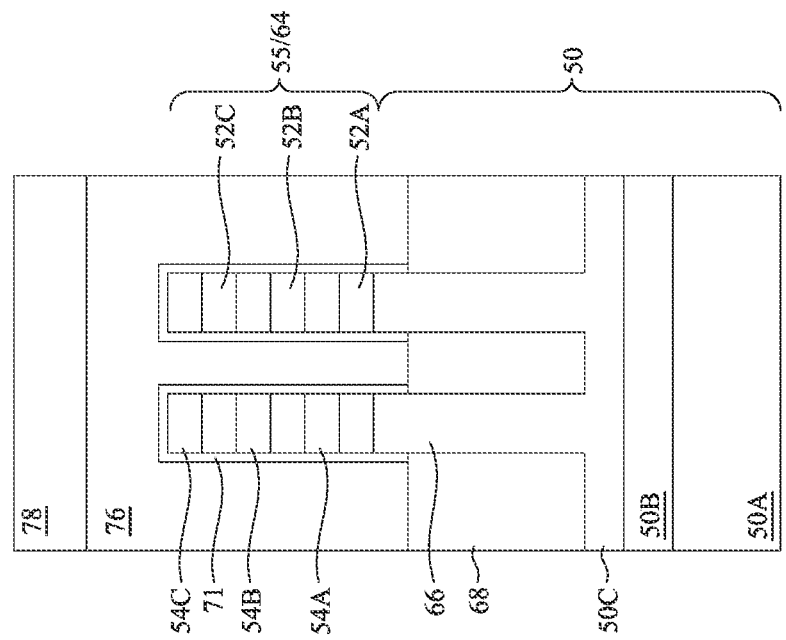
Figure 17C:
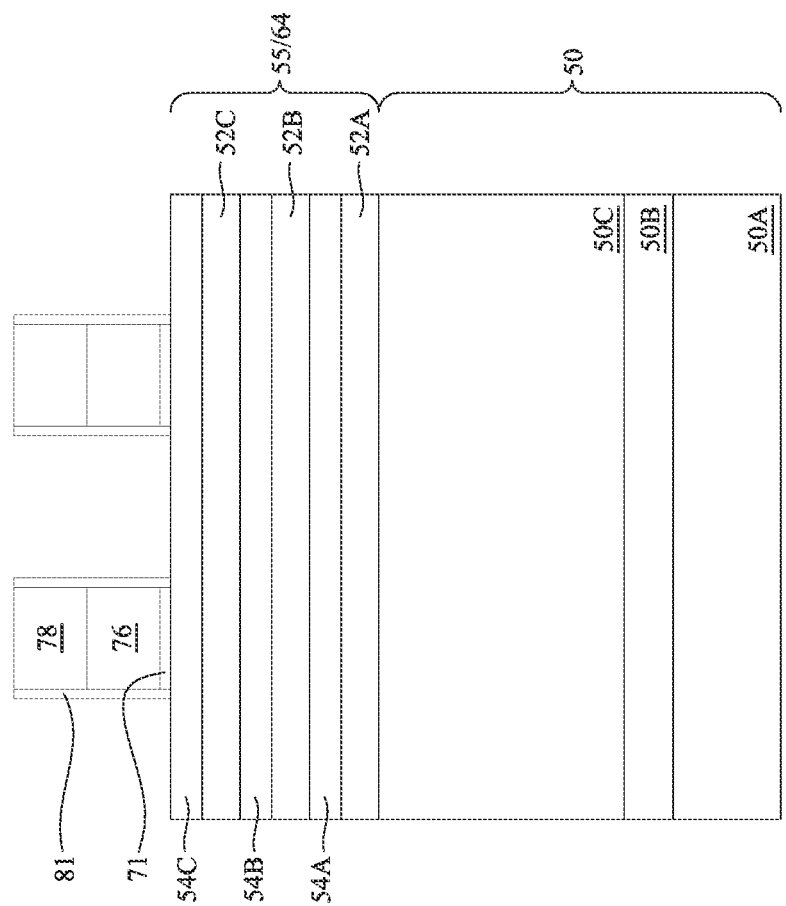

In FIGS. 17A through 17C, the first spacer layer 80 and the second spacer layer 82 are etched to form first spacers 81 and second spacers 83. As will be discussed in greater detail below, the first spacers 81 and the second spacers 83 act to self-align subsequently formed source drain regions, as well as to protect sidewalls of the fins 66 and/or nanostructure 55 during subsequent processing. The first spacer layer 80 and the second spacer layer 82 may be etched using a suitable etching process, such as an isotropic etching process (e.g., a wet etching process), an anisotropic etching process (e.g., a dry etching process), or the like. In some embodiments, the material of the second spacer layer 82 has a different etch rate than the material of the first spacer layer 80, such that the first spacer layer 80 may act as an etch stop layer when patterning the second spacer layer 82 and such that the second spacer layer 82 may act as a mask when patterning the first spacer layer 80. For example, the second spacer layer 82 may be etched using an anisotropic etch process wherein the first spacer layer 80 acts as an etch stop layer, wherein remaining portions of the second spacer layer 82 form second spacers 83 as illustrated in FIG. 17B. Thereafter, the second spacers 83 acts as a mask while etching exposed portions of the first spacer layer 80, thereby forming first spacers 81 as illustrated in FIGS. 18B and 18C.

As illustrated in FIG. 17B, the first spacers 81 and the second spacers 83 are disposed on sidewalls of the fins 66 and/or nanostructures 55. As illustrated in FIG. 17C, in some embodiments, the second spacer layer 82 may be removed from over the first spacer layer 80 adjacent the masks 78, the dummy gates 76, and the dummy gate dielectrics 71, and the first spacers 81 are disposed on sidewalls of the masks 78, the dummy gates 76, and the dummy gate dielectrics 60. In other embodiments, a portion of the second spacer layer 82 may remain over the first spacer layer 80 adjacent the masks 78, the dummy gates 76, and the dummy gate dielectrics 71.

It is noted that the above disclosure generally describes a process of forming spacers and LDD regions. Other processes and sequences may be used. For example, fewer or additional spacers may be utilized, different sequence of steps may be utilized (e.g., the first spacers 81 may be patterned prior to depositing the second spacer layer 82), additional spacers may be formed and removed, and/or the like. Furthermore, the n-type and p-type devices may be formed using different structures and steps.

Figure 18B:
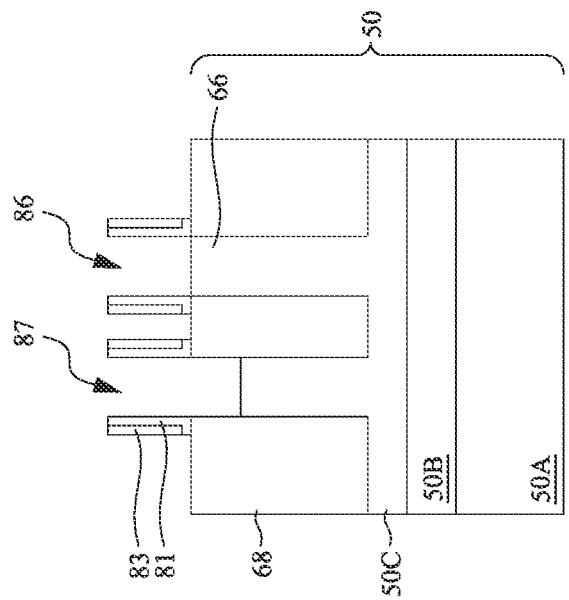
Figure 18A:
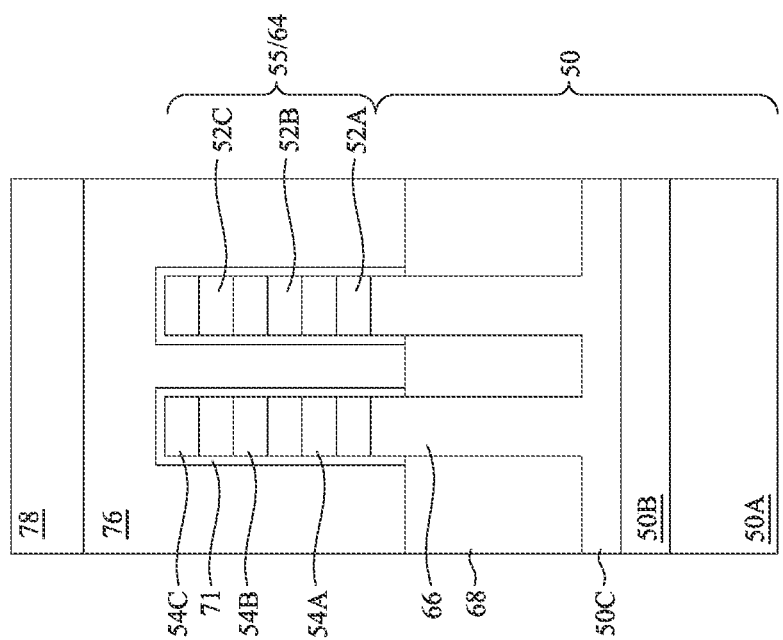
Figure 18C:
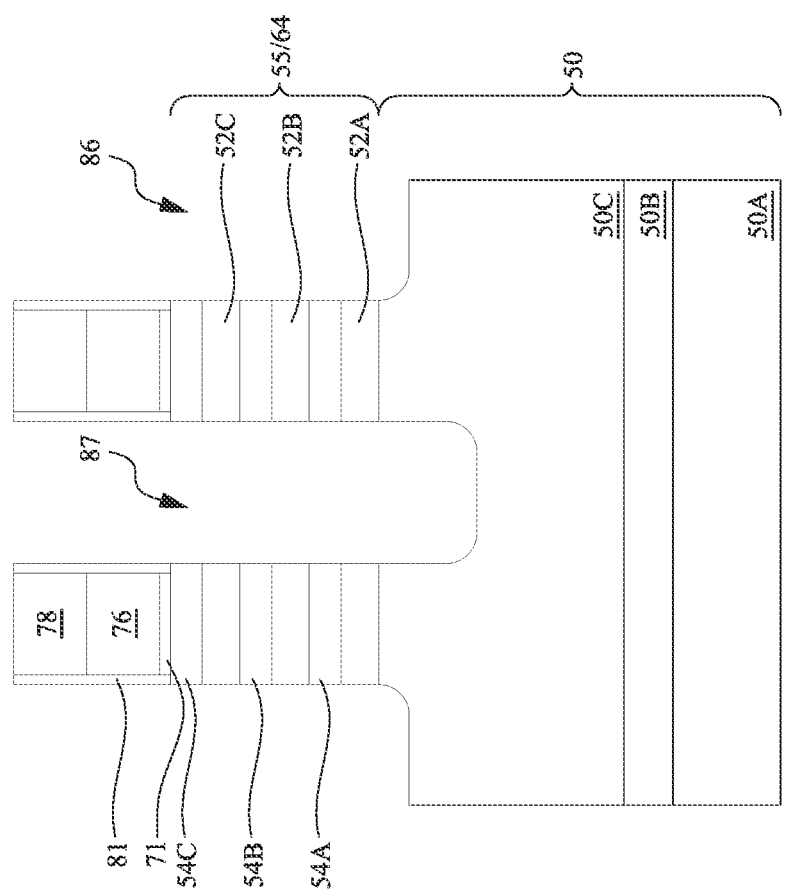

In FIGS. 18A through 18C, first recesses 86 and second recesses 87 are formed in the fins 66, the nanostructures 55, and the wafer 50C, in accordance with some embodiments. Epitaxial source/drain regions will be subsequently formed in the first recesses 86 and first epitaxial materials and epitaxial source/drain regions will be subsequently formed in the second recesses 87. The first recesses 86 and the second recesses 87 may extend through the first nanostructures 52 and the second nanostructures 54, and into the wafer 50C. As illustrated in FIG. 18B, top surfaces of the STI regions 58 may be level with bottom surfaces of the first recesses 86. In various embodiments, the fins 66 may be etched such that bottom surfaces of the first recesses 86 are disposed below the top surfaces of the STI regions 68 or the like. Bottom surfaces of the second recesses 87 may be disposed below the bottom surfaces of the first recesses 86 and the top surfaces of the STI regions 68. The first recesses 86 and the second recesses 87 may be formed by etching the fins 66, the nanostructures 55, and the wafer 50C using anisotropic etching processes, such as RIE, NBE, or the like. The first spacers 81, the second spacers 83, and the masks 78 mask portions of the fins 66, the nanostructures 55, and the wafer 50C during the etching processes used to form the first recesses 86 and the second recesses 87. A single etch process or multiple etch processes may be used to etch each layer of the nanostructures 55, the fins 66, and/or the wafer 50C. Timed etch processes may be used to stop the etching after the first recesses 86 and the second recesses 87 reach desired depths. The second recesses 87 may be etched by the same processes used to etch the first recesses 86 and an additional etch process before or after the first recesses 86 are etched. In some embodiments, regions corresponding to the first recesses 86 may be masked while the additional etch process for the second recesses 87 is performed.

Figure 18E:
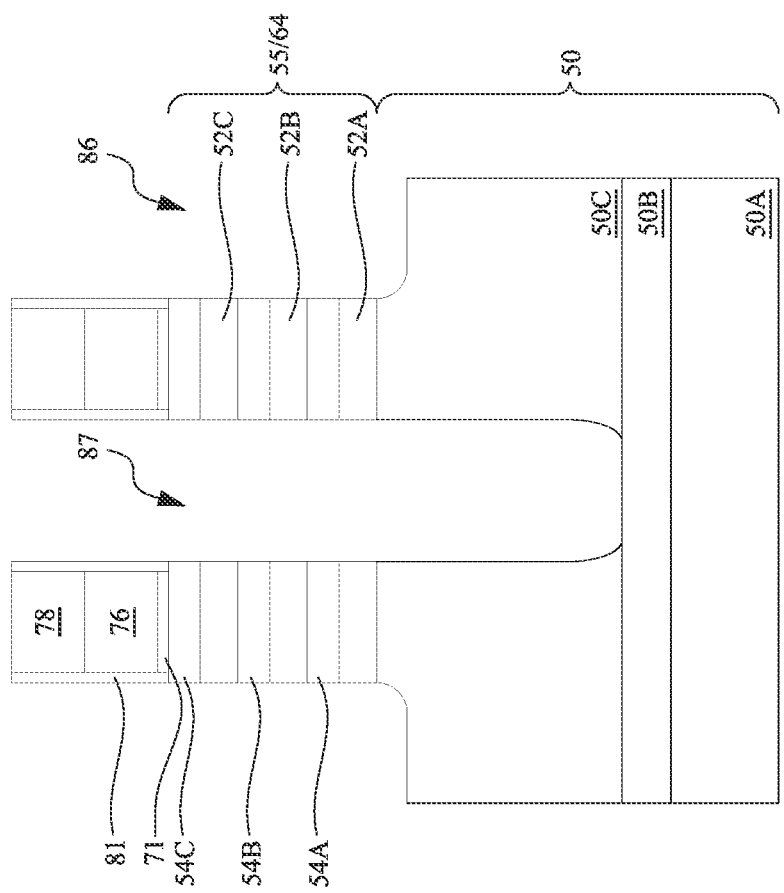
Figure 18D:
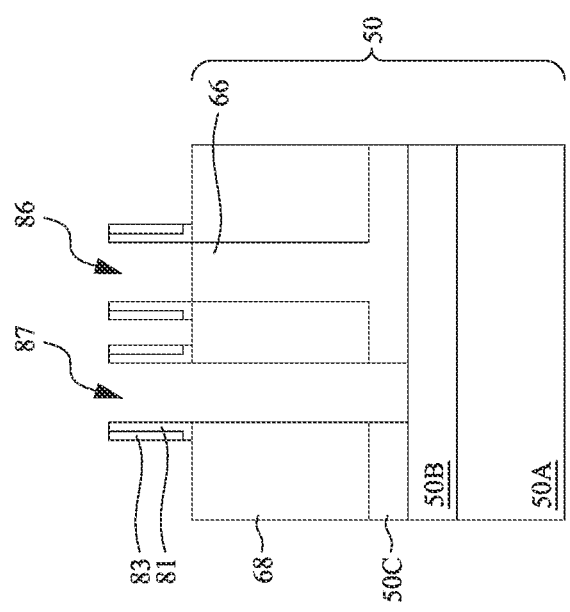

In some embodiments, as illustrated in accordance with FIGS. 18D and 18E, the second recesses 87 extend through the wafer 50C to a top surface of the film 50B. Forming the second recesses 87 to extend to the top surface of the film 50B may be advantageous for subsequent processes that remove the wafer 50A and the film 50B (see FIGS. 32A-C) to expose epitaxial materials subsequently formed in the second recesses 87 (see below, FIGS. 21F and 21G). In some embodiments, the second recesses 87 extend below a top surface of the film 50B. In some embodiments, a portion of the wafer 50C remains between the bottom surface of the second recesses 87 and the top surface of the film 50B.

Figure 19B:
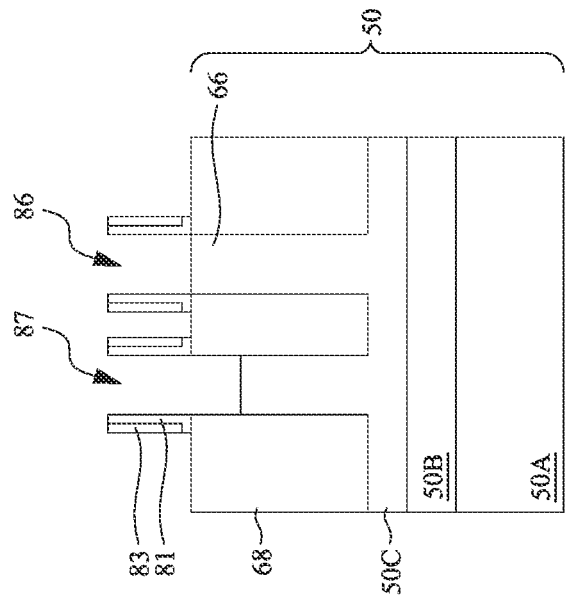
Figure 19A:
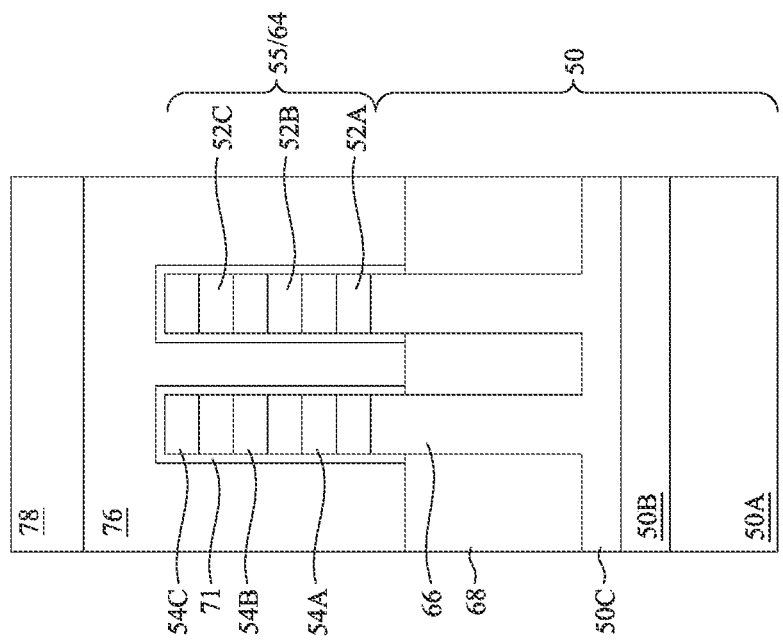
Figure 19C:
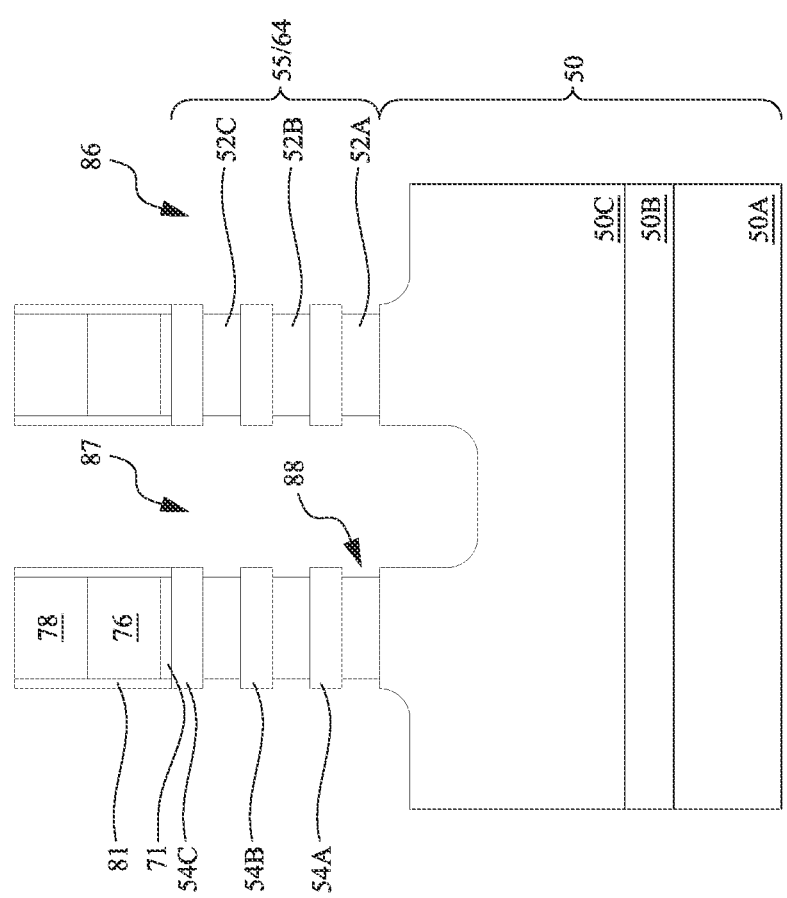

In FIGS. 19A through 19C, portions of sidewalls of the layers of the multi-layer stack 64 formed of the first semiconductor materials (e.g., the first nanostructures 52) exposed by the first recesses 86 and the second recesses 87 are etched to form sidewall recesses 88. Although sidewalls of the first nanostructures 52 adjacent the sidewall recesses 88 are illustrated as being straight in FIG. 19C, the sidewalls may be concave or convex. The sidewalls may be etched using isotropic etching processes, such as wet etching or the like. In an embodiment in which the first nanostructures 52 include, e.g., SiGe, and the second nanostructures 54 include, e.g., Si or SiC, a dry etch process with tetramethylammonium hydroxide (TMAH), ammonium hydroxide (NH$_4$OH), or the like may be used to etch sidewalls of the first nanostructures 52.

In FIGS. 20A through 20D, first inner spacers 90 are formed in the sidewall recess 88. The first inner spacers 90 may be formed by depositing an inner spacer layer (not separately illustrated) over the structures illustrated in FIGS. 19A through 19C. The first inner spacers 90 act as isolation features between subsequently formed source/drain regions and a gate structure. As will be discussed in greater detail below, source/drain regions and epitaxial materials will be formed in the first recesses 86 and the second recesses 87, while the first nanostructures 52 will be replaced with corresponding gate structures.

The inner spacer layer may be deposited by a conformal deposition process, such as CVD, ALD, or the like. The inner spacer layer may comprise a material such as silicon nitride or silicon oxynitride, although any suitable material, such as low-dielectric constant (low-k) materials having a k-value less than about 3.5, may be utilized. The inner spacer layer may then be anisotropically etched to form the first inner spacers 90. Although outer sidewalls of the first inner spacers 90 are illustrated as being flush with sidewalls of the second nanostructures 54, the outer sidewalls of the first inner spacers 90 may extend beyond or be recessed from sidewalls of the second nanostructures 54.

Figure 20B:
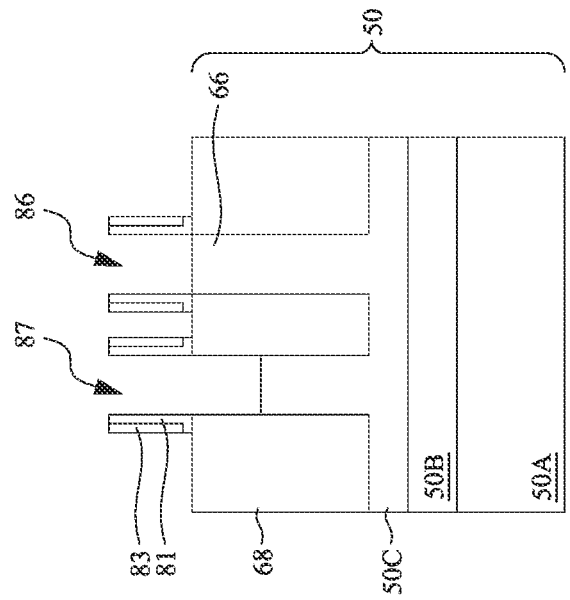
Figure 20A:
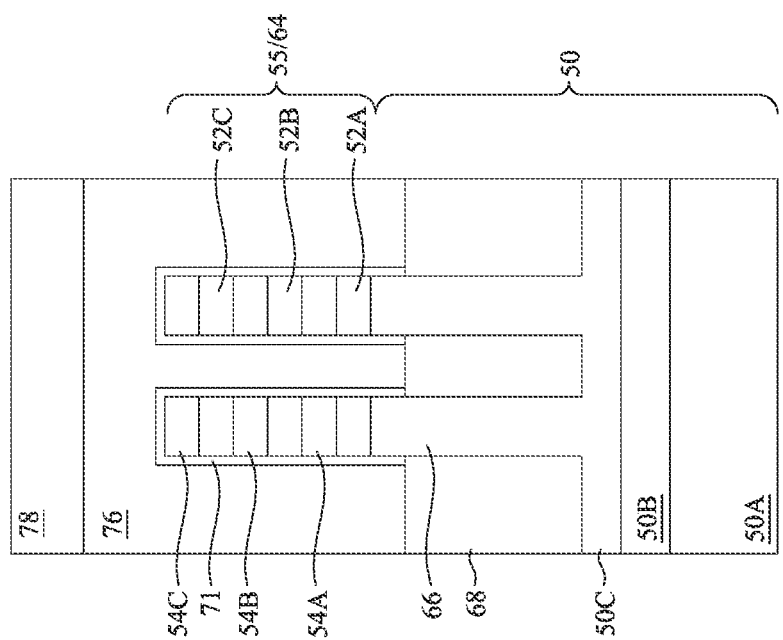
Figure 20C:
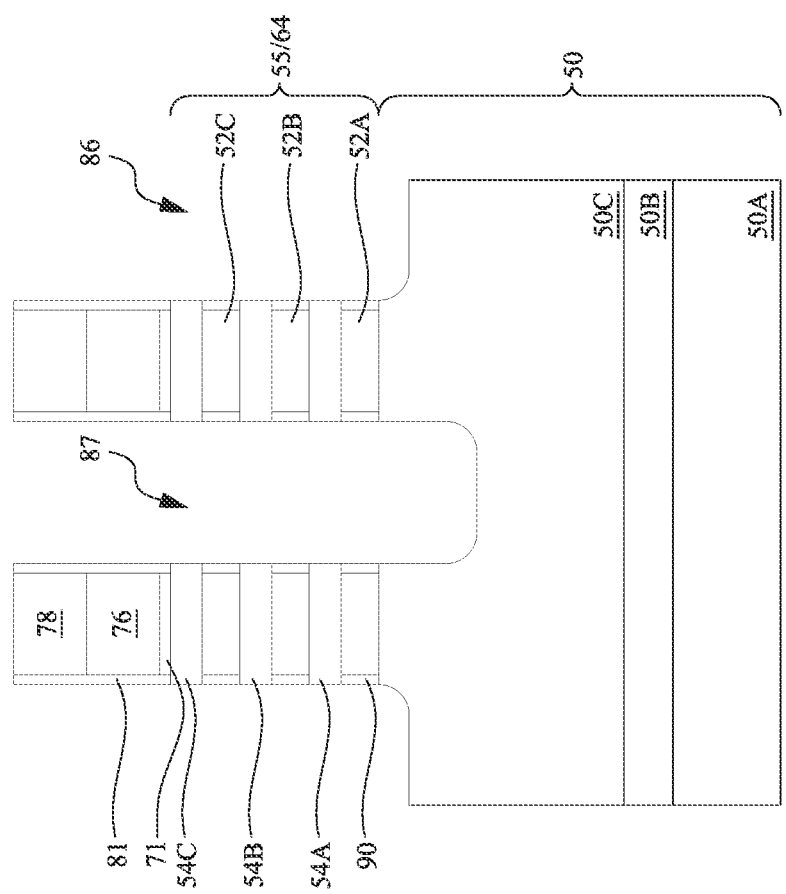
Figure 20D:
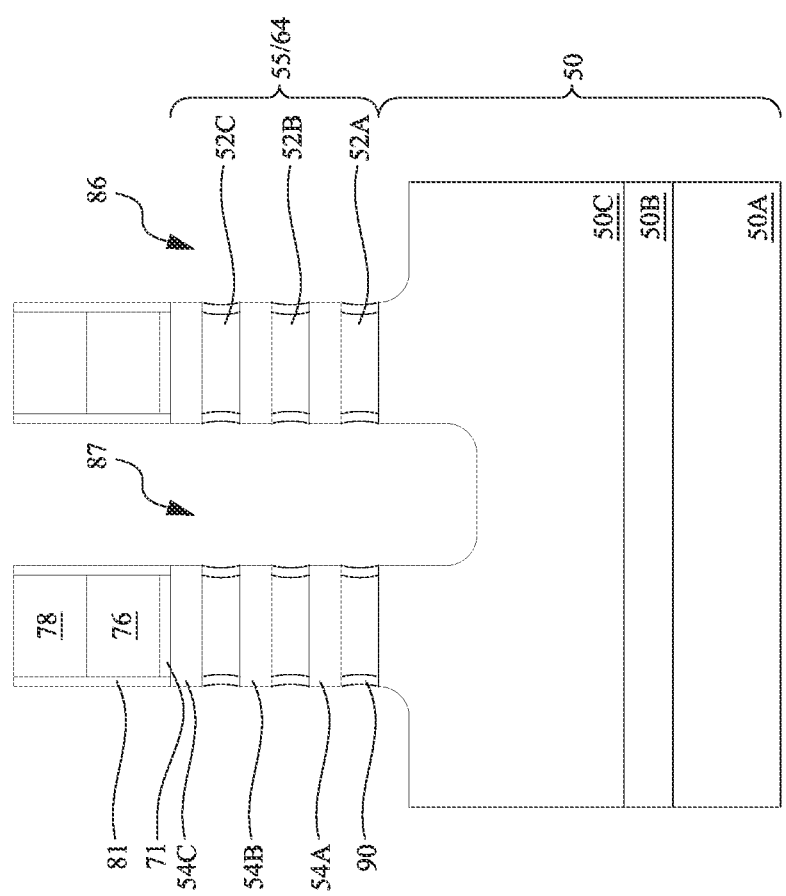

Moreover, although the outer sidewalls of the first inner spacers 90 are illustrated as being straight in FIG. 20C, the outer sidewalls of the first inner spacers 90 may be concave or convex. As an example, FIG. 20D illustrates an embodiment in which sidewalls of the first nanostructures 52 are concave, outer sidewalls of the first inner spacers 90 are concave, and the first inner spacers 90 are recessed from sidewalls of the second nanostructures 54. The inner spacer layer may be etched by an anisotropic etching process, such as RIE, NBE, or the like. The first inner spacers 90 may be used to prevent damage to subsequently formed source/drain regions (such as the epitaxial source/drain regions 92, discussed below with respect to FIGS. 21A through 21E) by subsequent etching processes, such as etching processes used to form gate structures.

In FIGS. 21A through 21E, first epitaxial materials 91, also referred to as dummy semiconductor regions 91, are formed in the second recesses 87 and epitaxial source/drain regions 92 are formed in the first recesses 86 and the second recesses 87. In some embodiments, the first epitaxial materials 91 may be sacrificial materials, which are subsequently removed to form backside vias (such as the backside vias 130, discussed below with respect to FIGS. 35A through 35D). As illustrated in FIGS. 21B through 21E, top surfaces of the first epitaxial materials 91 may be level with bottom surfaces of the first recesses 86. However, in some embodiments, top surfaces of the first epitaxial materials 91 may be disposed above or below bottom surfaces of the first recesses 86. The first epitaxial materials 91 may be epitaxially grown in the second recesses 87 using a process such as chemical vapor deposition (CVD), atomic layer deposition (ALD), vapor phase epitaxy (VPE), molecular beam epitaxy (MBE), or the like. The first epitaxial materials 91 may include any acceptable material, such as silicon germanium or the like. The first epitaxial materials 91 may be formed of materials having high etch selectivity to materials of the epitaxial source/drain regions 92, the wafer 50C, and dielectric layers (such as the STI regions 68 and second dielectric layers 125, discussed below with respect to FIGS. 33A through 33C). As such, the first epitaxial materials 91 may be removed and replaced with the backside vias without significantly removing the epitaxial source/drain regions 92 and the dielectric layers.

Figure 21B:
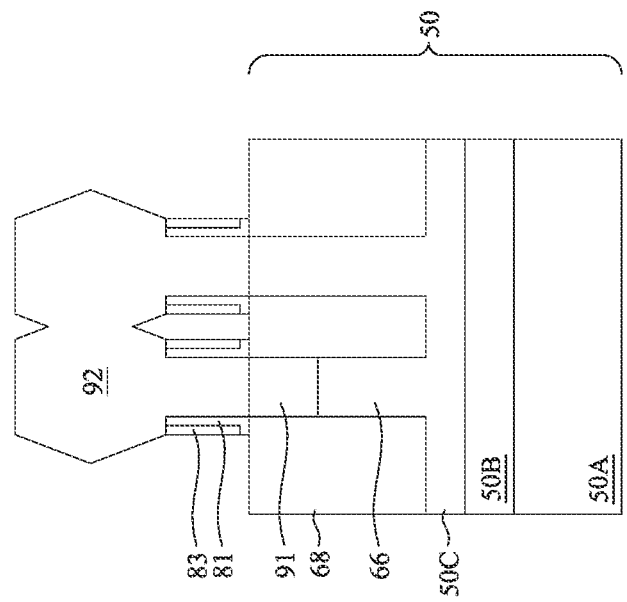

The epitaxial source/drain regions 92 are then formed in the first recesses 86 and over the first epitaxial materials 91 in the second recesses 87. In some embodiments, the epitaxial source/drain regions 92 may exert stress on the second nanostructures 54, thereby improving performance. As illustrated in FIG. 21C, the epitaxial source/drain regions 92 are formed in the first recesses 86 and the second recesses 87 such that each dummy gate 76 is disposed between respective neighboring pairs of the epitaxial source/drain regions 92. In some embodiments, the first spacers 81 are used to separate the epitaxial source/drain regions 92 from the dummy gates 76 and the first inner spacers 90 are used to separate the epitaxial source/drain regions 92 from the nanostructures 55 by an appropriate lateral distance so that the epitaxial source/drain regions 92 do not short out with subsequently formed gates of the resulting nano-FETs.

The epitaxial source/drain regions 92 in the n-type region 50N, e.g., the NMOS region, may be formed by masking the p-type region 50P, e.g., the PMOS region. Then, the epitaxial source/drain regions 92 are epitaxially grown in the first recesses 86 and the second recesses 87 in the n-type region 50N. The epitaxial source/drain regions 92 may include any acceptable material appropriate for n-type nano-FETs. For example, if the second nanostructures 54 are silicon, the epitaxial source/drain regions 92 may include materials exerting a tensile strain on the second nanostructures 54, such as silicon, silicon carbide, phosphorous doped silicon carbide, silicon phosphide, or the like. The epitaxial source/drain regions 92 may have surfaces raised from respective upper surfaces of the nanostructures 55 and may have facets.

The epitaxial source/drain regions 92 in the p-type region 50P, e.g., the PMOS region, may be formed by masking the n-type region 50N, e.g., the NMOS region. Then, the epitaxial source/drain regions 92 are epitaxially grown in the first recesses 86 and the second recesses 87 in the p-type region 50P. The epitaxial source/drain regions 92 may include any acceptable material appropriate for p-type nano-FETs. For example, if the first nanostructures 52 are silicon germanium, the epitaxial source/drain regions 92 may comprise materials exerting a compressive strain on the first nanostructures 52, such as silicon-germanium, boron doped silicon-germanium, germanium, germanium tin, or the like. The epitaxial source/drain regions 92 may also have surfaces raised from respective surfaces of the multi-layer stack 56 and may have facets.

The epitaxial source/drain regions 92, the first nanostructures 52, the second nanostructures 54, and/or the wafer 50C may be implanted with dopants to form source/drain regions, similar to the process previously discussed for forming lightly-doped source/drain regions, followed by an anneal. The source/drain regions may have an impurity concentration of between about $1\times10^{19}$ atoms/cm$^3$ and about $1\times10^{21}$ atoms/cm$^3$. The n-type and/or p-type impurities for source/drain regions may be any of the impurities previously discussed. In some embodiments, the epitaxial source/drain regions 92 may be in situ doped during growth.

As a result of the epitaxy processes used to form the epitaxial source/drain regions 92 in the n-type region 50N and the p-type region 50P, upper surfaces of the epitaxial source/drain regions 92 have facets which expand laterally outward beyond sidewalls of the nanostructures 55. In some embodiments, these facets cause adjacent epitaxial source/drain regions 92 of a same nano-FET to merge as illustrated by FIG. 21B. In other embodiments, adjacent epitaxial source/drain regions 92 remain separated after the epitaxy process is completed as illustrated by FIG. 21D. In the embodiments illustrated in FIGS. 21B and 21D, the first spacers 81 may be formed to a top surface of the STI regions 68 thereby blocking the epitaxial growth. In some other embodiments, the first spacers 81 may cover portions of the sidewalls of the nanostructures 55 further blocking the epitaxial growth. In some other embodiments, the spacer etch used to form the first spacers 81 may be adjusted to remove the spacer material to allow the epitaxially grown region to extend to the surface of the STI region 58.

The epitaxial source/drain regions 92 may comprise one or more semiconductor material layers. For example, the epitaxial source/drain regions 92 may comprise a first semiconductor material layer 92A, a second semiconductor material layer 92B, and a third semiconductor material layer 92C. Any number of semiconductor material layers may be used for the epitaxial source/drain regions 92. Each of the first semiconductor material layer 92A, the second semiconductor material layer 92B, and the third semiconductor material layer 92C may be formed of different semiconductor materials and may be doped to different dopant concentrations. In some embodiments, the first semiconductor material layer 92A may have a dopant concentration less than the second semiconductor material layer 92B and greater than the third semiconductor material layer 92C. In embodiments in which the epitaxial source/drain regions 92 comprise three semiconductor material layers, the first semiconductor material layer 92A may be deposited, the second semiconductor material layer 92B may be deposited over the first semiconductor material layer 92A, and the third semiconductor material layer 92C may be deposited over the second semiconductor material layer 92B.

FIG. 21E illustrates an embodiment in which sidewalls of the first nanostructures 52 are concave, outer sidewalls of the first inner spacers 90 are concave, and the first inner spacers 90 are recessed from sidewalls of the second nanostructures 54. As illustrated in FIG. 12E, the epitaxial source/drain regions 92 may be formed in contact with the first inner spacers 90 and may extend past sidewalls of the second nanostructures 54.

Figure 21A:
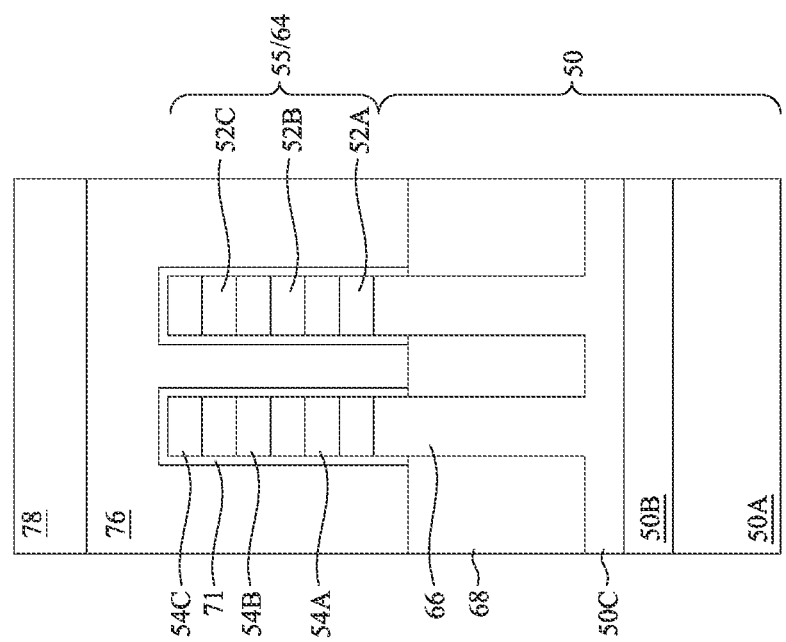
Figure 21D:
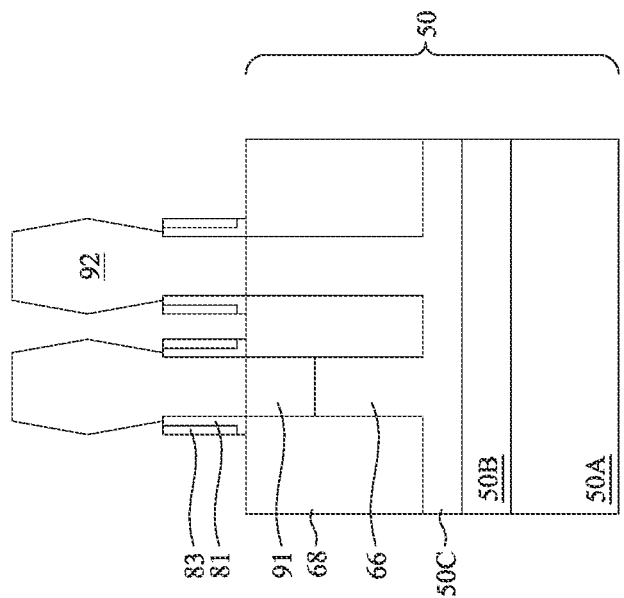
Figure 21C:
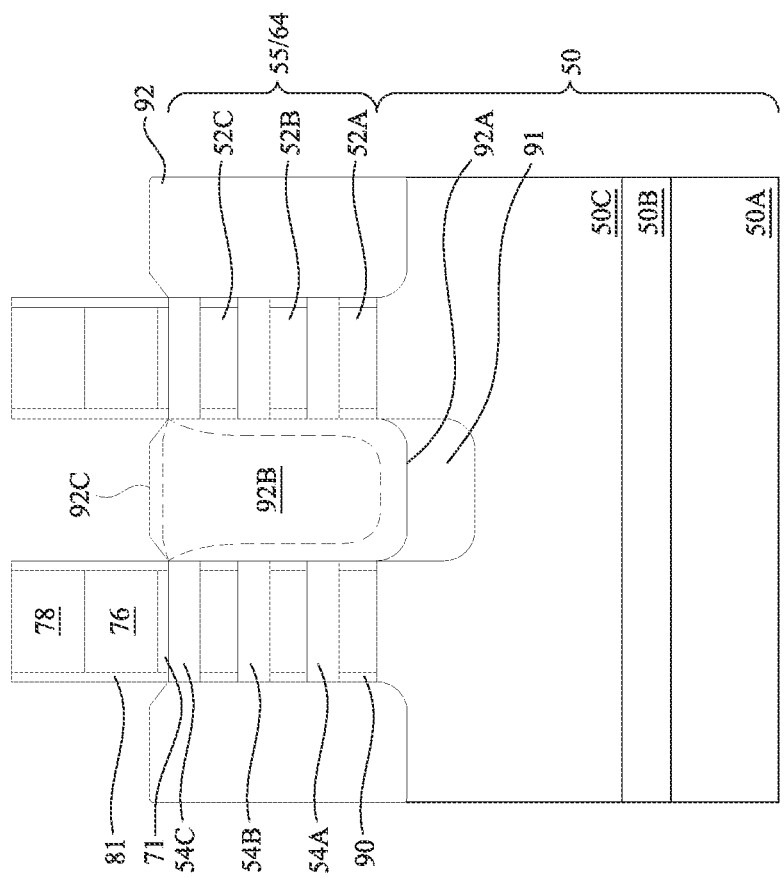
Figure 21G:
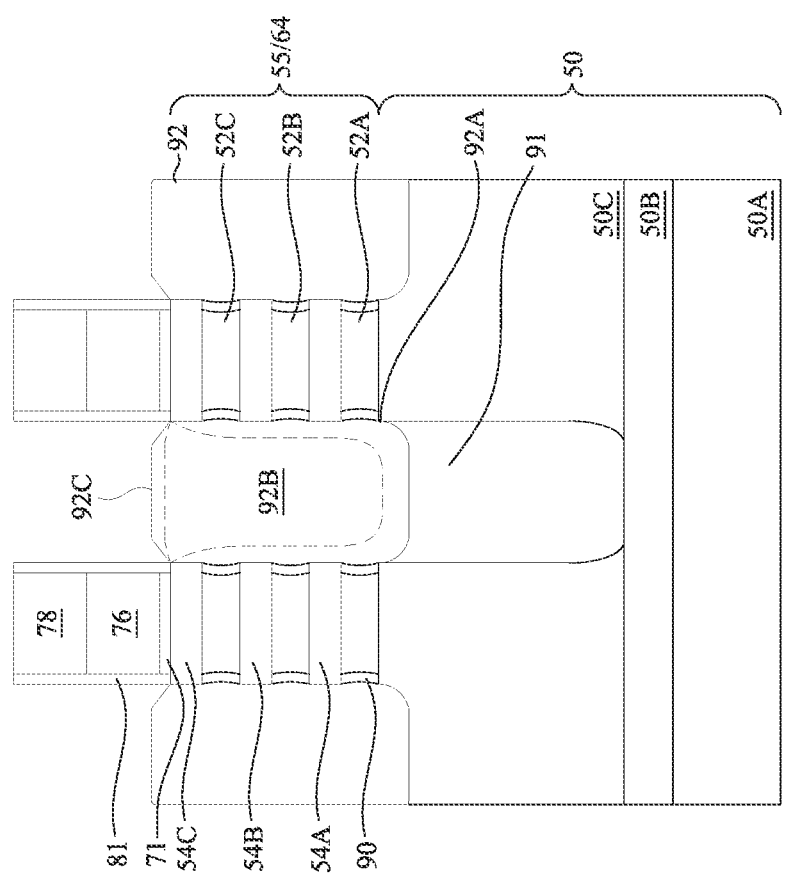
Figure 21F:
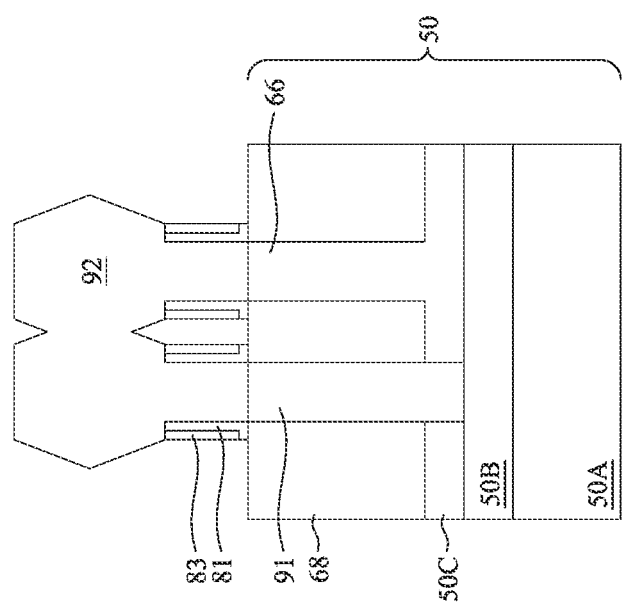

In some embodiments following from FIGS. 18D and 18E, as illustrated in accordance with FIGS. 21F and 21G, the first epitaxial materials 91 or dummy semiconductor regions 91 extend through the wafer 50C to a top surface of the film 50B. Forming the dummy semiconductor regions 91 to extend to the top surface of the film 50B may be advantageous for subsequent processes that remove the wafer 50A and the film 50B to expose the dummy semiconductor regions 91 (see below, FIGS. 32A-C). In some embodiments, the dummy semiconductor regions 91 extend below a top surface of the film 50B. In some embodiments, a portion of the wafer 50C remains between the bottom surface of the dummy semiconductor regions 91 and the top surface of the film 50B.

Figure 22B:
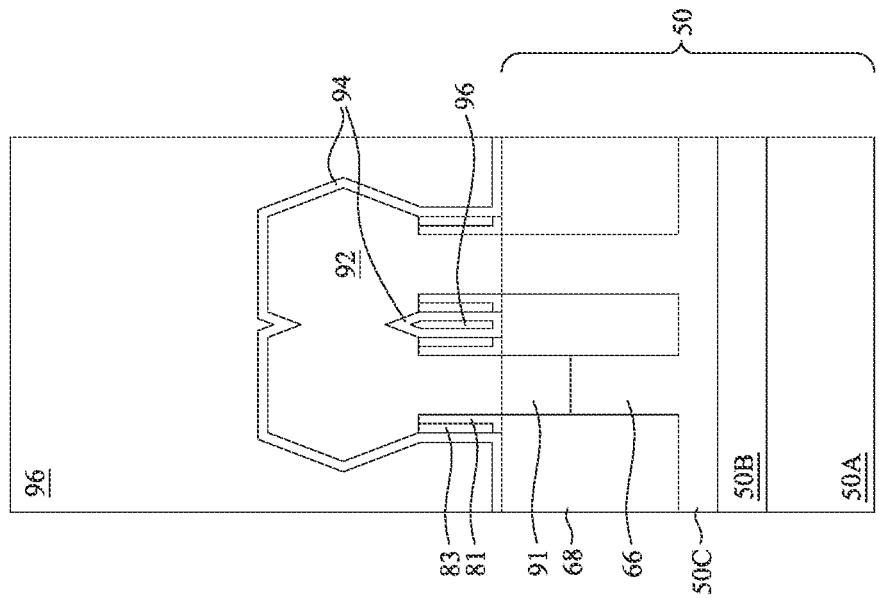
Figure 22A:
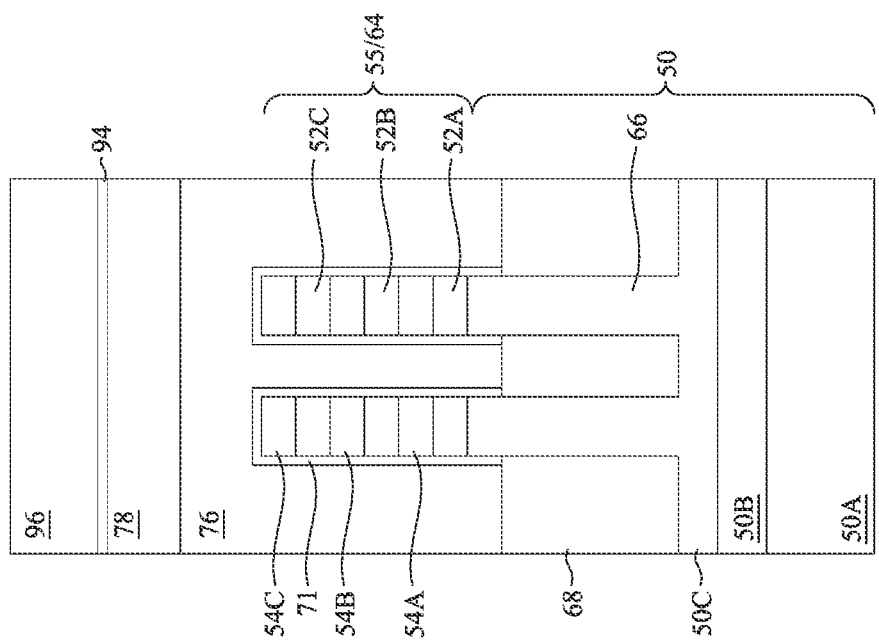
Figure 22C:
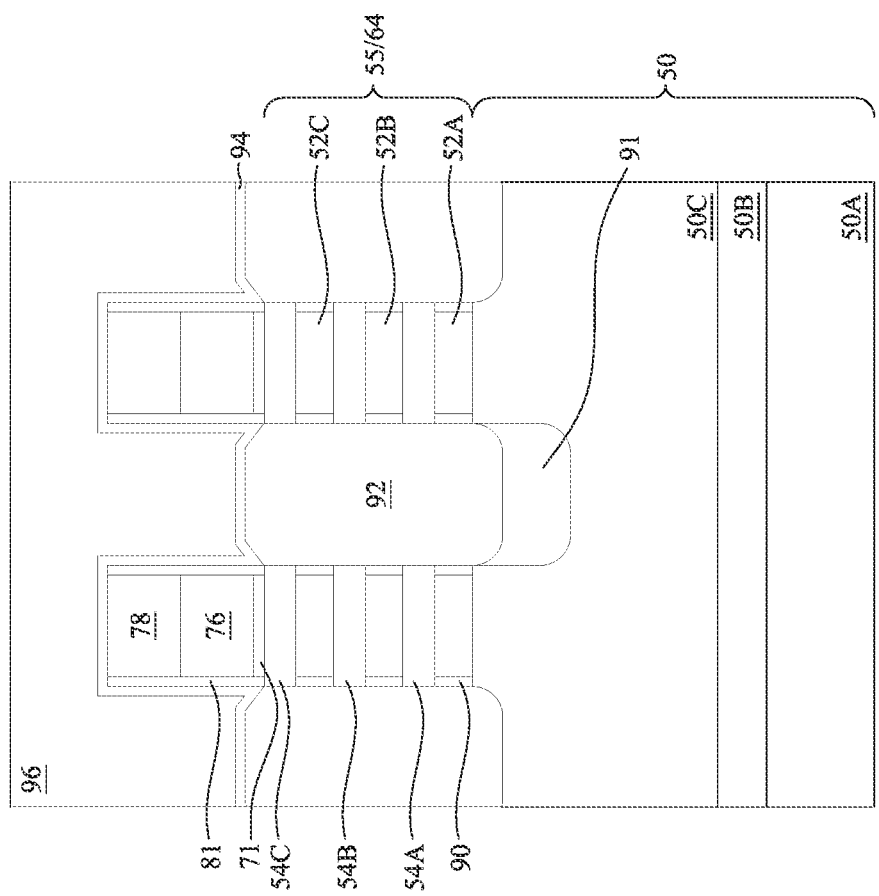

In FIGS. 22A through 22C, a first interlayer dielectric (ILD) 96 is deposited over the structure illustrated in FIGS. 21A through 21C. The first ILD 96 may be formed of a dielectric material, and may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 94 is disposed between the first ILD 96 and the epitaxial source/drain regions 92, the masks 78, and the first spacers 81. The CESL 94 may comprise a dielectric material, such as, silicon nitride, silicon oxide, silicon oxynitride, or the like, having a different etch rate than the material of the overlying first ILD 96.

Figure 23B:
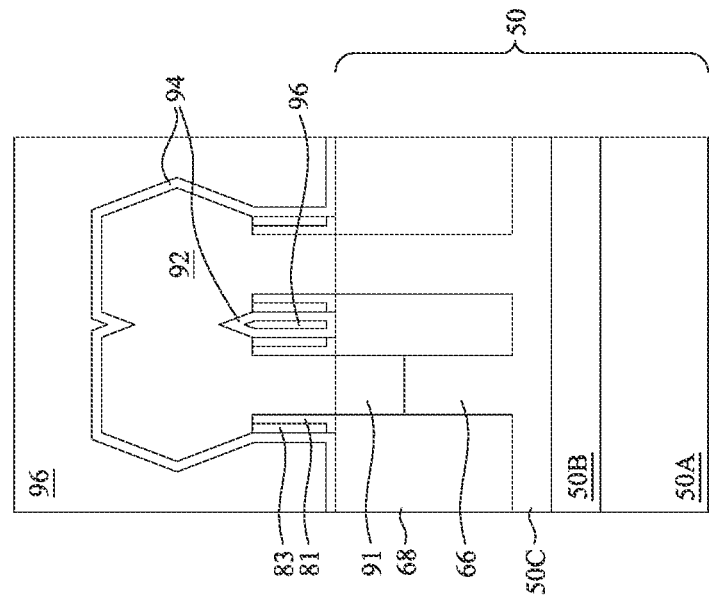
Figure 23A:
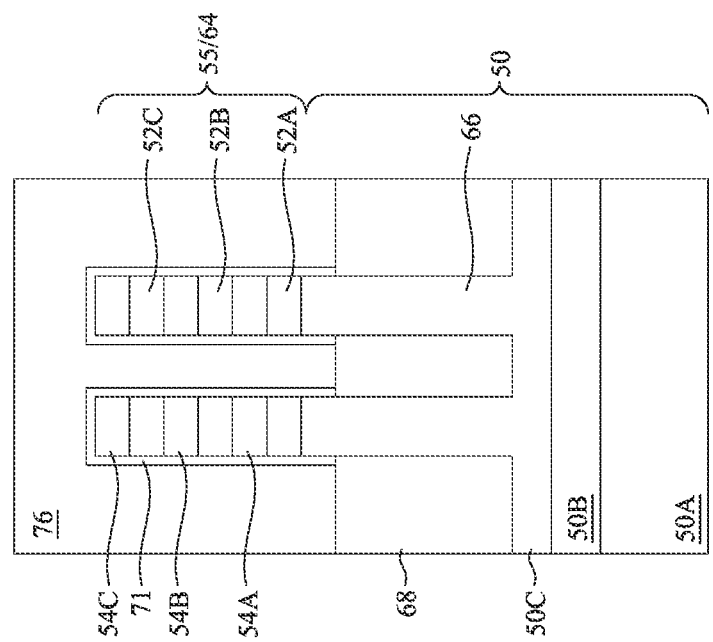
Figure 23C:
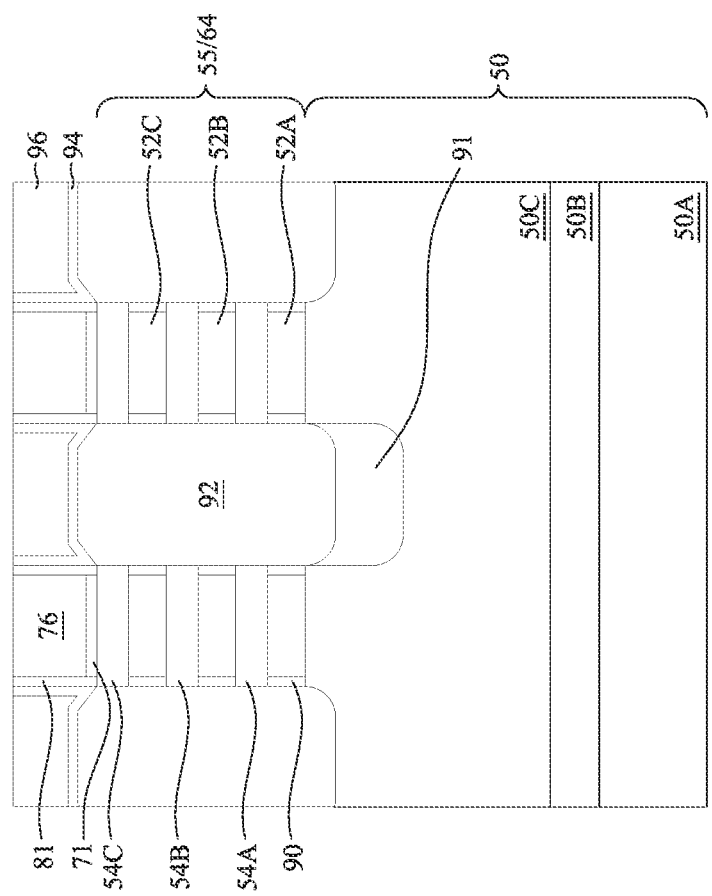

In FIGS. 23A through 23C, a planarization process, such as a CMP, may be performed to level the top surface of the first ILD 96 with the top surfaces of the dummy gates 76 or the masks 78. The planarization process may also remove the masks 78 on the dummy gates 76, and portions of the first spacers 81 along sidewalls of the masks 78. After the planarization process, top surfaces of the dummy gates 76, the first spacers 81, and the first ILD 96 are level within process variations. Accordingly, the top surfaces of the dummy gates 76 are exposed through the first ILD 96. In some embodiments, the masks 78 may remain, in which case the planarization process levels the top surface of the first ILD 96 with top surface of the masks 78 and the first spacers 81.

Figure 24B:
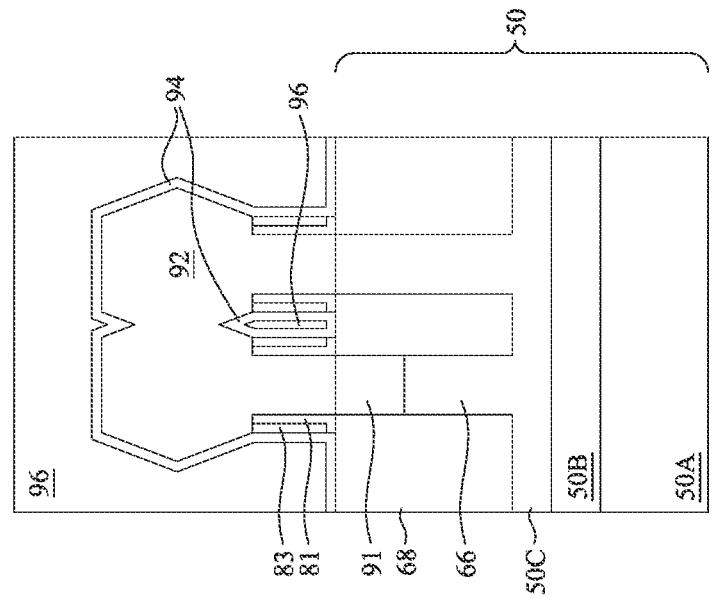
Figure 24A:
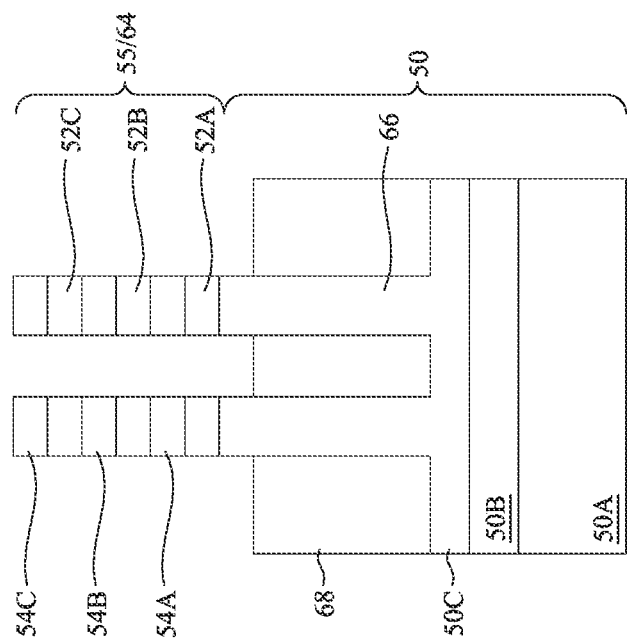
Figure 24C:
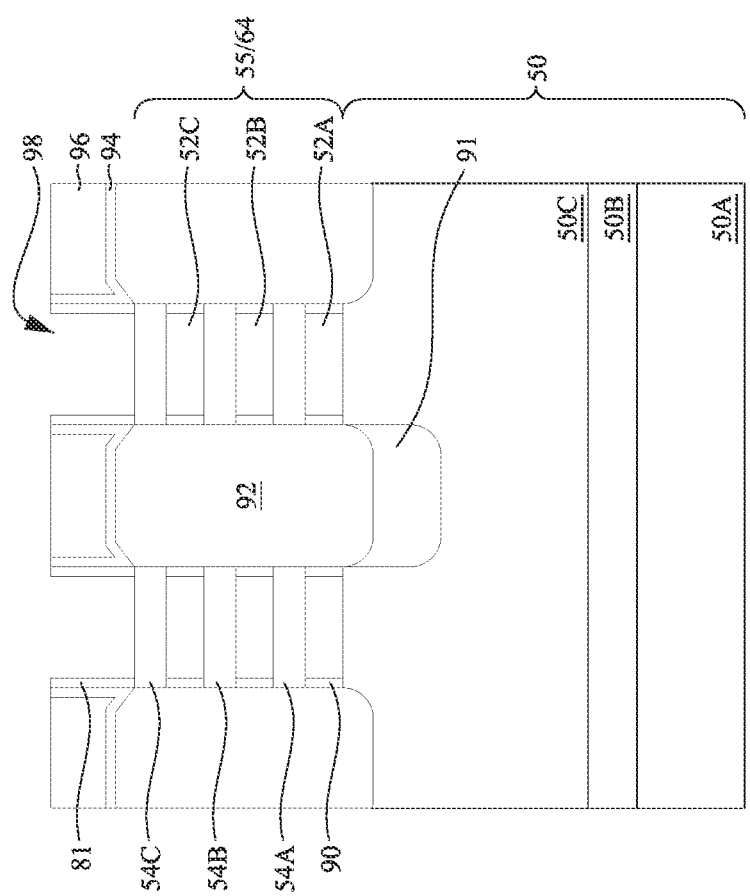

In FIGS. 24A through 24C, the dummy gates 76, and the masks 78 if present, are removed in one or more etching steps, so that third recesses 98 are formed. Portions of the dummy gate dielectrics 60 in the third recesses 98 are also be removed. In some embodiments, the dummy gates 76 and the dummy gate dielectrics 60 are removed by an anisotropic dry etch process. For example, the etching process may include a dry etch process using reaction gas(es) that selectively etch the dummy gates 76 at a faster rate than the first ILD 96 or the first spacers 81. Each of the third recess 98 exposes and/or overlies portions of nanostructures 55, which act as channel regions in subsequently completed nanoFETs. Portions of the nanostructures 55 which act as the channel regions are disposed between neighboring pairs of the epitaxial source/drain regions 92. During the removal, the dummy gate dielectrics 60 may be used as etch stop layers when the dummy gates 76 are etched. The dummy gate dielectrics 60 may then be removed after the removal of the dummy gates 76.

Figure 25B:
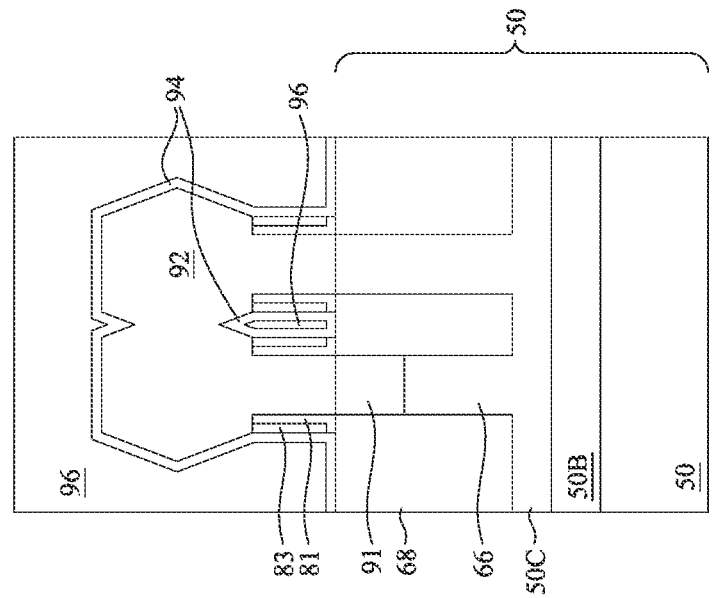
Figure 25A:
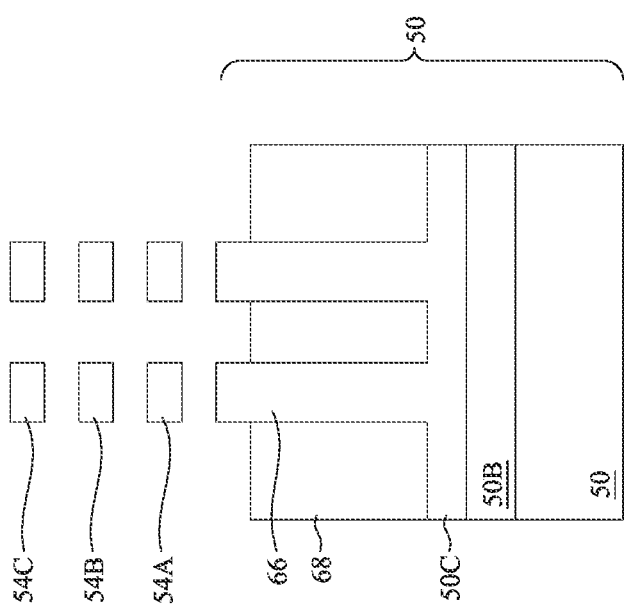
Figure 25C:
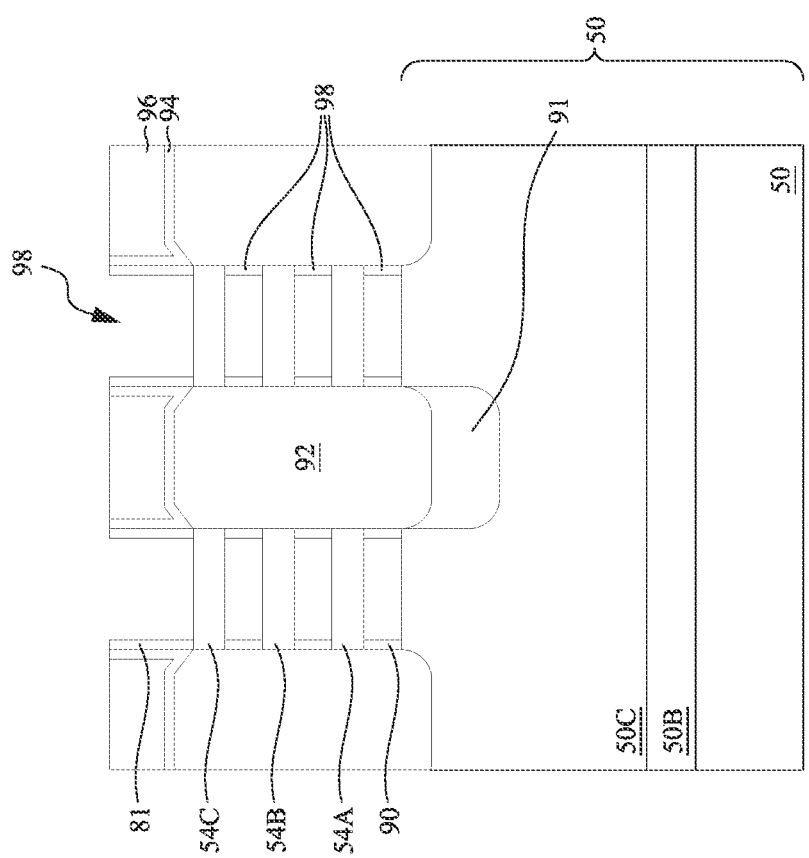

In FIGS. 25A through 25C, the first nanostructures 52 are removed extending the third recesses 98. The first nanostructures 52 may be removed by performing an isotropic etching process such as wet etching or the like using etchants which are selective to the materials of the first nanostructures 52, while the second nanostructures 54, the wafer 50C, the STI regions 58 remain relatively unetched as compared to the first nanostructures 52. In embodiments in which the first nanostructures 52 include, e.g., SiGe, and the second nanostructures 54A-54C include, e.g., Si or SiC, tetramethylammonium hydroxide (TMAH), ammonium hydroxide ($NH_4OH$), or the like may be used to remove the first nanostructures 52.

Figure 26B:
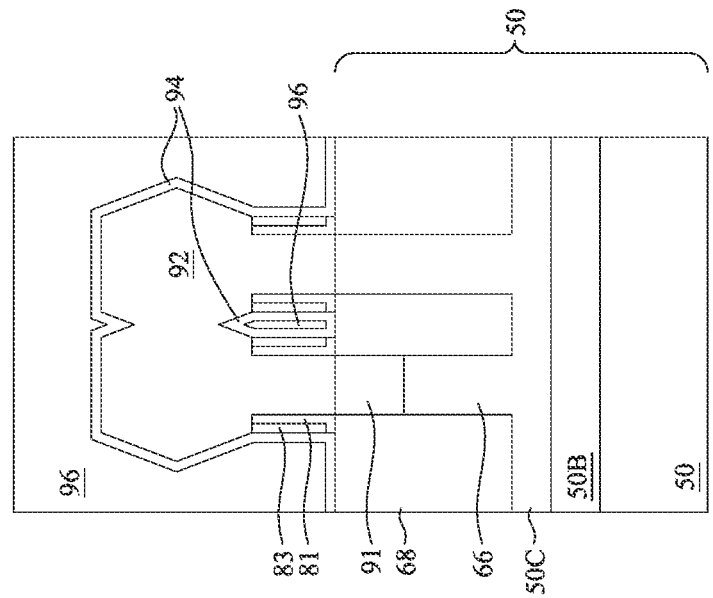
Figure 26A:
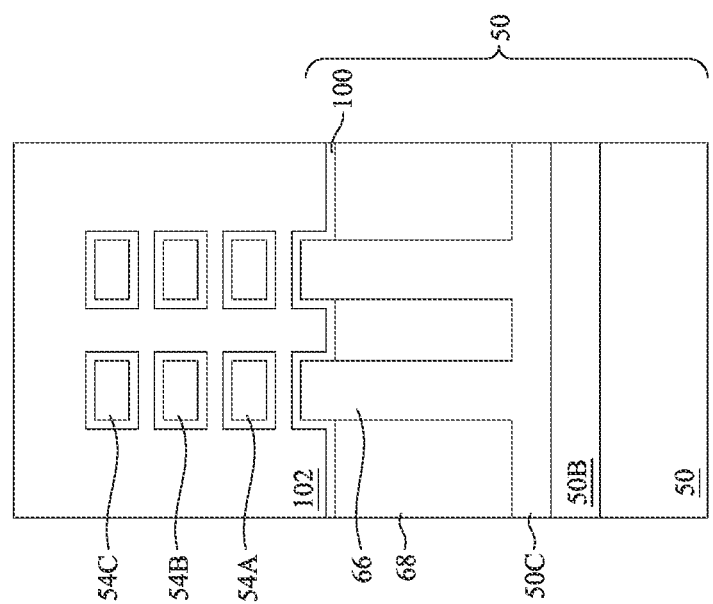
Figure 26C:
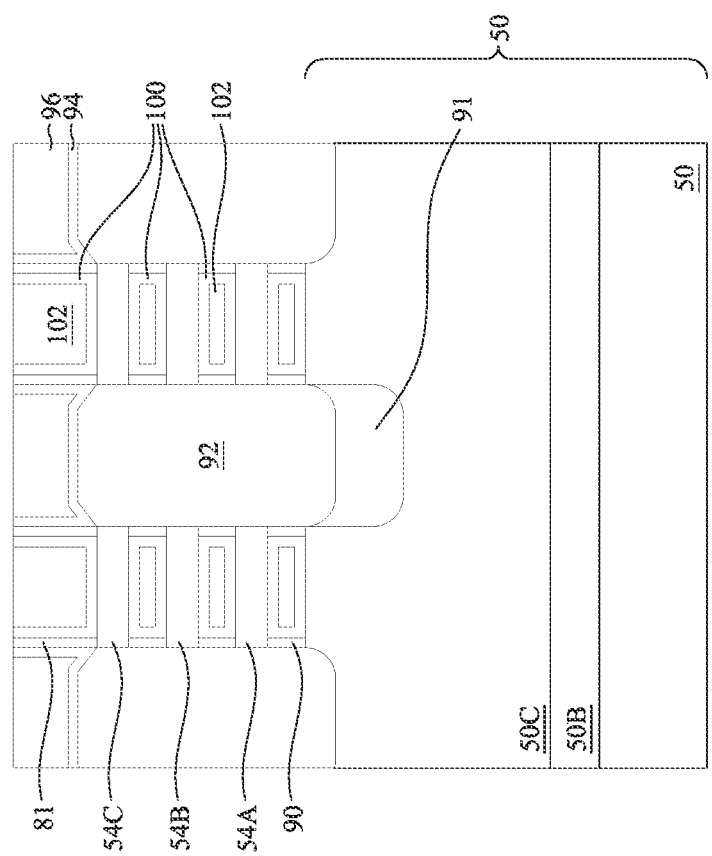

In FIGS. 26A through 26C, gate dielectric layers 100 and gate electrodes 102 are formed for replacement gates. The gate dielectric layers 100 are deposited conformally in the third recesses 98. The gate dielectric layers 100 may be formed on top surfaces and sidewalls of the wafer 50C and on top surfaces, sidewalls, and bottom surfaces of the second nanostructures 54. The gate dielectric layers 100 may also be deposited on top surfaces of the first ILD 96, the CESL 94, the first spacers 81, and the STI regions 68 and on sidewalls of the first spacers 81 and the first inner spacers 90.

In accordance with some embodiments, the gate dielectric layers 100 comprise one or more dielectric layers, such as an oxide, a metal oxide, the like, or combinations thereof. For example, in some embodiments, the gate dielectrics may comprise a silicon oxide layer and a metal oxide layer over the silicon oxide layer. In some embodiments, the gate dielectric layers 100 include a high-k dielectric material, and in these embodiments, the gate dielectric layers 100 may have a k value greater than about 7.0, and may include a metal oxide or a silicate of hafnium, aluminum, zirconium, lanthanum, manganese, barium, titanium, lead, and combinations thereof. The structure of the gate dielectric layers 100 may be the same or different in the n-type region 50N and the p-type region 50P. The formation methods of the gate dielectric layers 100 may include molecular-beam deposition (MBD), ALD, PECVD, and the like.

The gate electrodes 102 are deposited over the gate dielectric layers 100, respectively, and fill the remaining portions of the third recesses 98. The gate electrodes 102 may include a metal-containing material such as titanium nitride, titanium oxide, tantalum nitride, tantalum carbide, cobalt, ruthenium, aluminum, tungsten, combinations thereof, or multi-layers thereof. For example, although single layer gate electrodes 102 are illustrated in FIGS. 26A and 26C, the gate electrodes 102 may comprise any number of liner layers, any number of work function tuning layers, and a fill material. Any combination of the layers which make up the gate electrodes 102 may be deposited in the n-type region 50N between adjacent ones of the second nanostructures 54 and between the second nanostructure 54A and the wafer 50C, and may be deposited in the p-type region 50P between adjacent ones of the first nanostructures 52.

The formation of the gate dielectric layers 100 in the n-type region 50N and the p-type region 50P may occur simultaneously such that the gate dielectric layers 100 in each region are formed from the same materials, and the formation of the gate electrodes 102 may occur simultaneously such that the gate electrodes 102 in each region are formed from the same materials. In some embodiments, the gate dielectric layers 100 in each region may be formed by distinct processes, such that the gate dielectric layers 100 may be different materials and/or have a different number of layers, and/or the gate electrodes 102 in each region may be formed by distinct processes, such that the gate electrodes 102 may be different materials and/or have a different number of layers. Various masking steps may be used to mask and expose appropriate regions when using distinct processes.

After the filling of the third recesses 98, a planarization process, such as a CMP, may be performed to remove the excess portions of the gate dielectric layers 100 and the material of the gate electrodes 102, which excess portions are over the top surface of the first ILD 96. The remaining portions of material of the gate electrodes 102 and the gate dielectric layers 100 thus form replacement gate structures of the resulting nano-FETs. The gate electrodes 102 and the gate dielectric layers 100 may be collectively referred to as "gate structures."

Figure 27B:
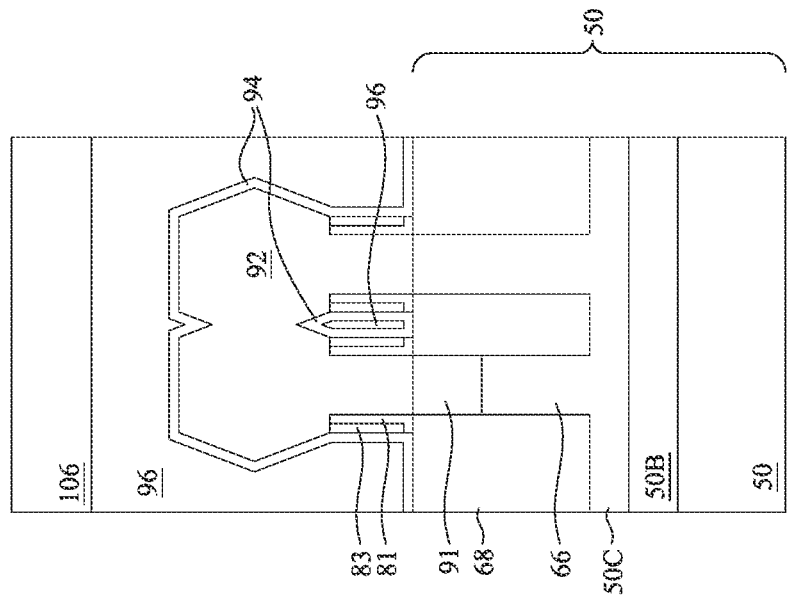
Figure 27A:
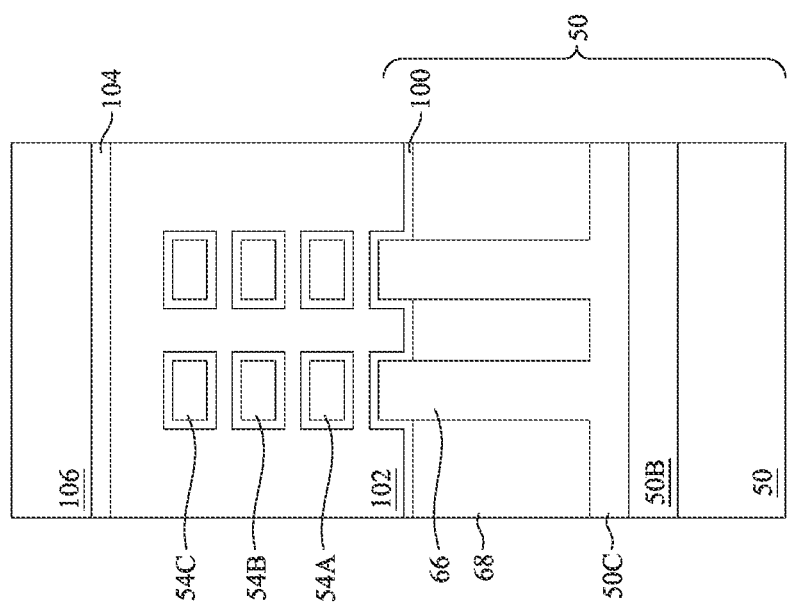
Figure 27C:
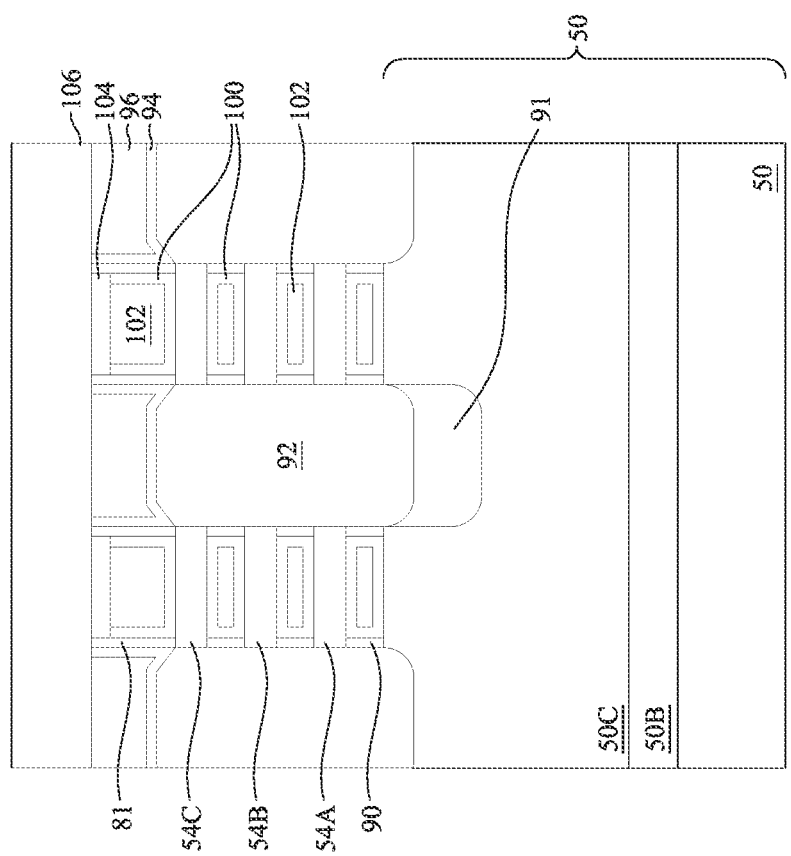

In FIGS. 27A through 27C, the gate structures (including the gate dielectric layers 100 and the corresponding overlying gate electrodes 102) are recessed, so that recess are formed directly over the gate structures and between opposing portions of first spacers 81. Gate masks 104 comprising one or more layers of dielectric material, such as silicon nitride, silicon oxynitride, or the like, are filled in the recesses, followed by a planarization process to remove excess portions of the dielectric material extending over the first ILD 96. Subsequently formed gate contacts (such as the gate contacts 114, discussed below with respect to FIGS. 29A through 29C) penetrate through the gate masks 104 to contact the top surfaces of the recessed gate electrodes 102.

As further illustrated by FIGS. 27A through 27C, a second ILD 106 is deposited over the first ILD 96 and over the gate masks 104. In some embodiments, the second ILD 106 is a flowable film formed by FCVD. In some embodiments, the second ILD 106 is formed of a dielectric material such as PSG, BSG, BPSG, USG, or the like, and may be deposited by any suitable method, such as CVD, PECVD, or the like.

Figure 28B:
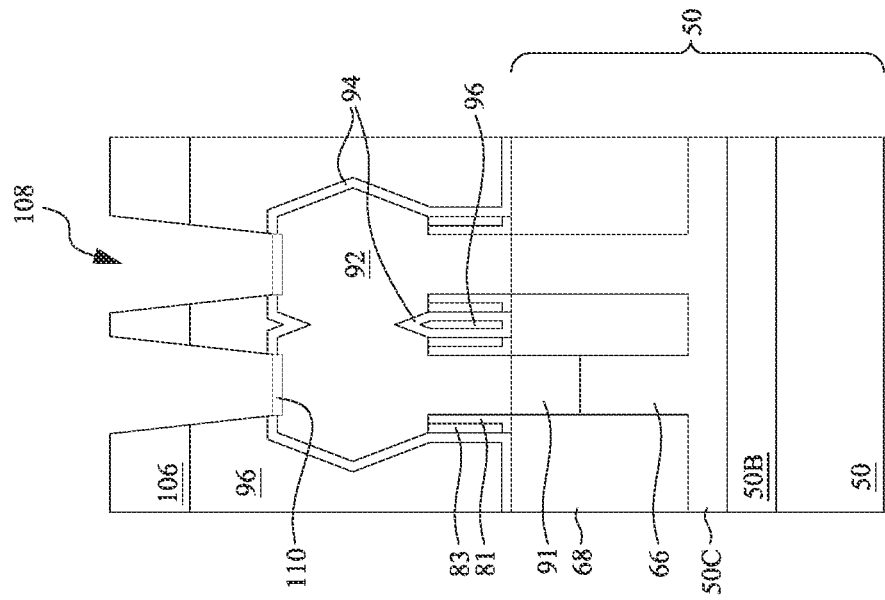
Figure 28A:
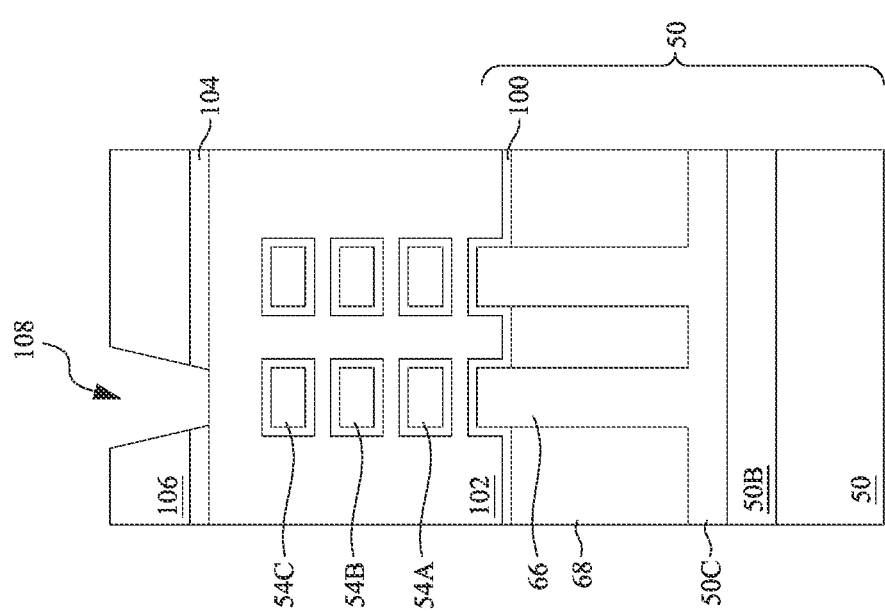
Figure 28C:
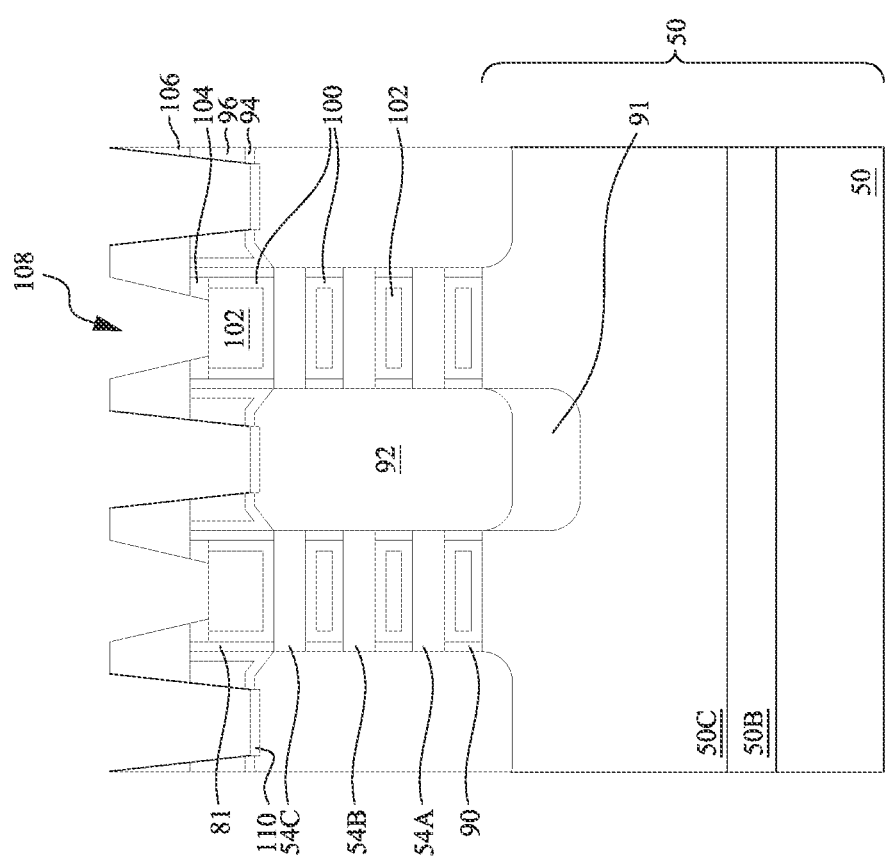

In FIGS. 28A through 28C, the second ILD 106, the first ILD 96, the CESL 94, and the gate masks 104 are etched to form fourth recesses 108 exposing surfaces of the epitaxial source/drain regions 92 and/or the gate structures. The fourth recesses 108 may be formed by etching using an anisotropic etching process, such as RIE, NBE, or the like. In some embodiments, the fourth recesses 108 may be etched through the second ILD 106 and the first ILD 96 using a first etching process; may be etched through the gate masks 104 using a second etching process; and may then be etched through the CESL 94 using a third etching process. A mask, such as a photoresist, may be formed and patterned over the second ILD 106 to mask portions of the second ILD 106 from the first etching process and the second etching process. In some embodiments, the etching process may over-etch, and therefore, the fourth recesses 108 extend into the epitaxial source/drain regions 92 and/or the gate structures, and a bottom of the fourth recesses 108 may be level with (e.g., at a same level, or having a same distance from the wafer 50C), or lower than (e.g., closer to the wafer 50C) the epitaxial source/drain regions 92 and/or the gate structures. Although FIG. 28C illustrates the fourth recesses 108 as exposing the epitaxial source/drain regions 92 and the gate structures in a same cross-section, in various embodiments, the epitaxial source/drain regions 92 and the gate structures may be exposed in different cross-sections, thereby reducing the risk of shorting subsequently formed contacts.

After the fourth recesses 108 are formed, first silicide regions 110 are formed over the epitaxial source/drain regions 92. In some embodiments, the first silicide regions 110 are formed by first depositing a metal (not separately illustrated) capable of reacting with the semiconductor materials of the underlying epitaxial source/drain regions 92 (e.g., silicon, silicon germanium, germanium) to form silicide or germanide regions, such as nickel, cobalt, titanium, tantalum, platinum, tungsten, other noble metals, other refractory metals, rare earth metals or their alloys, over the exposed portions of the epitaxial source/drain regions 92, then performing a thermal anneal process to form the first silicide regions 110. The un-reacted portions of the deposited metal are then removed, e.g., by an etching process. Although the first silicide regions 110 are referred to as silicide regions, the first silicide regions 110 may also be germanide regions, or silicon germanide regions (e.g., regions comprising silicide and germanide). In an embodiment, the first silicide regions 110 comprise TiSi and has a thickness in a range between about 2 nm and about 10 nm.

Figure 29B:
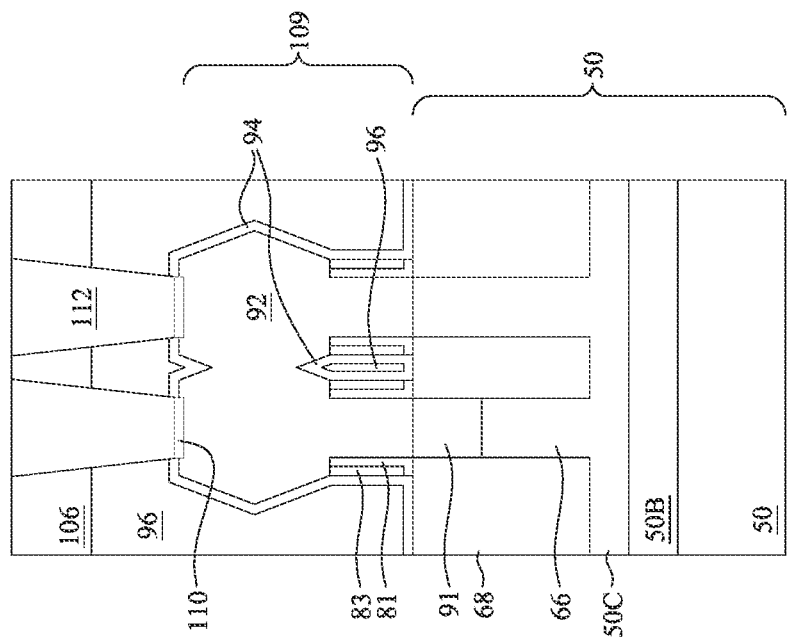
Figure 29A:
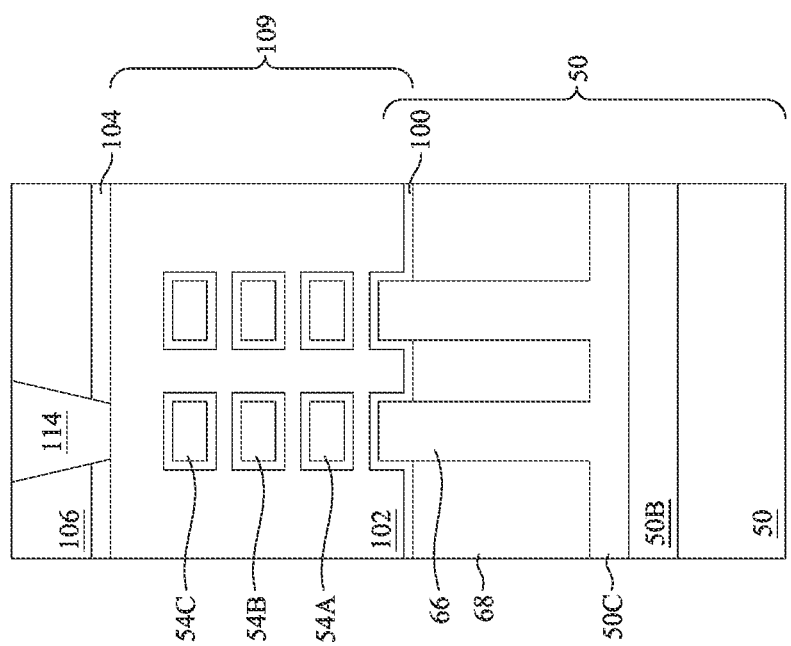
Figure 29C:
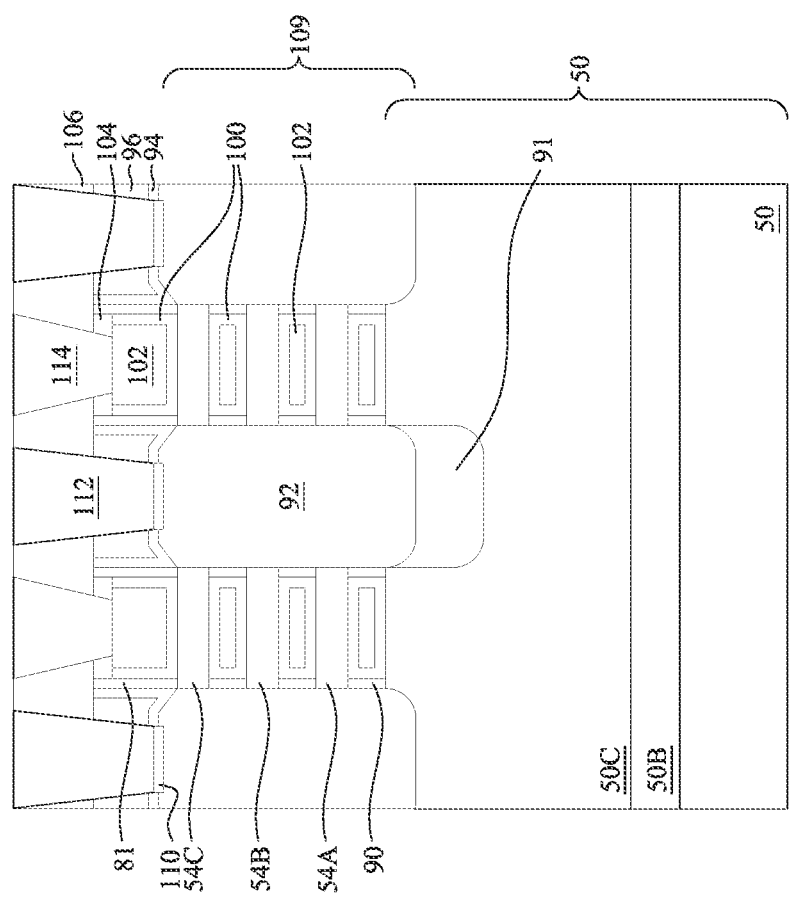

In FIGS. 29A through 29C, source/drain contacts 112 and gate contacts 114 (also referred to as contact plugs) are formed in the fourth recesses 108. The source/drain contacts 112 and the gate contacts 114 may each comprise one or more layers, such as barrier layers, diffusion layers, and fill materials. For example, in some embodiments, the source/drain contacts 112 and the gate contacts 114 each include a barrier layer and a conductive material, and are each electrically coupled to an underlying conductive feature (e.g., a gate electrode 102 and/or a first silicide region 110). The gate contacts 114 are electrically coupled to the gate electrodes 102 and the source/drain contacts 112 are electrically coupled to the first silicide regions 110. The barrier layer may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from surfaces of the second ILD 106. The epitaxial source/drain regions 92, the second nanostructures 54, and the gate structures (including the gate dielectric layers 100 and the gate electrodes 102) may collectively be referred to as transistor structures 109. The transistor structures 109 may be formed in a device layer, with a first interconnect structure (such as the front-side interconnect structure 120, discussed below with respect to FIGS. 30A through 30C) being formed over a front-side thereof and a second interconnect structure (such as the backside interconnect structure 136, discussed below with respect to FIGS. 37A through 37C) being formed over a backside thereof. Although the device layer is described as having nano-FETs, other embodiments may include a device layer having different types of transistors (e.g., planar FETs, finFETs, thin film transistors (TFTs), or the like).

Although FIGS. 29A through 29C illustrate a source/drain contact 112 extending to each of the epitaxial source/drain regions 92, the source/drain contacts 112 may be omitted from certain ones of the epitaxial source/drain regions 92. For example, as explained in greater detail below, conductive features (e.g., backside vias or power rails) may be subsequently attached through a backside of one or more of the epitaxial source/drain regions 92. For these particular epitaxial source/drain regions 92, the source/drain contacts 112 may be omitted or may be dummy contacts that are not electrically connected to any overlying conductive lines (such as the first conductive features 122, discussed below with respect to FIGS. 30A through 30C).

FIGS. 30A through 38C illustrate intermediate steps of forming front-side interconnect structures and backside interconnect structures on the transistor structures 109. The front-side interconnect structures and the backside interconnect structures may each comprise conductive features that are electrically connected to the nano-FETs formed on the substrate 50. FIGS. 30A, 31A, 32A, 33A, 34A, 35A, 36A, 37A, and 38A illustrate reference cross-section A-A' illustrated in FIG. 1. FIGS. 30B, 31B, 32B, 33B, 34B, 35B, 36B, 37B, and 38B illustrate reference cross-section B-B' illustrated in FIG. 1. FIGS. 30C, 31C, 32C, 33C, 34C, 35C, 36C, 37C, and 38C illustrate reference cross-section C-C' illustrated in FIG. 1. The process steps described in FIGS. 30A through 38C may be applied to both the n-type region 50N and the p-type region 50P. As noted above, a back-side conductive feature (e.g., a backside via or a power rail) may be connected to one or more of the epitaxial source/drain regions 92. As such, the source/drain contacts 112 may be optionally omitted from the epitaxial source/drain regions 92.

Figures 30A, 30B:
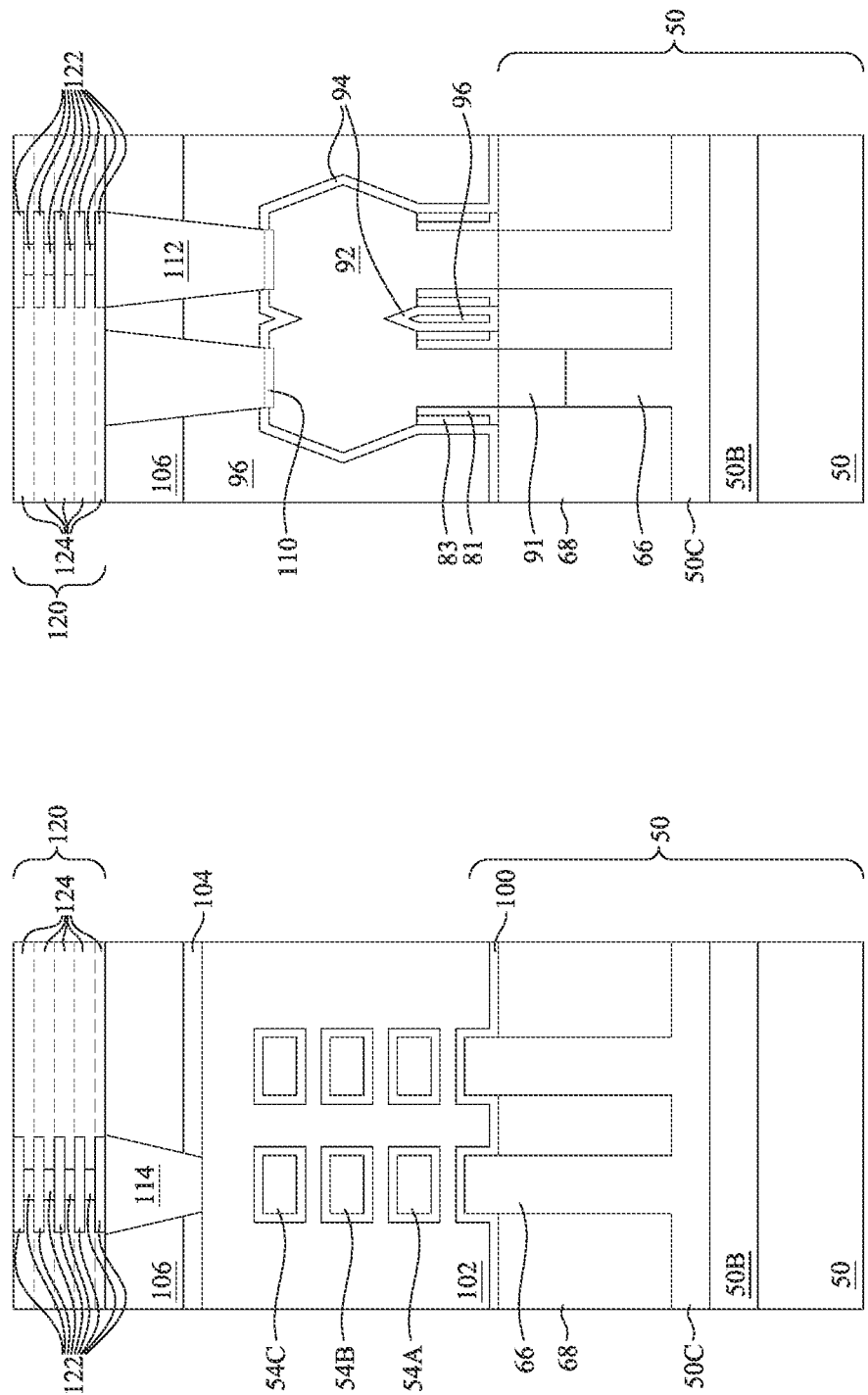
Figure 30C:
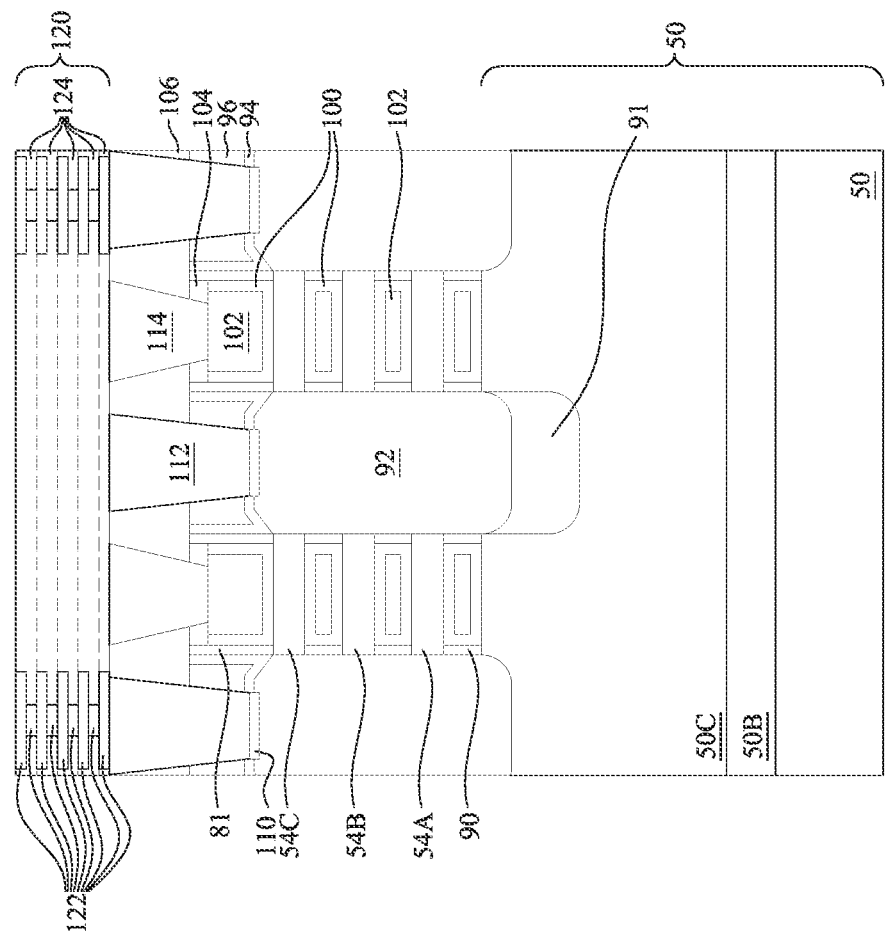

In FIGS. 30A through 30C, a front-side interconnect structure 120 is formed on the second ILD 106. The front-side interconnect structure 120 may be referred to as a front-side interconnect structure because it is formed on a front-side of the transistor structures 109 (e.g., a side of the transistor structures 109 on which active devices are formed).

The front-side interconnect structure 120 may comprise one or more layers of first conductive features 122 formed in one or more stacked first dielectric layers 124. Each of the stacked first dielectric layers 124 may comprise a dielectric material, such as a low-k dielectric material, an extra low-k (ELK) dielectric material, or the like. The first dielectric layers 124 may be deposited using an appropriate process, such as, CVD, ALD, PVD, PECVD, or the like.

The first conductive features 122 may comprise conductive lines and conductive vias interconnecting the layers of conductive lines. The conductive vias may extend through respective ones of the first dielectric layers 124 to provide vertical connections between layers of the conductive lines. The first conductive features 122 may be formed through any acceptable process, such as, a damascene process, a dual damascene process, or the like.

In some embodiments, the first conductive features 122 may be formed using a damascene process in which a respective first dielectric layer 124 is patterned utilizing a combination of photolithography and etching techniques to form trenches corresponding to the desired pattern of the first conductive features 122. An optional diffusion barrier and/or optional adhesion layer may be deposited and the trenches may then be filled with a conductive material. Suitable materials for the barrier layer include titanium, titanium nitride, titanium oxide, tantalum, tantalum nitride, titanium oxide, combinations thereof, or the like, and suitable materials for the conductive material include copper, silver, gold, tungsten, aluminum, combinations thereof, or the like. In an embodiment, the first conductive features 122 may be formed by depositing a seed layer of copper or a copper alloy, and filling the trenches by electroplating. A chemical mechanical planarization (CMP) process or the like may be used to remove excess conductive material from a surface of the respective first dielectric layer 124 and to planarize surfaces of the first dielectric layer 124 and the first conductive features 122 for subsequent processing.

FIGS. 30A through 30C illustrate five layers of the first conductive features 122 and the first dielectric layers 124 in the front-side interconnect structure 120. However, it should be appreciated that the front-side interconnect structure 120 may comprise any number of first conductive features 122 disposed in any number of first dielectric layers 124. The front-side interconnect structure 120 may be electrically connected to the gate contacts 114 and the source/drain contacts 112 to form functional circuits. In some embodiments, the functional circuits formed by the front-side interconnect structure 120 may comprise logic circuits, memory circuits, image sensor circuits, or the like.

Figure 31B:
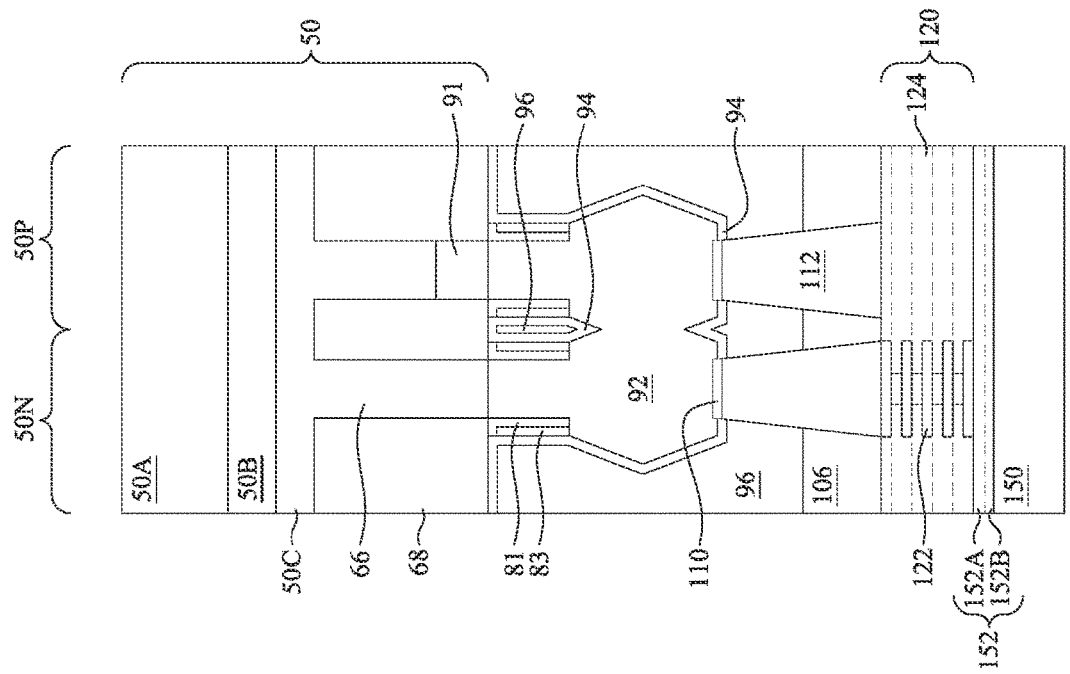
Figure 31A:
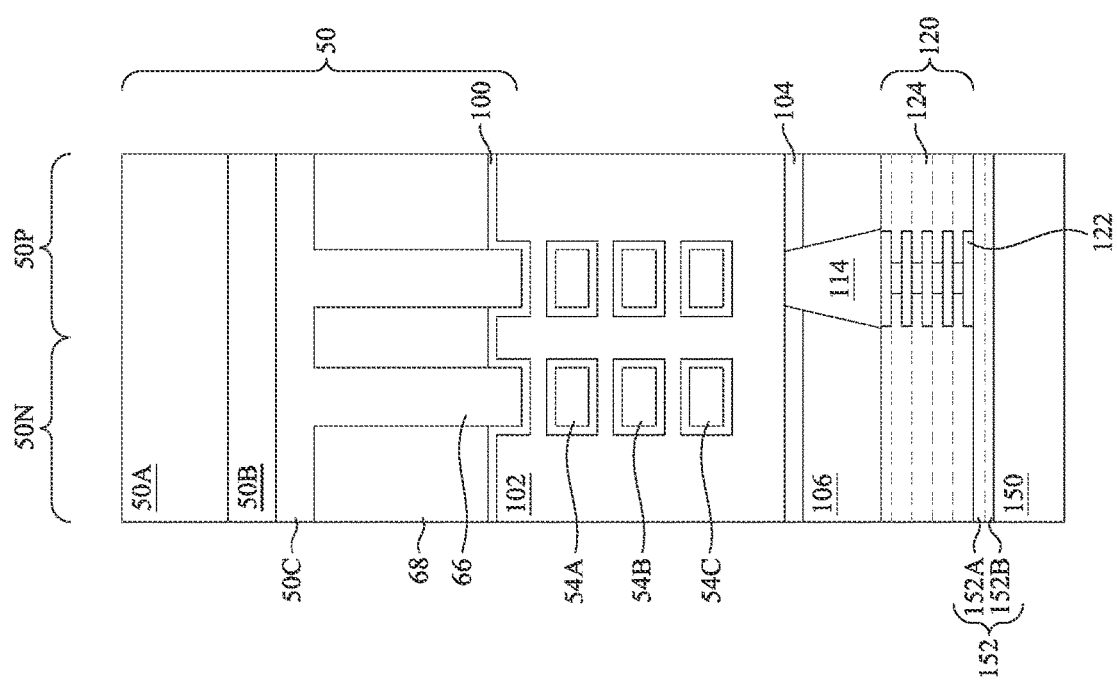
Figure 31C:
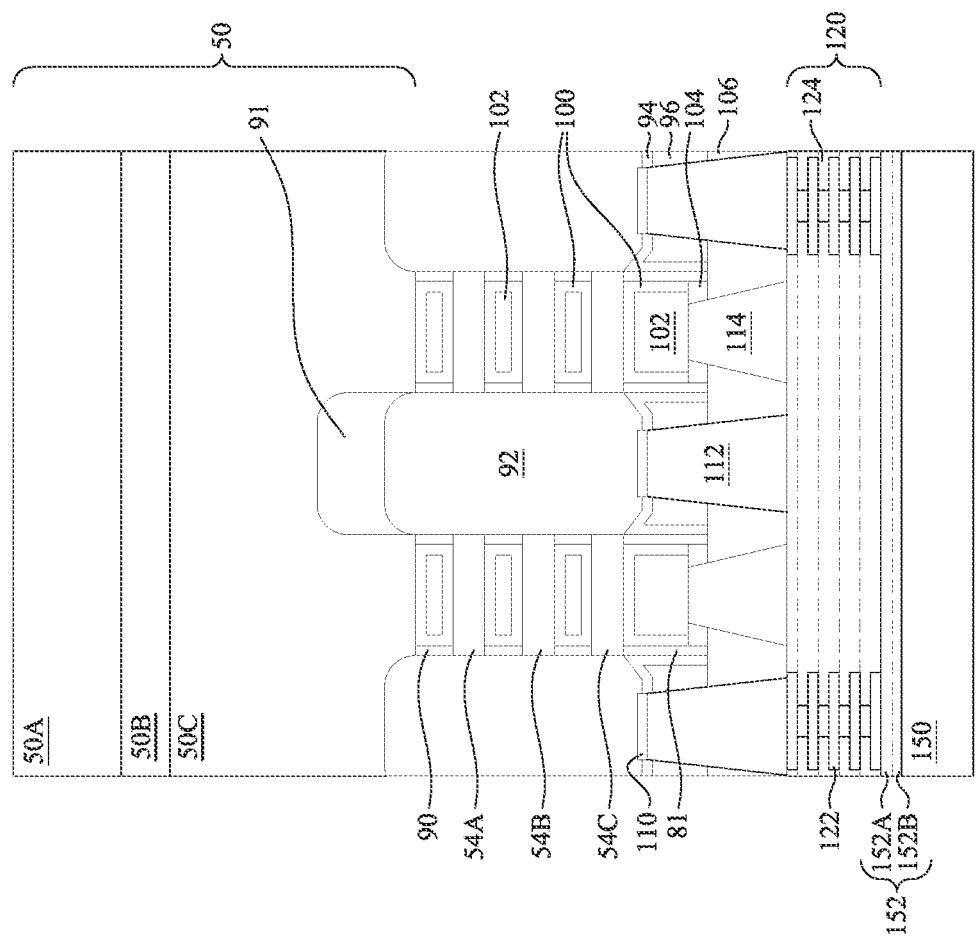

In FIGS. 31A through 31C, a carrier substrate 150 is bonded to a top surface of the front-side interconnect structure 120 by a first bonding layer 152A and a second bonding layer 152B (collectively referred to as a bonding layer 152). The carrier substrate 150 may be a glass carrier substrate, a ceramic carrier substrate, a wafer (e.g., a silicon wafer), or the like. The carrier substrate 150 may provide structural support during subsequent processing steps and in the completed device.

In various embodiments, the carrier substrate 150 may be bonded to the front-side interconnect structure 120 using a suitable technique, such as dielectric-to-dielectric bonding, or the like. The dielectric-to-dielectric bonding may comprise depositing the first bonding layer 152A on the front-side interconnect structure 120. In some embodiments, the first bonding layer 152A comprises silicon oxide (e.g., a high density plasma (HDP) oxide, or the like) that is deposited by CVD, ALD, PVD, or the like. The second bonding layer 152B may likewise be an oxide layer that is formed on a surface of the carrier substrate 150 prior to bonding using, for example, CVD, ALD, PVD, thermal oxidation, or the like. Other suitable materials may be used for the first bonding layer 152A and the second bonding layer 152B.

The dielectric-to-dielectric bonding process may further include applying a surface treatment to one or more of the first bonding layer 152A and the second bonding layer 152B. The surface treatment may include a plasma treatment. The plasma treatment may be performed in a vacuum environment. After the plasma treatment, the surface treatment may further include a cleaning process (e.g., a rinse with deionized water or the like) that may be applied to one or more of the bonding layers 152. The carrier substrate 150 is then aligned with the front-side interconnect structure 120 and the two are pressed against each other to initiate a pre-bonding of the carrier substrate 150 to the front-side interconnect structure 120. The pre-bonding may be performed at room temperature (e.g., between about 21° C. and about 25° C.). After the pre-bonding, an annealing process may be applied by, for example, heating the front-side interconnect structure 120 and the carrier substrate 150 to a temperature of about 170° C.

Further in FIGS. 31A through 31C, after the carrier substrate 150 is bonded to the front-side interconnect structure 120, the device may be flipped such that a backside of the transistor structures 109 faces upwards. The backside of the transistor structures 109 may refer to a side opposite to the front-side of the transistor structures 109 on which the active devices are formed.

Figure 31E:
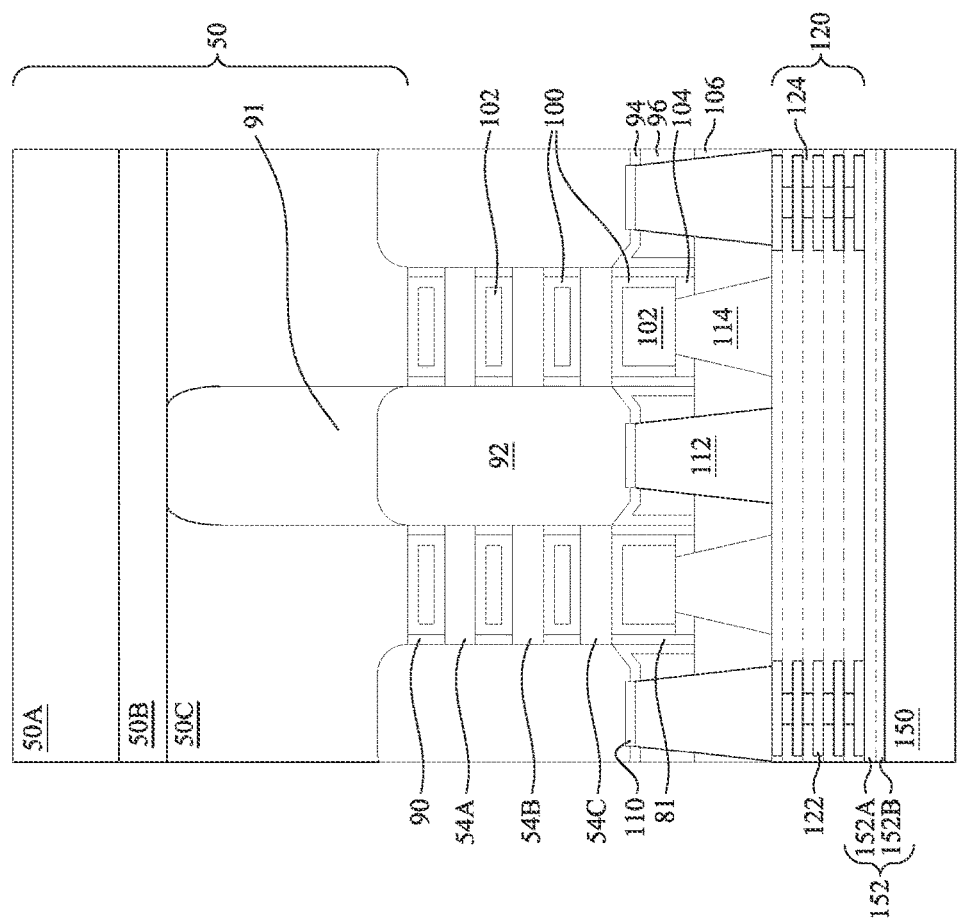
Figure 31D:
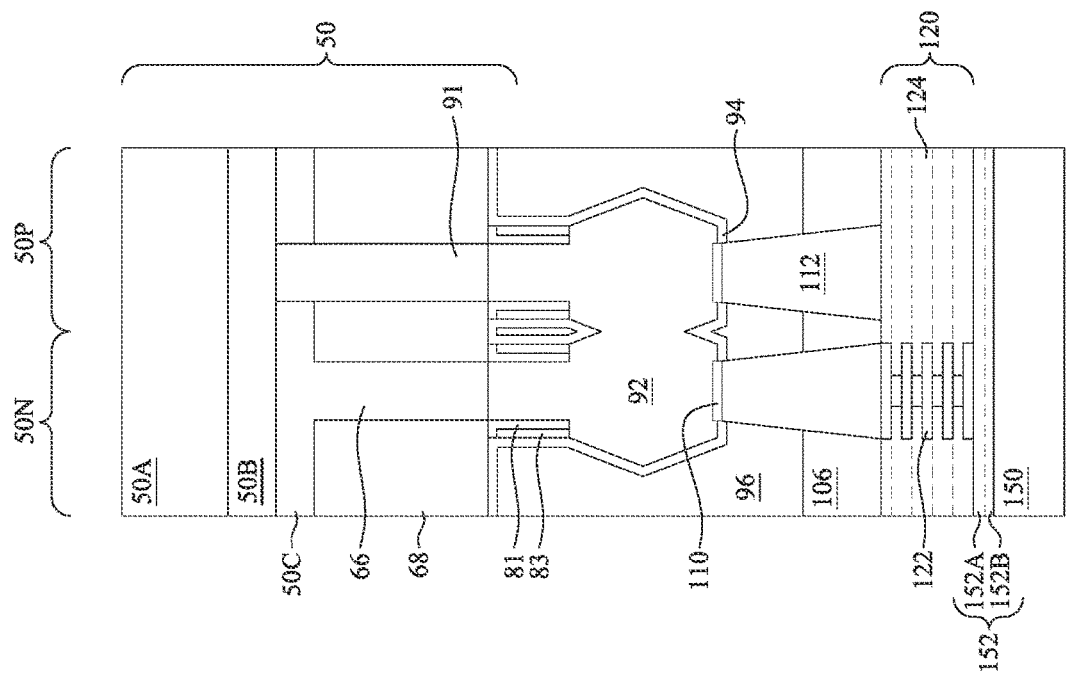

In some embodiments following from FIGS. 21F and 21G, as illustrated in accordance with FIGS. 31D and 31E, the first epitaxial materials 91 or dummy semiconductor regions 91 extend through the wafer 50C to contact the film 50B. This may be advantageous for a subsequent removal of the wafer 50A and the film 50B to expose the dummy semiconductor regions 91 (see below, FIGS. 32A-C).

Figure 32B:
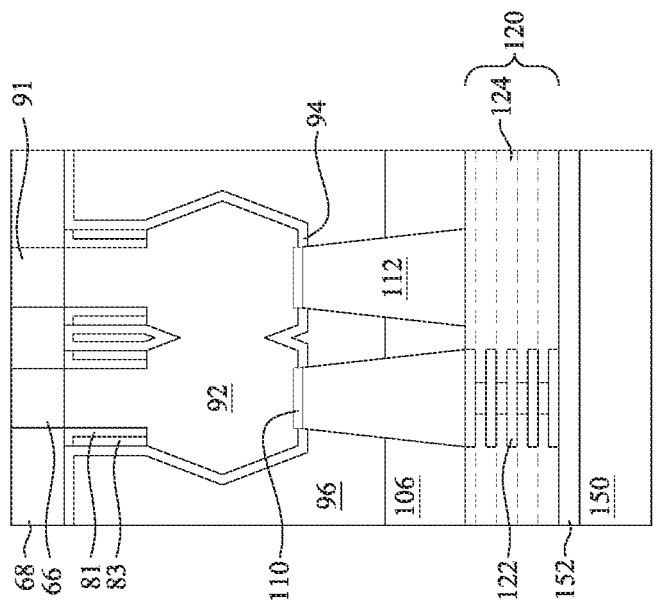
Figure 32A:
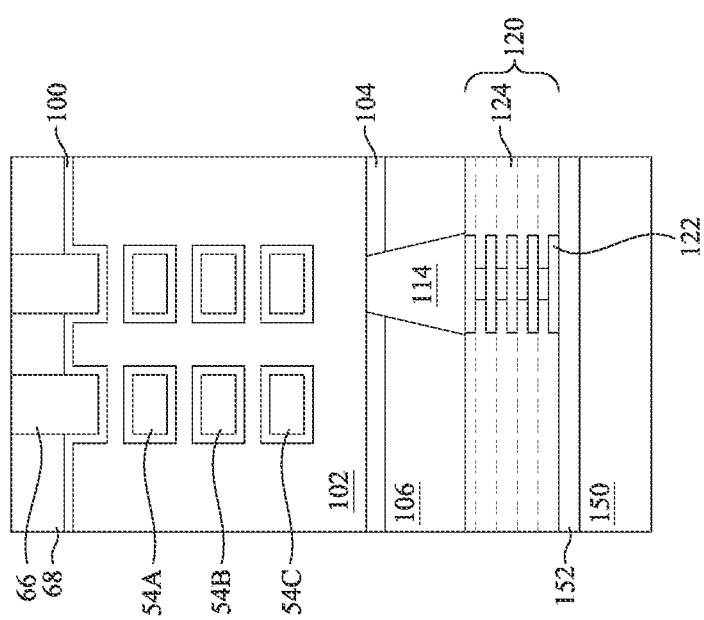
Figure 32C:
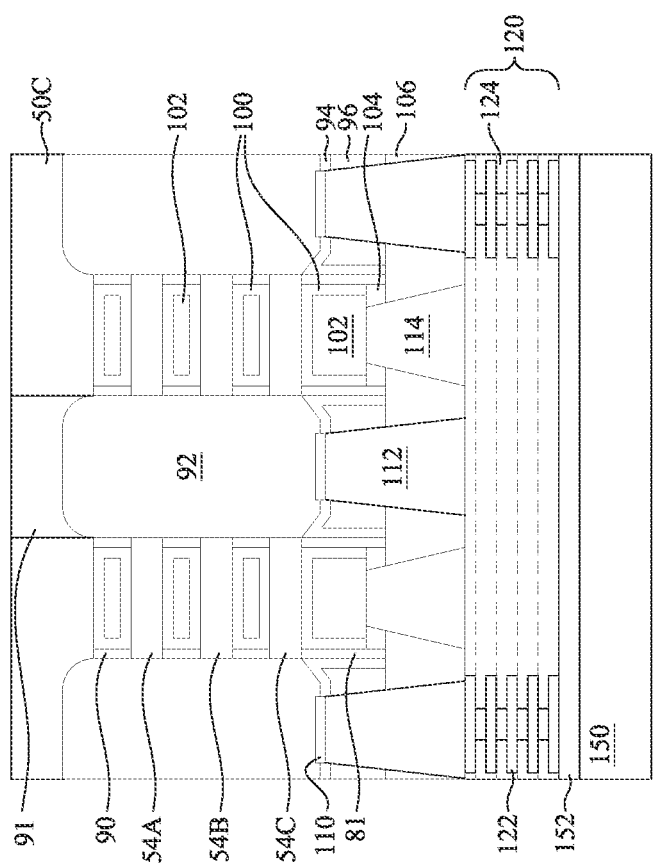

In FIGS. 32A through 32C, a thinning process may be applied to the backside of the substrate 50. The thinning process may comprise a planarization process (e.g., a mechanical grinding, a CMP, or the like), an etch-back process, a combination thereof, or the like. The thinning process may remove the wafer 50A, the film 50B, and portions of the wafer 50C and may expose surfaces of the first epitaxial materials 91, the fins 66, the wafer 50C, and the STI regions 68 opposite the front-side interconnect structure 120. Further, a portion of the wafer 50C may remain over the gate structures (e.g., the gate electrodes 102 and the gate dielectric layers 100) and the nanostructures 55 after the thinning process. As illustrated in FIGS. 32A through 32C, backside surfaces of the wafer 50C, the first epitaxial materials 91, the STI regions 68, and the fins 66 may be level with one another following the thinning process.

Figure 33C:
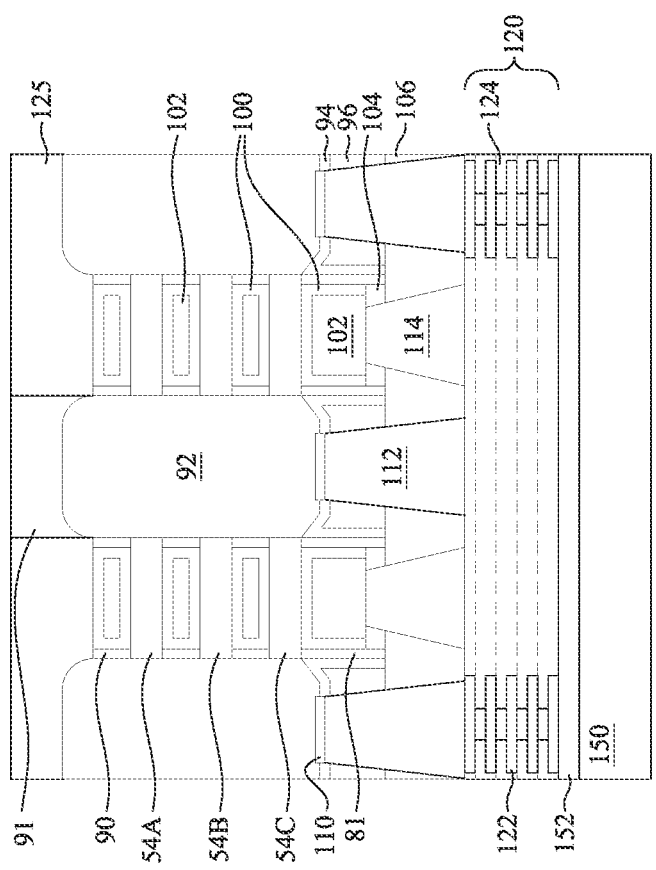

In FIGS. 33A through 33C, remaining portions of the fins 66 and the wafer 50C are removed and replaced with a second dielectric layer 125. The fins 66 and the wafer 50C may be etched using a suitable etching process, such as an isotropic etching process (e.g., a wet etching process), an anisotropic etching process (e.g., a dry etching process), or the like. The etching process may be one that is selective to the material of the fins 66 and the wafer 50C (e.g., etches the material of the fins 66 and the wafer 50C at a faster rate than the material of the STI regions 68, the gate dielectric layers 100, the epitaxial source/drain regions 92, and the first epitaxial materials 91). After etching the fins 66 and the wafer 50C, surfaces of the STI regions 68, the gate dielectric layers 100, the epitaxial source/drain regions 92, and the first epitaxial materials 91 may be exposed.

The second dielectric layer 125 is then deposited on the backside of the transistor structures 109 in recesses formed by removing the fins 66 and the wafer 50C. The second dielectric layer 125 may be deposited over the STI regions 68, the gate dielectric layers 100, and the epitaxial source/drain regions 92. The second dielectric layer 125 may physically contact surfaces of the STI regions 68, the gate dielectric layers 100, the epitaxial source/drain regions 92, and the first epitaxial materials 91. The second dielectric layer 125 may be substantially similar to the second ILD 106, described above with respect to FIGS. 27A through 27C. For example, the second dielectric layer 125 may be formed of a like material and using a like process as the second ILD 106. As illustrated in FIGS. 33A through 33C, a CMP process or the like may be used to remove material of the second dielectric layer 125 such that top surfaces of the second dielectric layer 125 are level with top surfaces of the STI regions 68 and the first epitaxial materials 91.

Figure 34C:
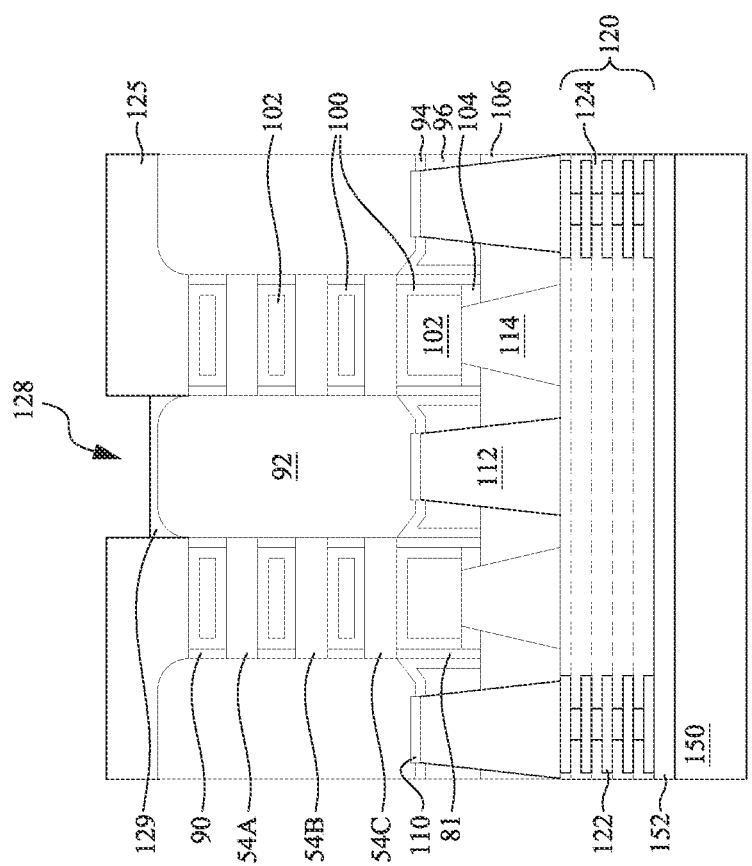

In FIGS. 34A through 34C, the first epitaxial materials 91 are removed to form fifth recesses 128 and second silicide regions 129 are formed in the fifth recesses 128. The first epitaxial materials 91 may be removed by a suitable etching process, which may be an isotropic etching process, such as a wet etching process. The etching process may have a high etch selectivity to materials of the first epitaxial materials 91. As such, the first epitaxial materials 91 may be removed without significantly removing materials of the second dielectric layer 125, the STI regions 68, or the epitaxial source/drain regions 92. The fifth recesses 128 may expose sidewalls of the STI regions 68, backside surfaces of the epitaxial source/drain regions 92, and sidewalls of the second dielectric layer 125.

Second silicide regions 129 may then be formed in the fifth recesses 128 on backsides of the epitaxial source/drain regions 92. The second silicide regions 129 may be similar to the first silicide regions 110, described above with respect to FIGS. 28A through 28C. For example, the second silicide regions 129 may be formed of a like material and using a like process as the first silicide regions 110.

Figure 35B:
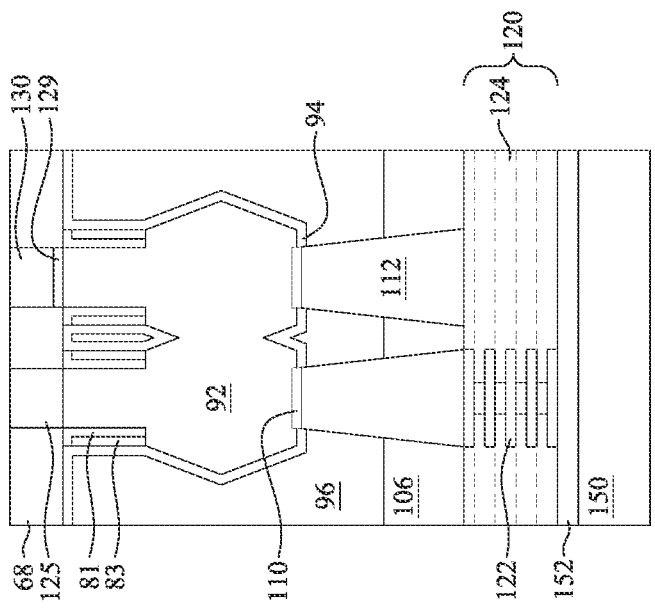
Figure 35A:
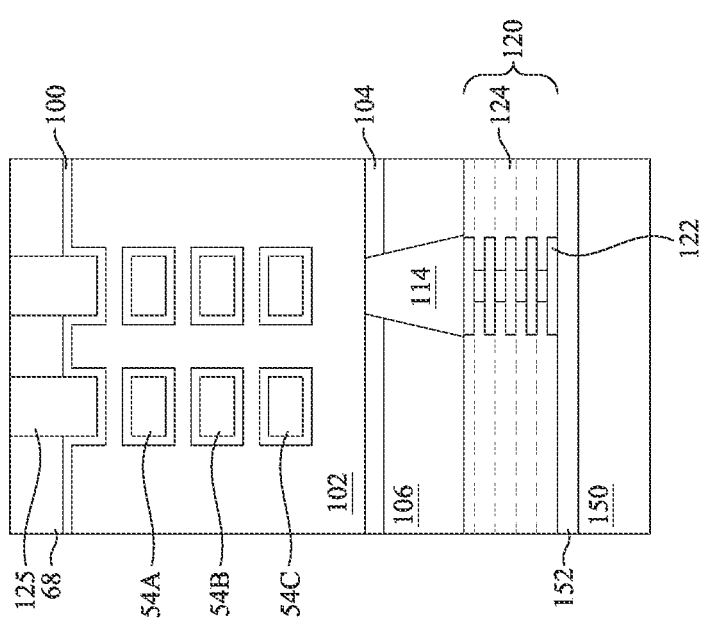
Figure 35C:
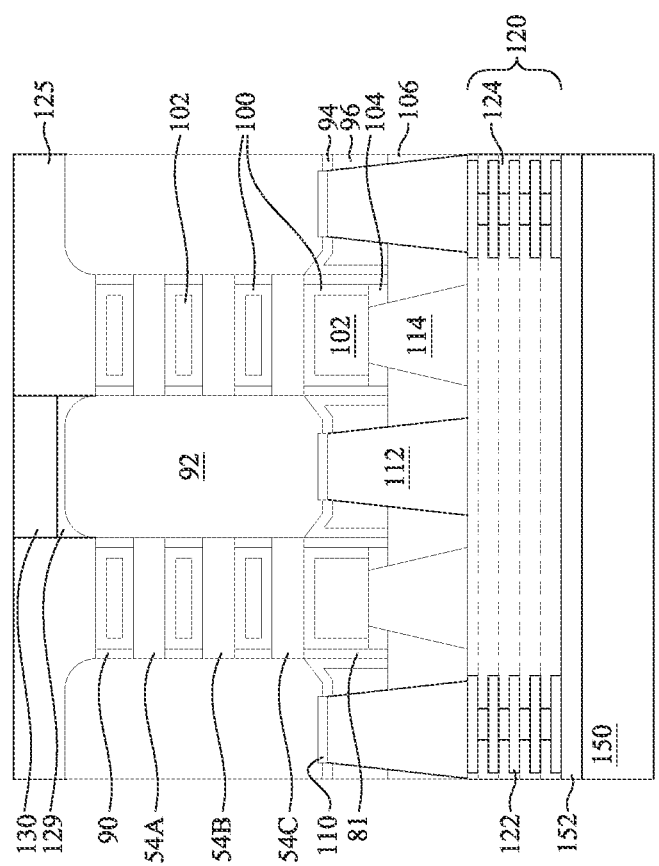

In FIGS. 35A through 35C, backside vias 130 are formed in the fifth recesses 128. The backside vias 130 may extend through the second dielectric layer 125 and the STI regions 68 and may be electrically coupled to the epitaxial source/drain regions 92 through the second silicide regions 129. The backside vias 130 may be similar to the source/drain contacts 112, described above with respect to FIGS. 29A through 29C. For example, the backside vias 130 may be formed of a like material and using a like process as the source/drain contacts 112.

Figure 36C:
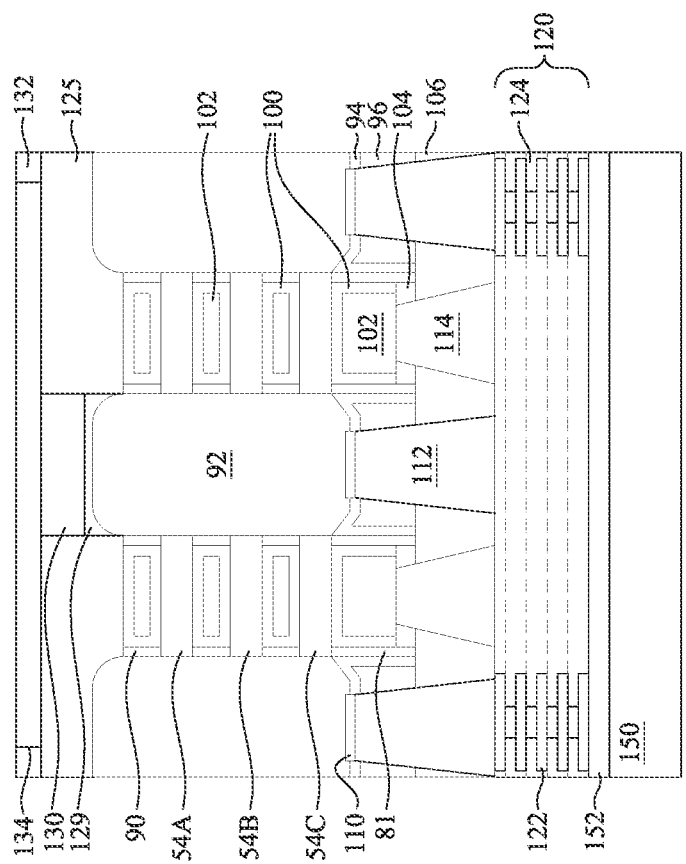

In FIGS. 36A through 36C, conductive lines 134 and a third dielectric layer 132 are formed over the second dielectric layer 125, the STI regions 68, and the backside vias 130. The third dielectric layer 132 may be similar to the second dielectric layer 125. For example, third dielectric layer 132 may be formed of a like material and using a like process as the second dielectric layer 125.

The conductive lines 134 are formed in the third dielectric layer 132. Forming the conductive lines 134 may include patterning recesses in the third dielectric layer 132 using a combination of photolithography and etching processes, for example. A pattern of the recesses in the third dielectric layer 132 may correspond to a pattern of the conductive lines 134. The conductive lines 134 are then formed by depositing a conductive material in the recesses. In some embodiments, the conductive lines 134 comprise a metal layer, which may be a single layer or a composite layer comprising a plurality of sub-layers formed of different materials. In some embodiments, the conductive lines 134 comprise copper, aluminum, cobalt, tungsten, titanium, tantalum, ruthenium, or the like. An optional diffusion barrier and/or optional adhesion layer may be deposited prior to filling the recesses with the conductive material. Suitable materials for the barrier layer/adhesion layer include titanium, titanium nitride, titanium oxide, tantalum, tantalum nitride, titanium oxide, or the like. The conductive lines 134 may be formed using, for example, CVD, ALD, PVD, plating or the like. The conductive lines 134 are physically and electrically coupled to the epitaxial source/drain regions 92 through the backside vias 130 and the second silicide regions 129. A planarization process (e.g., a CMP, a grinding, an etch-back, or the like) may be performed to remove excess portions of the conductive lines 134 formed over the third dielectric layer 132.

In some embodiments, the conductive lines 134 are power rails, which are conductive lines that electrically connect the epitaxial source/drain regions 92 to a reference voltage, a supply voltage, or the like. By placing power rails on a backside of the resulting semiconductor die rather than on a front-side of the semiconductor die, advantages may be achieved. For example, a gate density of the nano-FETs and/or interconnect density of the front-side interconnect structure 120 may be increased. Further, the backside of the semiconductor die may accommodate wider power rails, reducing resistance and increasing efficiency of power delivery to the nano-FETs. For example, a width of the conductive lines 134 may be at least twice a width of first level conductive lines (e.g., first conductive features 122) of the front-side interconnect structure 120.

Figure 37B:
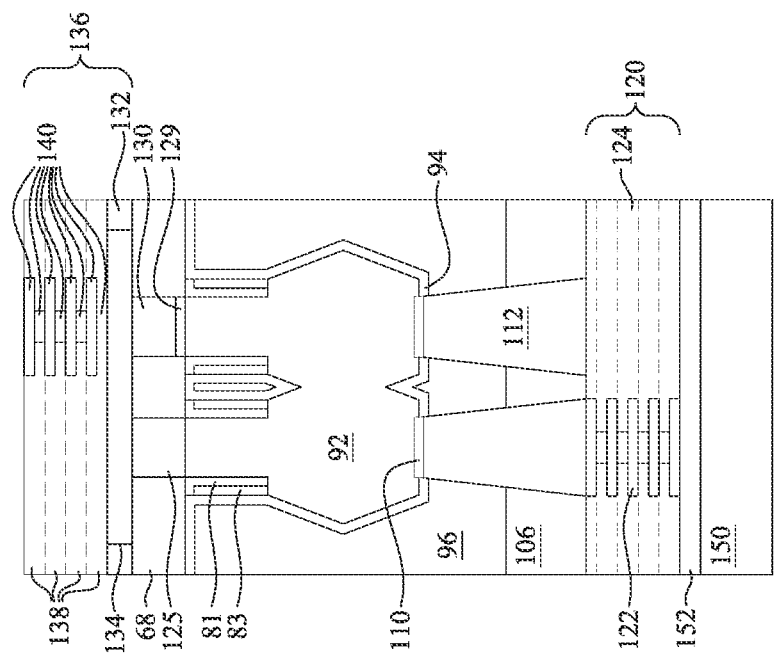
Figure 37A:
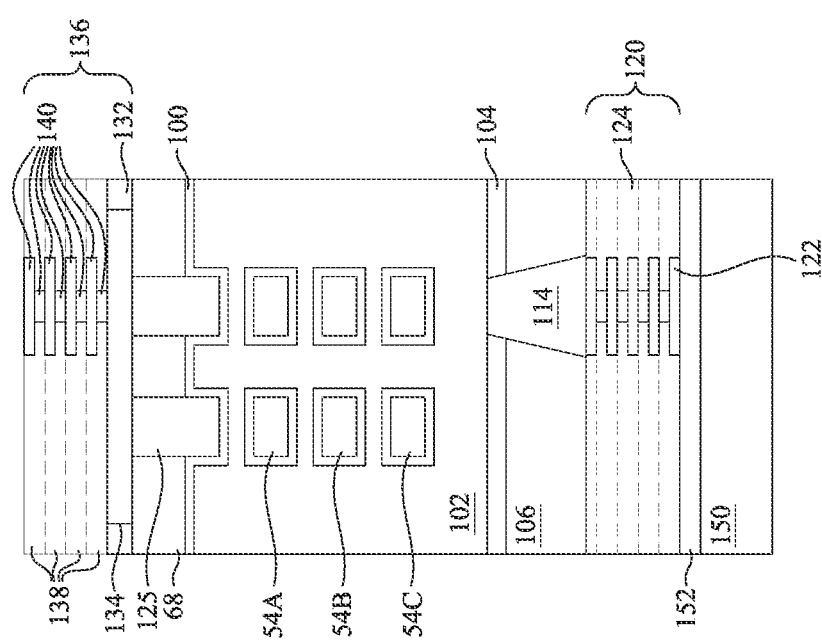
Figure 37C:
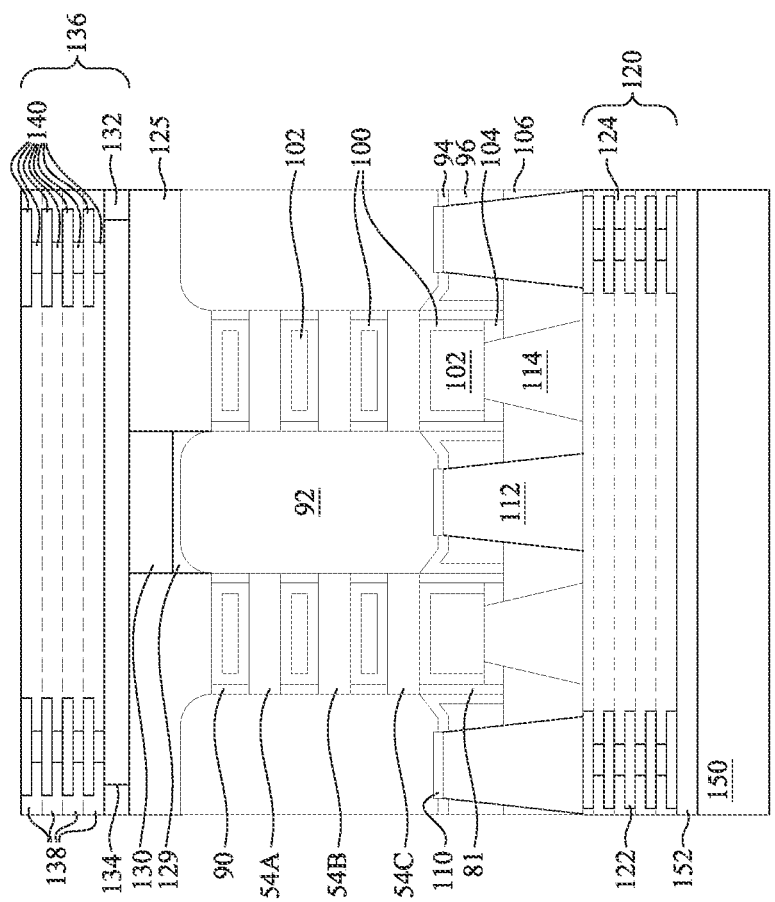

In FIGS. 37A through 37C, remaining portions of a backside interconnect structure 136 are formed over the third dielectric layer 132 and the second conductive lines 134. The backside interconnect structure 136 may be referred to as a backside interconnect structure because it is formed on a backside of the transistor structures 109 (e.g., a side of the transistor structures 109 opposite the side of the transistor structure 109 on which active devices are formed). The backside interconnect structure 136 may comprise the second dielectric layer 125, the third dielectric layer 132, the backside vias 130, and the second conductive lines 134.

The remaining portions of the backside interconnect structure 136 may comprise materials and be formed using processes the same as or similar to those used for the front-side interconnect structure 120, discussed above with respect to FIGS. 21A through 21C. In particular, the backside interconnect structure 136 may comprise stacked layers of second conductive features 140 formed in fourth dielectric layers 138. The second conductive features 140 may include routing lines (e.g., for routing to and from subsequently formed contact pads and external connectors). The second conductive features 140 may further be patterned to include one or more embedded passive devices such as, resistors, capacitors, inductors, or the like. The embedded passive devices may be integrated with the second conductive lines 134 (e.g., the power rail) to provide circuits (e.g., power circuits) on the backside of the nano-FETs.

Figures 38A, 38B:
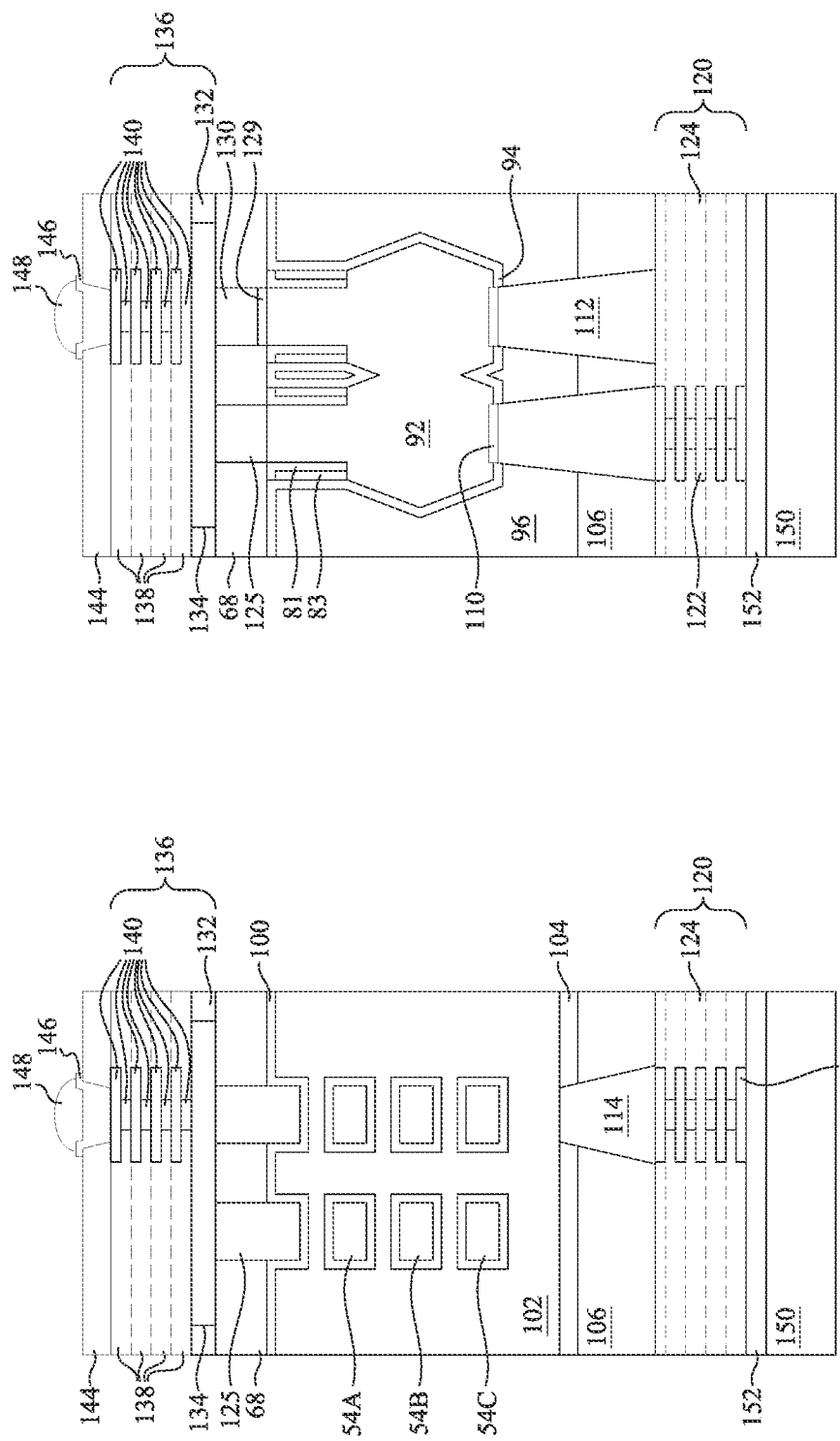
Figure 38C:
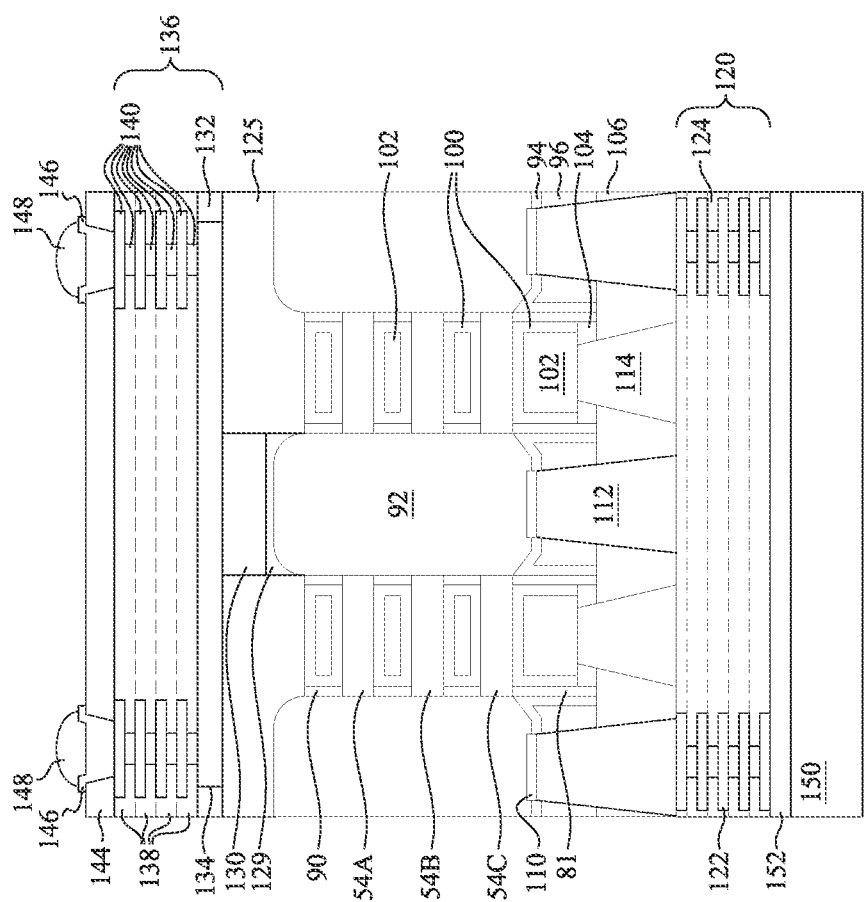
Figure 39:
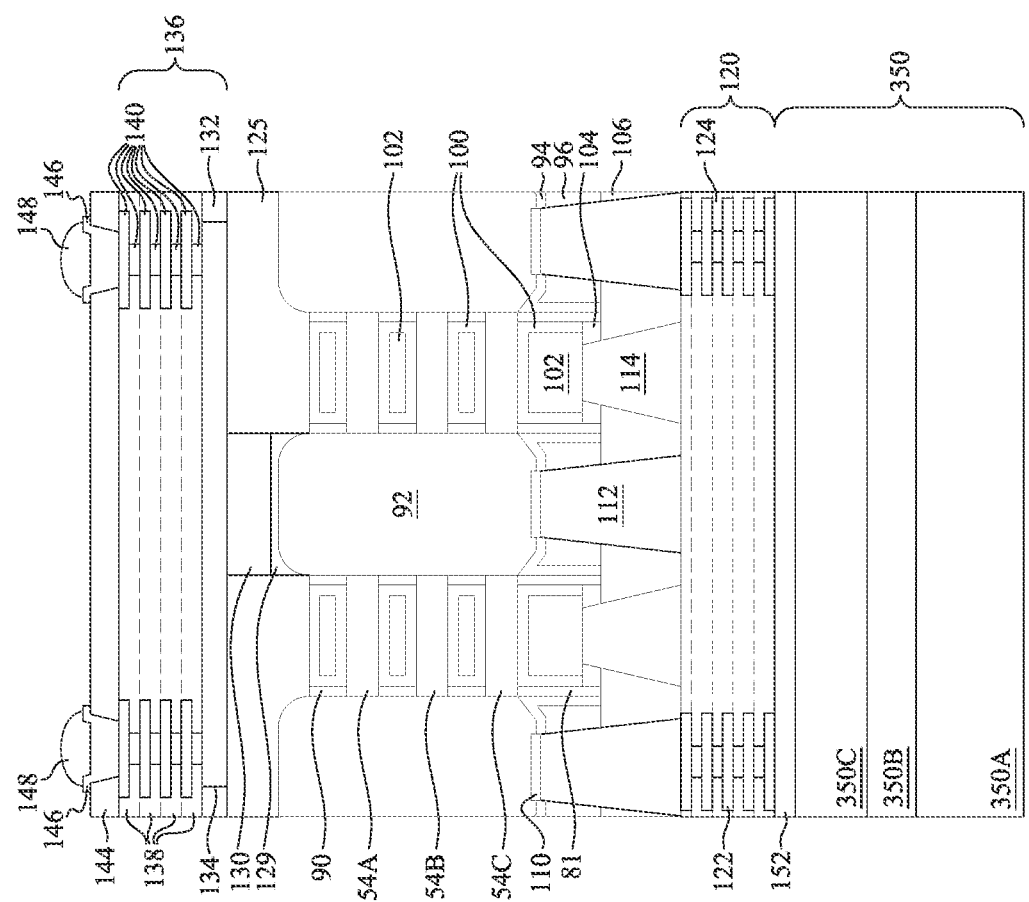

In FIGS. 38A through 38C, a passivation layer 144, UBMs 146, and external connectors 148 are formed over the backside interconnect structure 136. The passivation layer 144 may comprise polymers such as PBO, polyimide, BCB, or the like. Alternatively, the passivation layer 144 may include non-organic dielectric materials such as silicon oxide, silicon nitride, silicon carbide, silicon oxynitride, or the like. The passivation layer 144 may be deposited by, for example, CVD, PVD, ALD, or the like.

The UBMs 146 are formed through the passivation layer 144 to the second conductive features 140 in the backside interconnect structure 136 and the external connectors 148 are formed on the UBMs 146. The UBMs 146 may comprise one or more layers of copper, nickel, gold, or the like, which are formed by a plating process, or the like. The external connectors 148 (e.g., solder balls) are formed on the UBMs 146. The formation of the external connectors 148 may include placing solder balls on exposed portions of the UBMs 146 and reflowing the solder balls. In some embodiments, the formation of the external connectors 148 includes performing a plating step to form solder regions over the topmost second conductive features 140 and then reflowing the solder regions. The UBMs 146 and the external connectors 148 may be used to provide input/output connections to other electrical components, such as, other device dies, redistribution structures, printed circuit boards (PCBs), motherboards, or the like. The UBMs 146 and the external connectors 148 may also be referred to as backside input/output pads that may provide signal, supply voltage, and/or ground connections to the nano-FETs described above.

FIG. 39 illustrates a cross-sectional view of a semiconductor structure comprising nano-FETS on a bonded wafer 350, in accordance with some embodiments. The structure may be formed using the methods illustrated in respect to FIGS. 11 through 38C on a wafer 350C rather than on the bonded wafer 50. After the nano-FETs and other structures such as the backside interconnect structure 136 and the external connectors 148 are formed as shown in FIGS. 38A-C, the wafer 350C is bonded to another wafer 350A using the method in FIGS. 3 through 10, forming a substrate 350 comprising the wafers 350A and 350C bonded by the film 350B with the nano-FETs on a top side of the wafer 350C opposite the film 350B.

Embodiments may achieve advantages. A wafer bonding system may allow for the bonding of a first semiconductor wafer to a second semiconductor wafer in a bonding environment that has a controlled humidity to form a semiconductor substrate. By controlling humidity to be within a desired range, bonding quality and run-to-run stability may be improved and edge bubble defects and non-bonded wafer edges may be avoided. The semiconductor substrate may be used to form semiconductor devices such as e.g. nano-FETs.

In accordance with an embodiment, a method of forming a semiconductor device includes: loading a first wafer and a second wafer into a wafer bonding system; measuring a relative humidity within the wafer bonding system a first time; adjusting the relative humidity within the wafer bonding system after the measuring the relative humidity; and bonding the first wafer to the second wafer. In an embodiment, the adjusting the relative humidity is performed when the relative humidity is outside of a range of 35% to 60%. In an embodiment, the adjusting the relative humidity includes activating a water source. In an embodiment, the water source is a water sprayer. In an embodiment, adjusting the relative humidity includes activating a dehydration apparatus. In an embodiment, the dehydration apparatus is a vent supplying clean dry air. In an embodiment, the method further includes measuring a relative humidity within the wafer bonding system a second time after the adjusting the relative humidity.

In accordance with another embodiment, a method of forming a semiconductor device includes: performing a surface treatment on a first wafer and a second wafer; bonding the first wafer to the second wafer to form a semiconductor substrate while monitoring and maintaining a relative humidity in a range of 35% to 60%; and removing the semiconductor substrate from the wafer bonding system. In an embodiment, the method further includes: forming a first transistor on the semiconductor substrate, the first transistor including a first source/drain region, wherein a dummy semiconductor region extends from the first source/drain region into the semiconductor substrate; planarizing the semiconductor substrate to expose the dummy semiconductor region; removing the dummy semiconductor region to define a first opening exposing a backside of the first source/drain region; removing remaining portions of the semiconductor substrate; and forming a contact in the first opening, the contact being electrically coupled to the first source/drain region. In an embodiment, bonding the first wafer to the second wafer includes forming a film on the first wafer. In an embodiment, the film includes silicon oxide. In an embodiment, the film has a roughness with an RMS measured from a center of the film to an edge of the film in a range of 0.5 nm to 5 nm. In an embodiment, the film has a thickness in a range of 0.5 nm to 2000 nm. In an embodiment, the dummy semiconductor region physically contacts the film.

In accordance with yet another embodiment, a method of forming a semiconductor device includes: moving a first wafer and a second wafer through a first load lock into a treatment area using a first transfer robot; moving the first wafer and the second wafer to a surface treatment station using a second transfer robot, the surface treatment station being in the treatment area; performing a plasma activation step on the first wafer and the second wafer; moving the first wafer and the second wafer from the treatment area through a second load lock into a bonding area; moving the first wafer and the second wafer to a cleaning station using a third transfer robot, the cleaning station being in the bonding area; dispensing a cleaning agent over the first wafer and the second wafer; moving the first wafer and the second wafer to a bonding station using the third transfer robot, the bonding station being in the bonding area; and while maintaining a relative humidity in the bonding area in a range of 39% to 43%, bonding the first wafer to the second wafer. In an embodiment, the bonding the first wafer to the second wafer reduces a distance between the first wafer and the second wafer to less than an equilibrium distance such that liquid water is present between the first wafer and the second wafer. In an embodiment, the cleaning agent includes deionized water and ammonia, wherein the ammonia is at a volume concentration in a range of 0.01% to 10%. In an embodiment, the plasma activation step is performed with a power in a range of 10 W to 200 W. In an embodiment, the plasma activation step is performed at a pressure in a range of 0.01 mbar to 10 mbar. In an embodiment, the plasma activation step is performed using an $N_2/O_2$ mixture to generate a plasma.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, the method comprising:
    loading a first wafer and a second wafer into a wafer bonding system;
    measuring a relative humidity within the wafer bonding system a first time;
    adjusting the relative humidity within the wafer bonding system after the measuring the relative humidity, wherein the adjusting the relative humidity is performed when the relative humidity is outside of a range of 35% to 60%; and
    bonding the first wafer to the second wafer.

2. The method of claim 1, wherein the adjusting the relative humidity comprises activating a water source.

3. The method of claim 2, wherein the water source is a water sprayer.

4. The method of claim 1, wherein adjusting the relative humidity comprises activating a dehydration apparatus.

5. The method of claim 4, wherein the dehydration apparatus is a vent supplying clean dry air.

6. The method of claim 1, further comprising measuring a relative humidity within the wafer bonding system a second time after the adjusting the relative humidity.

7. The method of claim 1, further comprising:
    prior to bonding, performing a surface treatment while monitoring and maintaining a relative humidity in a range of 20% to 60%.

8. A method of forming a semiconductor device, the method comprising:
    performing a surface treatment on a first wafer and a second wafer in a wafer bonding system while monitoring and maintaining a relative humidity in a range of 20% to 60%;
    bonding the first wafer to the second wafer to form a semiconductor substrate in the wafer bonding system while monitoring and maintaining a relative humidity in a range of 35% to 60%; and
    removing the semiconductor substrate from the wafer bonding system.

9. The method of claim 8, further comprising:
    forming a first transistor on the semiconductor substrate, the first transistor comprising a first source/drain region, wherein a dummy semiconductor region extends from the first source/drain region into the semiconductor substrate;
    planarizing the semiconductor substrate to expose the dummy semiconductor region;
    removing the dummy semiconductor region to define a first opening exposing a backside of the first source/drain region;
    removing remaining portions of the semiconductor substrate; and
    forming a contact in the first opening, the contact being electrically coupled to the first source/drain region.

10. The method of claim 9, wherein bonding the first wafer to the second wafer comprises forming a film on the first wafer.

11. The method of claim 10, wherein the film comprises silicon oxide.

12. The method of claim 10, wherein the film has a roughness with an RMS measured from a center of the film to an edge of the film in a range of 0.5 nm to 5 nm.

13. The method of claim 10, wherein the film has a thickness in a range of 0.5 nm to 2000 nm.

14. The method of claim 10, wherein the dummy semiconductor region physically contacts the film.

15. A method of forming a semiconductor device, the method comprising:
    moving a first wafer and a second wafer through a first load lock into a treatment area using a first transfer robot;
    moving the first wafer and the second wafer to a surface treatment station using a second transfer robot, the surface treatment station being in the treatment area;
    performing a plasma activation step on the first wafer and the second wafer;
    moving the first wafer and the second wafer from the treatment area through a second load lock into a bonding area;
    moving the first wafer and the second wafer to a cleaning station using a third transfer robot, the cleaning station being in the bonding area;
    dispensing a cleaning agent over the first wafer and the second wafer;
    moving the first wafer and the second wafer to a bonding station using the third transfer robot, the bonding station being in the bonding area; and
    while maintaining a relative humidity in the bonding area in a range of 39% to 43%, bonding the first wafer to the second wafer.

16. The method of claim 15, wherein the bonding the first wafer to the second wafer reduces a distance between the first wafer and the second wafer to less than an equilibrium distance such that liquid water is present between the first wafer and the second wafer.

17. The method of claim 15, wherein the cleaning agent comprises deionized water and ammonia, wherein the ammonia is at a volume concentration in a range of 0.01% to 10%.

18. The method of claim 15, wherein the plasma activation step is performed with a power in a range of 10 W to 200 W.

19. The method of claim 15, wherein the plasma activation step is performed at a pressure in a range of 0.01 mbar to 10 mbar.

20. The method of claim 15, wherein the plasma activation step is performed using an $N_2/O_2$ mixture to generate a plasma.

* * * * *